(12) United States Patent
Kim

(10) Patent No.: US 12,389,688 B2
(45) Date of Patent: Aug. 12, 2025

(54) SEMICONDUCTOR DEVICE HAVING DIELECTRIC LAYERS OF VARYING THICKNESSES

(71) Applicant: Samsung Electronics Co., Ltd., Suwon-si (KR)

(72) Inventor: Juyoun Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 236 days.

(21) Appl. No.: 17/313,212

(22) Filed: May 6, 2021

(65) Prior Publication Data
US 2022/0085006 A1    Mar. 17, 2022

(30) Foreign Application Priority Data

Sep. 11, 2020   (KR) .................. 10-2020-0117129

(51) Int. Cl.
*H10D 89/10*   (2025.01)
*H10D 64/27*   (2025.01)
*H10D 84/85*   (2025.01)

(52) U.S. Cl.
CPC ........... *H10D 89/10* (2025.01); *H10D 64/514* (2025.01); *H10D 64/518* (2025.01); *H10D 84/85* (2025.01)

(58) Field of Classification Search
CPC ......... H01L 29/42392; H01L 29/78696; H01L 29/775; H01L 21/823462; H01L 21/823857; H01L 27/092; H01L 27/0207; H01L 29/42364; H01L 29/42376; H10D 89/10; H10D 64/514; H10D 64/518; H10D 84/85

USPC ........... 257/288, 310, 351, 21.409; 438/154, 438/216, 591
See application file for complete search history.

(56) References Cited

U.S. PATENT DOCUMENTS

| | | | |
|---|---|---|---|
| 9,048,335 B2 | 6/2015 | Chen et al. | |
| 9,059,022 B2 | 6/2015 | Chuang et al. | |
| 9,142,566 B2 | 9/2015 | Hong et al. | |
| 10,050,033 B1 | 8/2018 | Thei et al. | |

(Continued)

FOREIGN PATENT DOCUMENTS

| | | |
|---|---|---|
| KR | 10-0466208 B1 | 1/2005 |
| KR | 10-0490656 B1 | 6/2006 |

*Primary Examiner* — David Chen
(74) *Attorney, Agent, or Firm* — Harness, Dickey & Pierce, P.L.C.

(57) ABSTRACT

Disclosed is a semiconductor device comprising a substrate including a peripheral region and a logic cell region, a first channel pattern including a first and a second semiconductor pattern stacked vertically on the peripheral region, a first gate electrode across the first channel pattern and extending in a first direction, a second channel pattern including a third and a fourth semiconductor pattern stacked vertically on the logic cell region, and a second gate electrode across the second channel pattern and extending in the first direction, the second gate electrode having a second width in a second direction less than a first width in the second direction of the first gate electrode. The first gate electrode has a first thickness between the first and the second semiconductor pattern, and the second gate electrode has a second thickness between the third and the fourth semiconductor pattern greater than the first thickness.

19 Claims, 67 Drawing Sheets

(56) References Cited

U.S. PATENT DOCUMENTS

| | | | |
|---|---|---|---|
| 2003/0132474 A1* | 7/2003 | Lee | H10B 12/033 |
| | | | 257/306 |
| 2005/0282341 A1* | 12/2005 | Park | H01L 29/513 |
| | | | 257/E21.194 |
| 2008/0121962 A1* | 5/2008 | Forbes | H01L 21/3145 |
| | | | 257/E29.302 |
| 2009/0042379 A1* | 2/2009 | Chen | H01L 21/31658 |
| | | | 438/773 |
| 2011/0221009 A1* | 9/2011 | Chuang | H01L 27/088 |
| | | | 257/E27.06 |
| 2011/0254062 A1* | 10/2011 | Shimizu | H01L 21/28185 |
| | | | 257/E21.409 |
| 2012/0225545 A1* | 9/2012 | Fu | H01L 21/823462 |
| | | | 438/585 |
| 2013/0295298 A1* | 11/2013 | Gatineau | C07F 19/005 |
| | | | 556/27 |
| 2015/0069524 A1* | 3/2015 | Hong | H01L 21/82385 |
| | | | 438/587 |
| 2016/0315165 A1* | 10/2016 | Lee | H01L 29/42364 |
| 2017/0141201 A1* | 5/2017 | Fang | H01L 29/513 |
| 2019/0088798 A1* | 3/2019 | Kim | H01L 21/823842 |
| 2019/0103414 A1* | 4/2019 | Ramkumar | H10B 43/30 |
| 2019/0103472 A1 | 4/2019 | Cheng et al. | |
| 2019/0122937 A1* | 4/2019 | Cheng | H01L 29/4908 |
| 2020/0066839 A1* | 2/2020 | Zhang | H01L 29/0847 |
| 2020/0135879 A1 | 4/2020 | Cheng et al. | |
| 2020/0258786 A1* | 8/2020 | Ando | H01L 21/02532 |
| 2020/0274000 A1 | 8/2020 | Xie et al. | |
| 2021/0126102 A1* | 4/2021 | Nakjin | H10D 30/031 |

\* cited by examiner

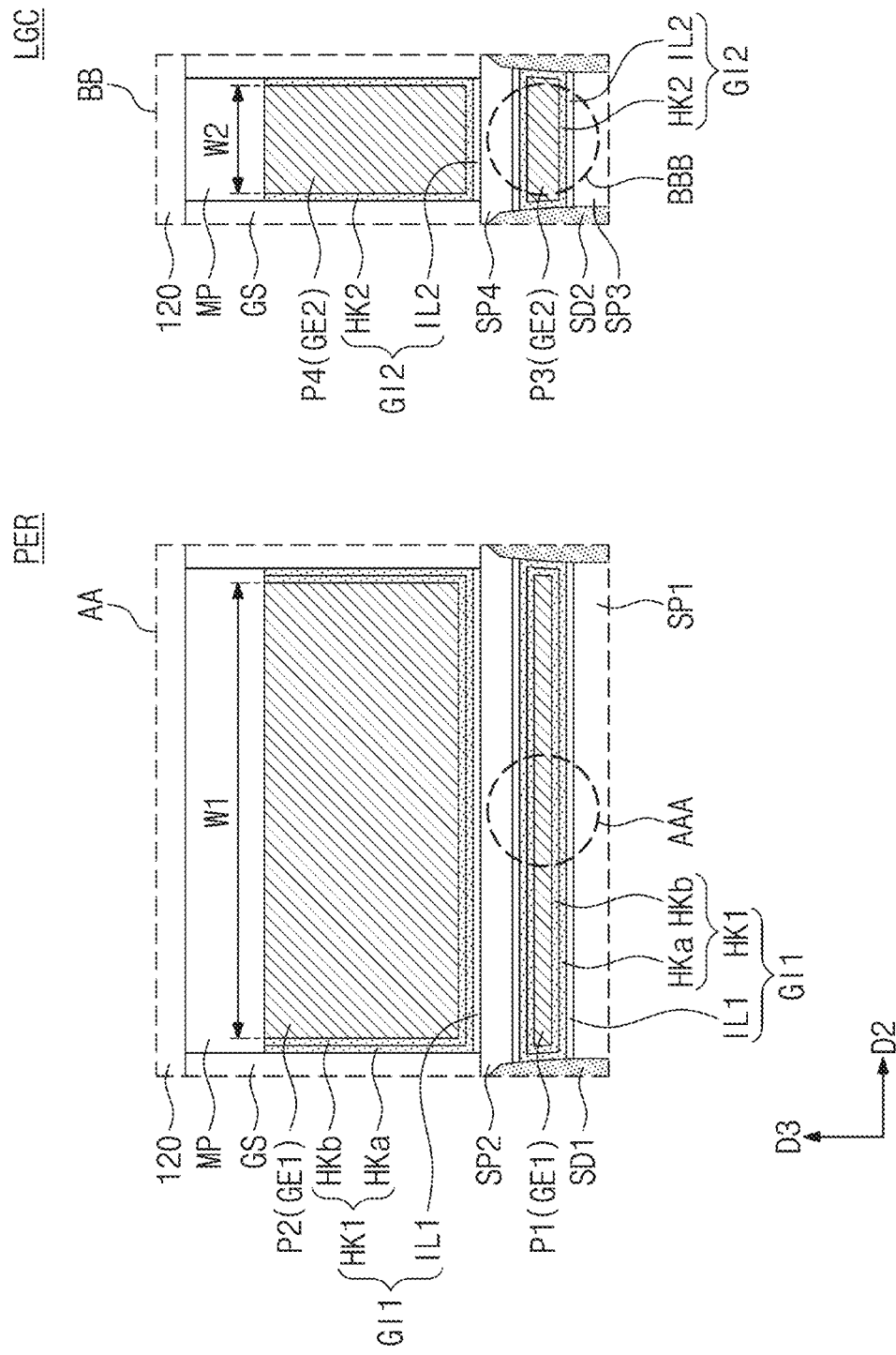

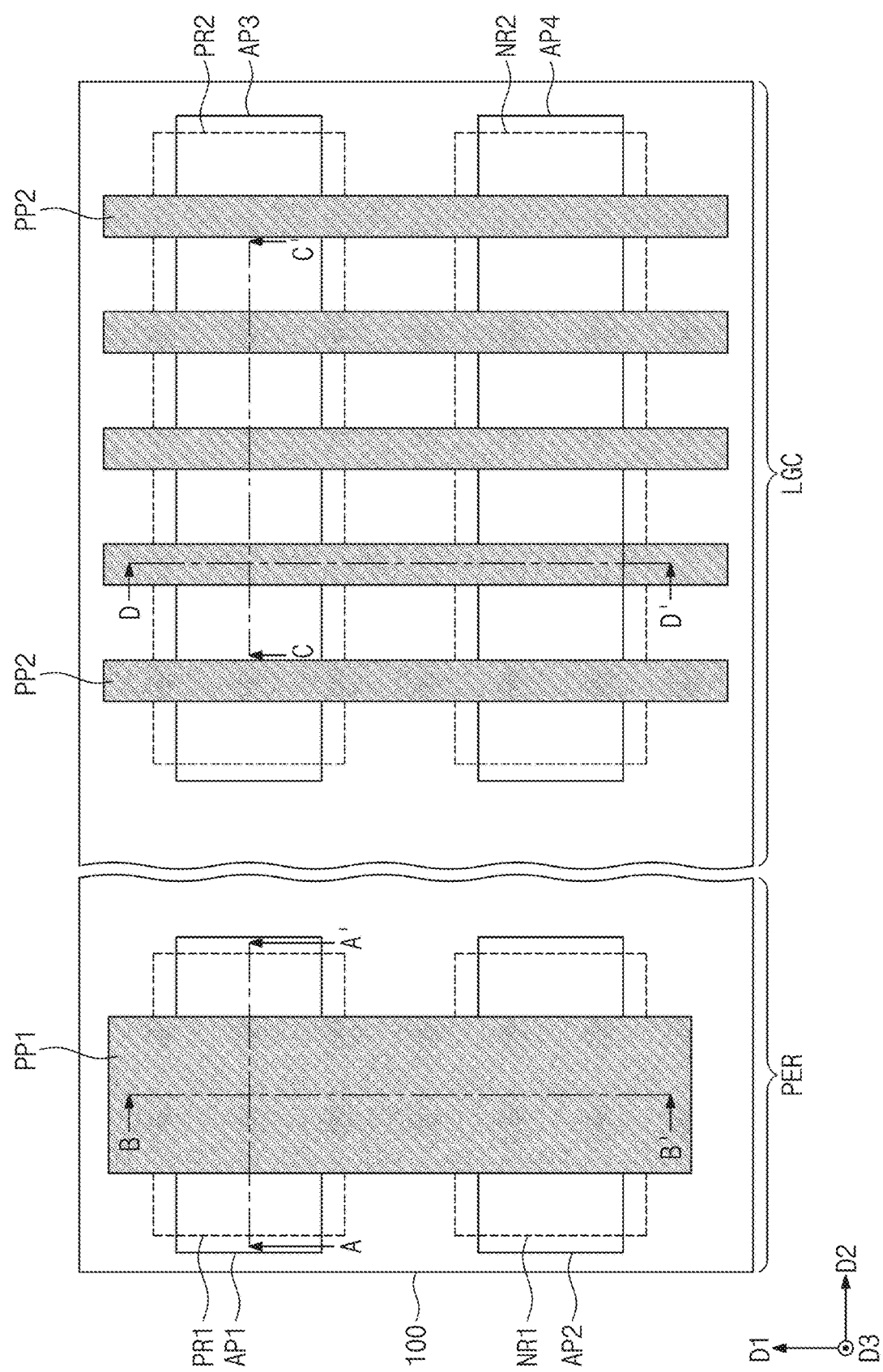

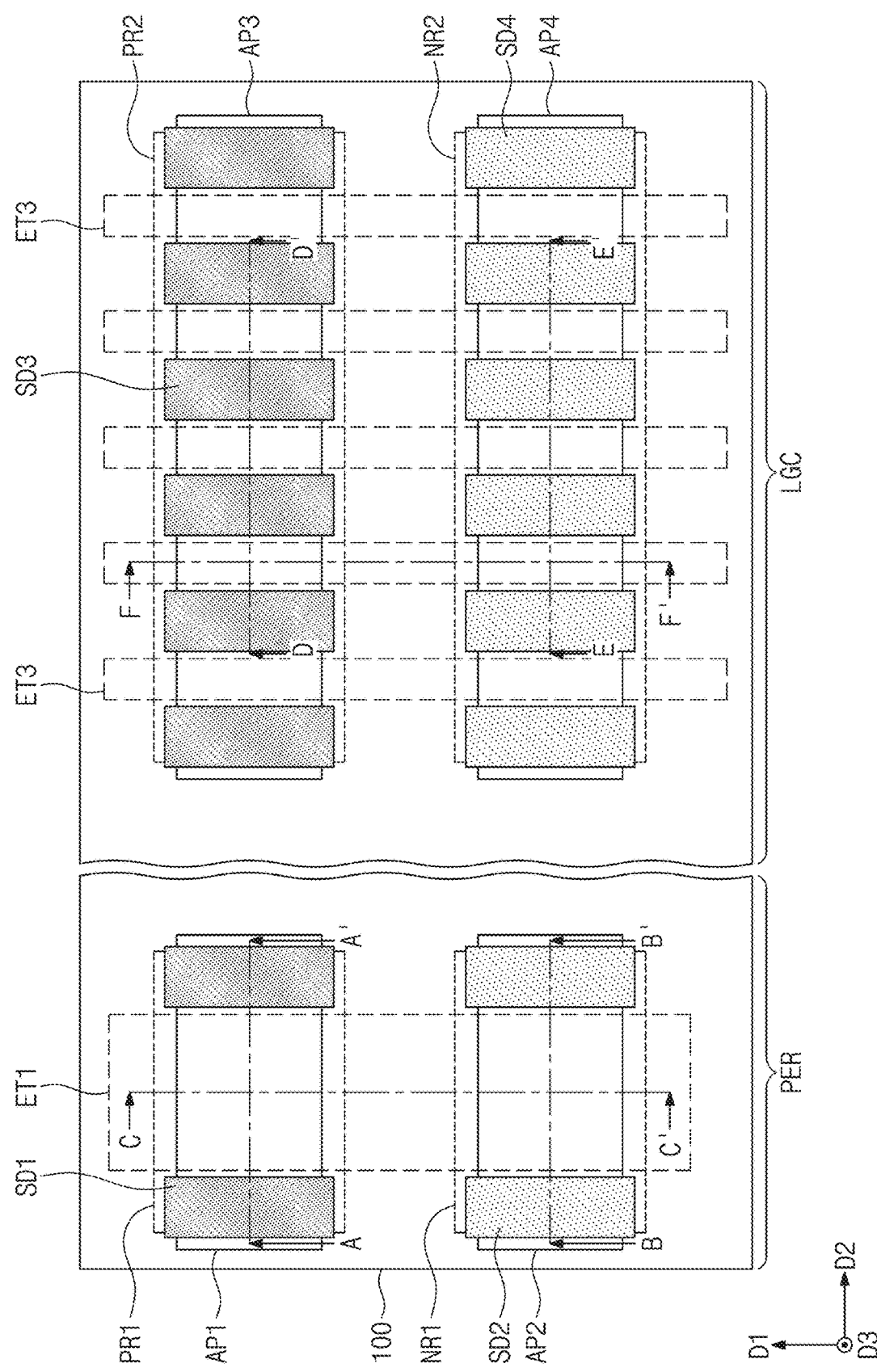

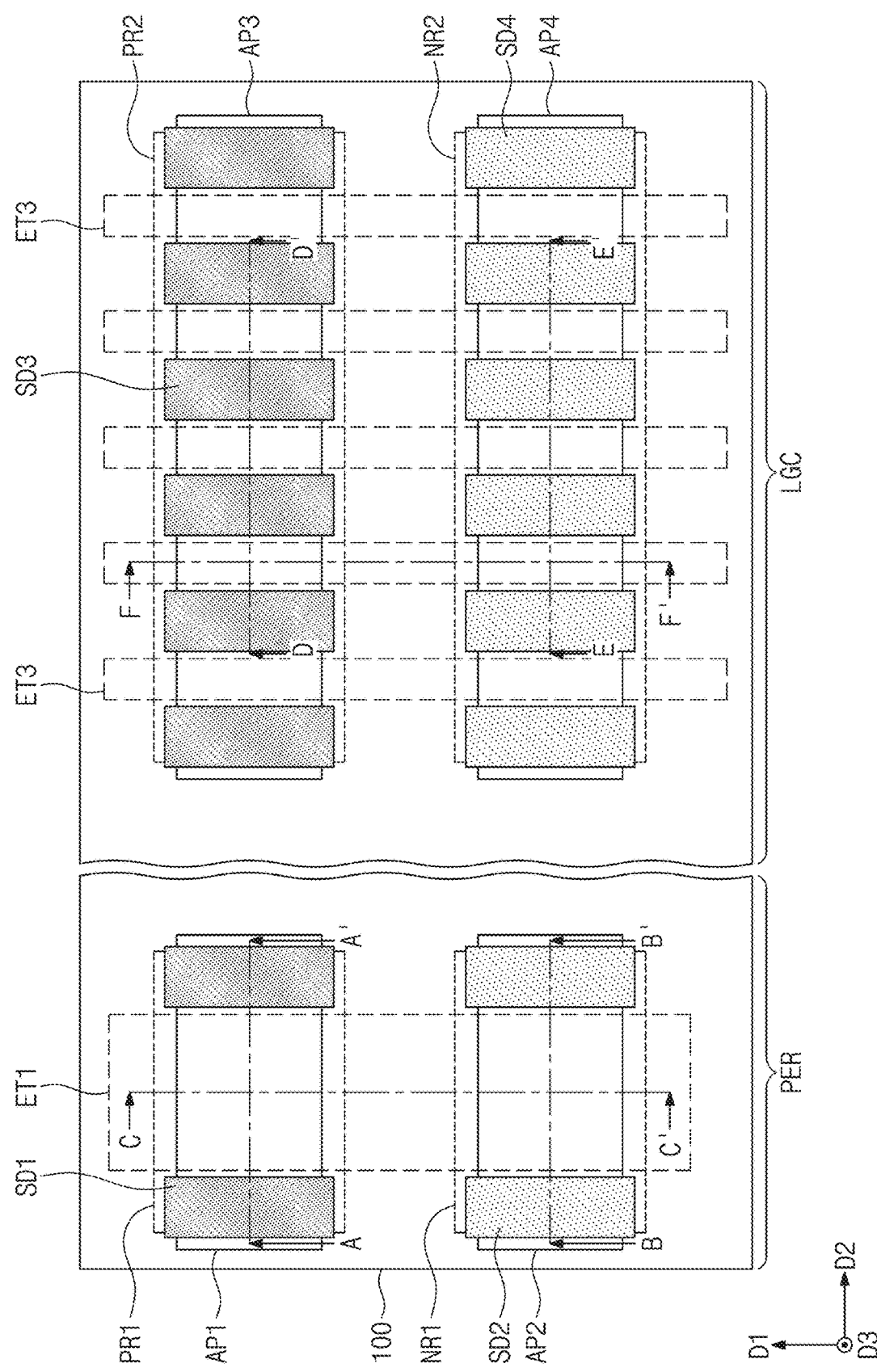

SEMICONDUCTOR DEVICE HAVING DIELECTRIC LAYERS OF VARYING THICKNESSES

CROSS-REFERENCE TO RELATED APPLICATION

This U.S. nonprovisional application claims priority under 35 U.S.C § 119 to Korean Patent Application No. 10-2020-0117129 filed on Sep. 11, 2020 in the Korean Intellectual Property Office, the disclosure of which is hereby incorporated by reference in its entirety.

BACKGROUND

Inventive concepts relate to a semiconductor device, and more particularly, to a semiconductor device including a field effect transistor.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some example embodiments of inventive concepts provide a semiconductor device with improved electrical characteristics.

According to some example embodiments of inventive concepts, a semiconductor device may comprise a substrate including a peripheral region and a logic cell region, a first channel pattern including a first semiconductor pattern and a second semiconductor pattern, the first semiconductor pattern and the second semiconductor pattern stacked vertically on the peripheral region, a first gate electrode across the first channel pattern and extending in a first direction, a second channel pattern including a third semiconductor pattern and a fourth semiconductor pattern, the third semiconductor pattern and the fourth semiconductor pattern stacked vertically on the logic cell region, and a second gate electrode across the second channel pattern and extending in the first direction, the second gate electrode having a second width in a second direction less than a first width in the second direction of the first gate electrode, the second direction perpendicular to the first direction. The first gate electrode has a first gate electrode thickness between the first semiconductor pattern and the second semiconductor pattern, and the second gate electrode has a second gate electrode thickness between the third semiconductor pattern and the fourth semiconductor pattern, the second gate electrode thickness being greater than the first gate electrode thickness.

According to some example embodiments of inventive concepts, a semiconductor device may comprise a substrate including a first region and a second region, a first channel pattern on the first region, a first gate electrode across the first channel pattern and extending in a first direction, a first high-k dielectric layer between the first gate electrode and the first channel pattern, a first interface dielectric layer between the first high-k dielectric layer and the first channel pattern, a second channel pattern on the second region, a second gate electrode across the second channel pattern and extending in the first direction, the second gate electrode having a first width in a second direction less than a second width in the second direction of the first gate electrode, the second direction being perpendicular to the first direction, and a second high-k dielectric layer between the second gate electrode and the second channel pattern. The first high-k dielectric layer has a first thickness greater than a second thickness of the second high-k dielectric layer.

According to some example embodiments of inventive concepts, a semiconductor device may comprise a substrate including a logic cell region and a peripheral region, a device isolation layer on the substrate, the device isolation layer defining a first active pattern and a second active pattern, the first active pattern on the peripheral region and the second active pattern on the logic cell region, a pair of first source/drain patterns on the first active pattern, the pair of first source/drain patterns including a first one of the pair of first source/drain patterns and a second one of the pair of first source/drain patterns, a first channel pattern connecting the first one of the pair of first source/drain patterns to the second one of the pair of first source/drain patterns, the first channel pattern including a first semiconductor pattern and a second semiconductor pattern on the first semiconductor pattern, a first gate electrode across the first channel pattern, the first gate electrode being between the first semiconductor pattern and the second semiconductor pattern and on a top surface of the second semiconductor pattern, a first interface dielectric layer between the first channel pattern and the first gate electrode, a first high-k dielectric layer between the first interface dielectric layer and the first gate electrode, a pair of second source/drain patterns on the second active pattern, the pair of second source/drain patterns including a first one of the pair of second source/drain patterns and a second one of the pair of second source/drain patterns, a second channel pattern between the first one of the pair of second source/ drain patterns and the second one of the pair of second source/drain patterns, the second channel pattern including a third semiconductor pattern and a fourth semiconductor pattern on the third semiconductor pattern, a second gate electrode across the second channel pattern, the second gate electrode being between the third semiconductor pattern and the fourth semiconductor pattern and on a top surface of the fourth semiconductor pattern, a second interface dielectric layer between the second channel pattern and the second gate electrode, and a second high-k dielectric layer between the second interface dielectric layer and the second gate electrode.

BRIEF DESCRIPTION OF THE DRAWINGS

FIG. 3 illustrates enlarged cross-sectional views showing section AA of FIG. 2A and section BB of FIG. 2E.

FIGS. 6, 8, 10, 12, 14, 16, 18, and 20 illustrate plan views showing a method of fabricating a semiconductor device according to some example embodiments of inventive concepts.

DETAILED DESCRIPTION OF SOME EXAMPLE EMBODIMENTS

Figure 1:
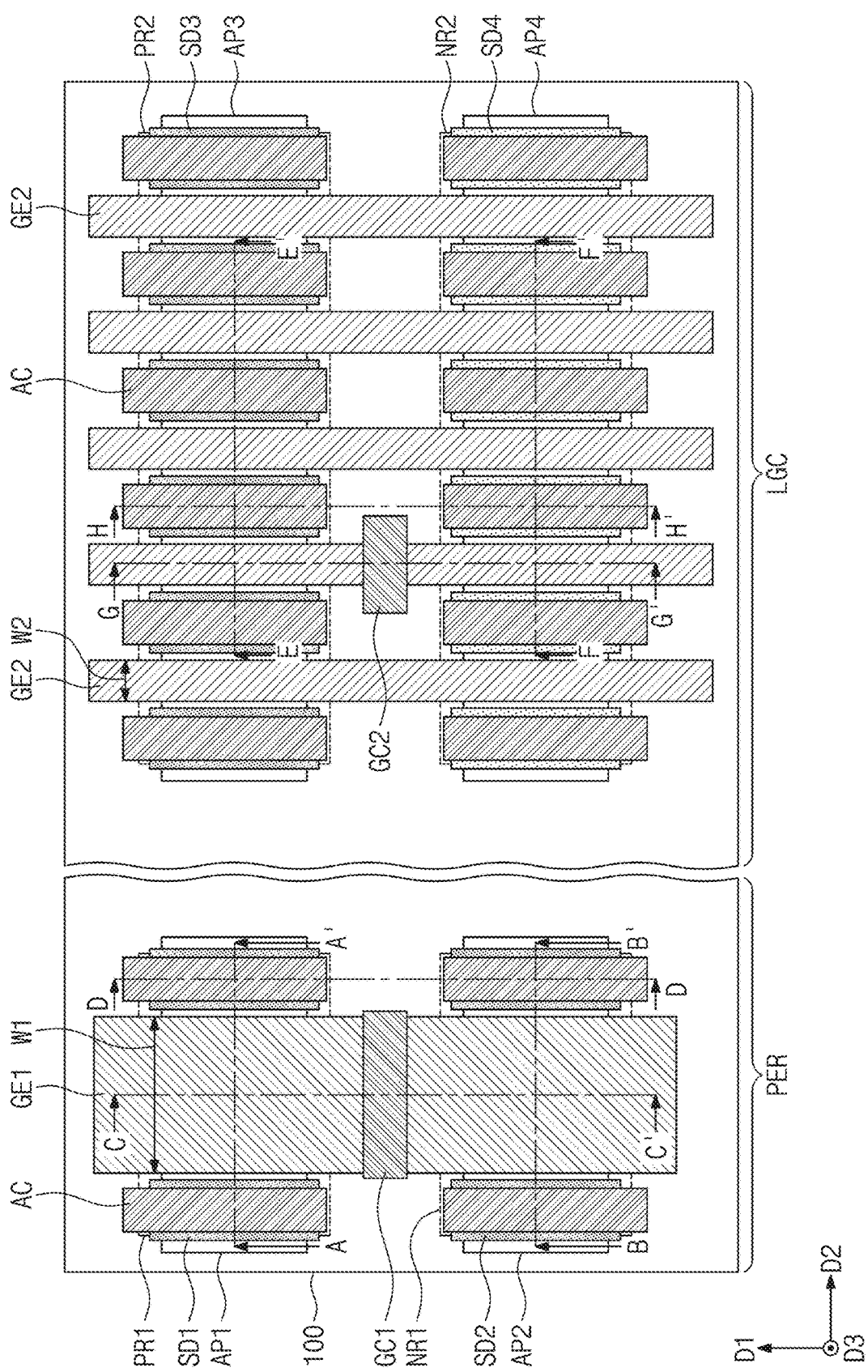
FIG. 1 illustrates a plan view showing a semiconductor device according to some example embodiments of inventive concepts.

FIG. 1 illustrates a plan view showing a semiconductor device according to some example embodiments of inventive concepts. FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.

Referring to FIG. 1, a substrate 100 may be provided which includes a peripheral region PER and a logic cell region LGC. The substrate 100 may be or include a compound semiconductor substrate or a semiconductor substrate including silicon, germanium, or silicon-germanium. For example, the substrate 100 may be or include a silicon substrate. The substrate 100 may be doped, e.g. may be lightly doped with impurities such as boron; however, example embodiments are not limited thereto. The peripheral region PER may be an area where are disposed transistors that constitute or correspond to at least one of a process core or an input/out terminal. The logic cell region LGC may be an area where is disposed a standard cell that constitutes or corresponds to a logic circuit such as a combinatorial logic circuit comprising logic gates. A transistor on the peripheral region PER may operate at higher power than that required for operating a transistor on the logic cell region LGC.

A transistor on the peripheral region PER will be described in detail below with reference to FIGS. 1 and 2A to 2D.

The peripheral region PER may include a first PMOSFET region PR1 and a first NMOSFET region NR1. A first active pattern AP1 may be provided on the first PMOSFET region PR1, and a second active pattern AP2 may be provided on the first NMOSFET region NR1. The first and second active patterns AP1 and AP2 may be vertically protruding portions of the substrate 100. The first and second active patterns AP1 and AP2 may be spaced apart from each other in a first direction D1. The first and second active patterns AP1 and AP2 may extend parallel to a second direction D2 and may extend perpendicular to the first direction D1. A first trench TR1 may be provided between the first active pattern AP1 and the second active pattern AP2. The first trench TR1 may have inner walls that define sidewalls of the first and second active patterns AP1 and AP2.

The first PMOSFET region PR1 and the first NMOSFET region NR1 may be defined by a second trench TR2 formed on the substrate 100. For example, the second trench TR2 may be positioned between the first PMOSFET region PR1 and the first NMOSFET region NR1. The second trench TR2 may be placed below the first trench TR1. The second trench TR2 may be deeper than the first trench TR1 (e.g. deeper within the substrate 100), and may have a bottom surface lower than that of the first trench TR1. The second trench TR2 may be a section that recessed from the bottom surface of the first trench TR1 toward a bottom surface of the substrate 100. The first PMOSFET region PR1 and the first NMOSFET region NR1 may be spaced apart from each other in the first direction D1 across the second trench TR2. The second trench TR2 may electrically separate or electrically isolate the first PMOSFET region PR1 from the first NMOSFET region NR1.

A device isolation layer ST may fill the first and second trenches TR1 and TR2. The device isolation layer ST may be or include, for example, a silicon oxide layer such as a high-density plasma (HDP) silicon oxide later and/or a spin-on glass (SOG) silicon oxide layer. The first and second active patterns AP1 and AP2 may have their upper portions that protrude upwardly from the device isolation layer ST (see FIG. 2C). The device isolation layer ST may not cover top surfaces of the first and second active patterns AP1 and AP2. The device isolation layers ST may cover at least portions of the sidewalls of the first and second active patterns AP1 and AP2. The top surfaces of the device isolation layer ST and the first and second active patterns AP1 and AP2 may not be planar.

Figure 2A:
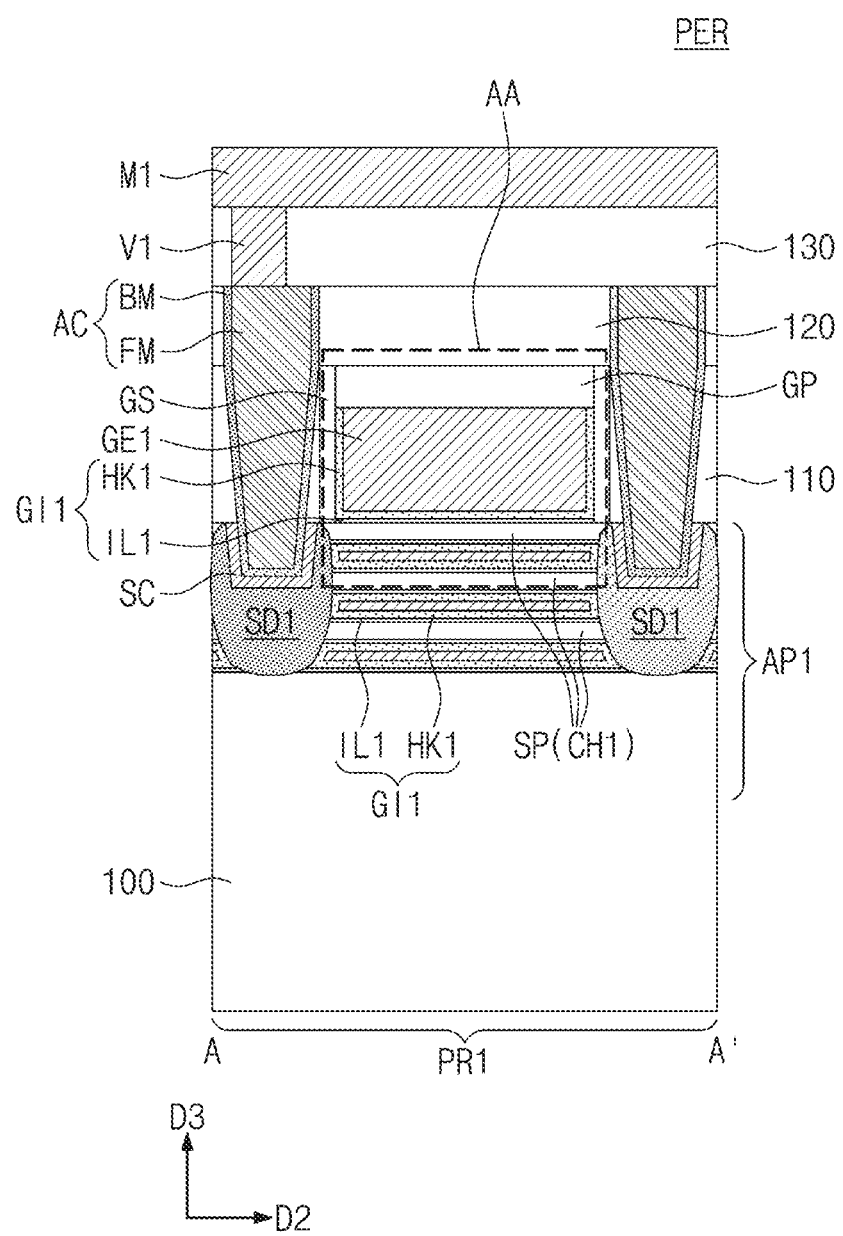
FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.

A pair of first source/drain patterns SD1 may be provided on the upper portion of the first active pattern AP1. As shown in FIG. 2A, the pair of first source/drain patterns SD1 may be spaced apart from each other in the second direction D2. The first source/drain patterns SD1 may be or include impurity regions having a first conductivity type (e.g., p-type impurities such as boron). There may not be another pocket and/or halo impurity region having a second conductivity type (e.g. n-type) within the first source/drain region SD1; however, example embodiments are not limited thereto. A first channel pattern CH1 may be defined between the pair of first source/drain patterns SD1. The first channel pattern CH1 may connect the pair of first source/drain patterns SD1 to each other in the second direction D2. When a first voltage (e.g. a first negative voltage) is applied to a first gate electrode GE1 which will be discussed below, the first channel pattern CH1 may provide an electrical pathway between the pair of first source/drain patterns SD1. A distance, e.g. an electrical distance, between the pair of first source/drain patterns SD1 may be referred to as a gate length.

Figure 2B:
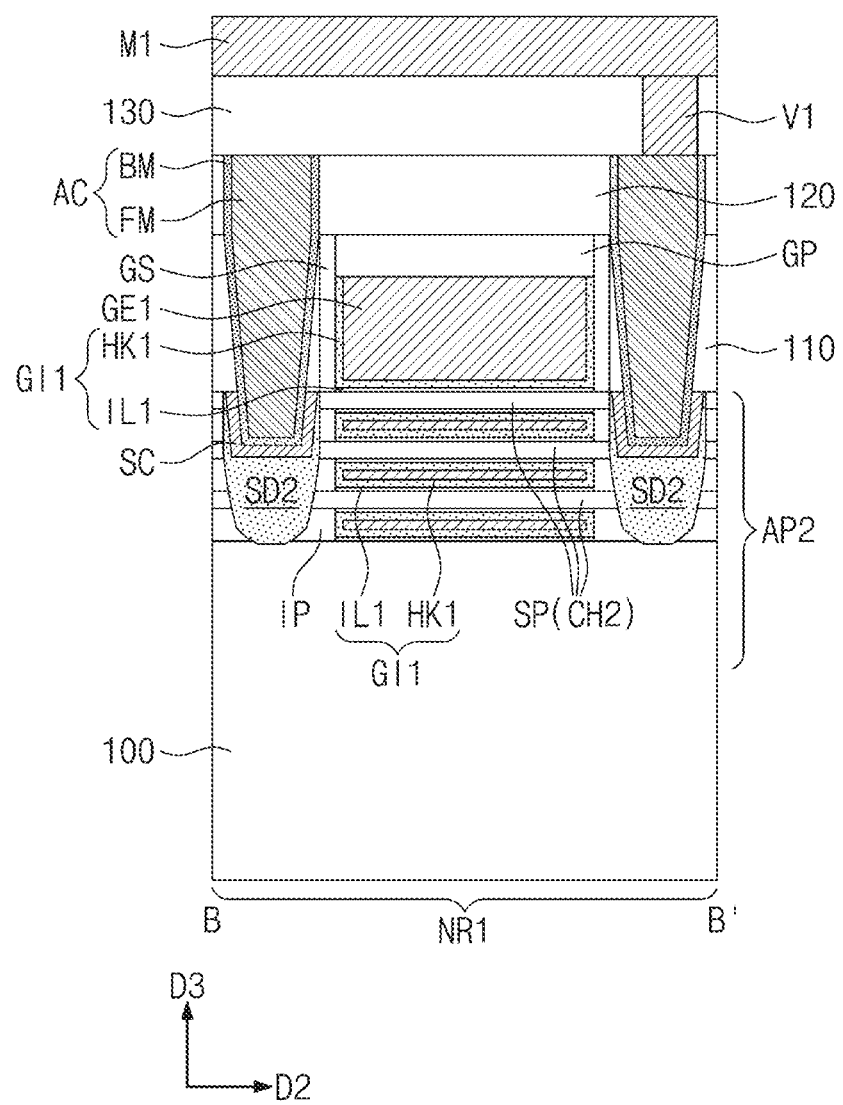

A pair of second source/drain patterns SD2 may be provided on the upper portion of the second active pattern AP2. As shown in FIG. 2B, the pair of second source/drain patterns SD2 may be spaced apart from each other in the second direction D2. The second source/drain patterns SD2 may be or include impurity regions having a second conductivity type (e.g., n-type impurities such as phosphorus and/or arsenic). There may not be a pocket and/or halo impurity region having the first conductivity type (e.g. p-type) within the second source/drain region SD2; however, example embodiments are not limited thereto. A second channel pattern CH2 may be defined between the pair of second source/drain patterns SD2. The second channel pattern CH2 may connect the pair of second source/drain patterns SD2 to each other in the second direction D2. When a second voltage (e.g. a positive voltage) is applied to a second gate electrode GE2 which will be discussed below, the second channel pattern CH2 may provide an electrical pathway between the pair of second source/drain patterns SD2. The second voltage may have a different value, e.g. a different sign and/or a different magnitude, from that of the first voltage. A distance, e.g. an electrical distance, between the pair of second source/drain patterns SD2 may be referred to as a gate length.

The first and second source/drain patterns SD1 and SD2 may be or include epitaxial patterns formed by a selective epitaxial growth process. The epitaxial growth process may be homogenous, or heterogeneous. For example, the epitaxial growth process may be a silicon-germanium epitaxial growth process. For example, each of the first and second source/drain patterns SD1 and SD2 may have a top surface at substantially the same level as, e.g. substantially planar with, that of a top surface of an uppermost semiconductor pattern SP which will be discussed below.

The first source/drain patterns SD1 may include a semiconductor element (e.g., SiGe) whose lattice constant is greater than that of a semiconductor element of the substrate 100. Therefore, the first source/drain patterns SD1 may provide the first channel pattern CH1 with compressive stress. The second source/drain patterns SD2 may include the same semiconductor element (e.g., Si) as that of the substrate 100, and may not provide the channel pattern CH2 with compressive stress.

Each of the first and second channel patterns CH1 and CH2 may include a plurality of semiconductor patterns SP. For example, each of the first and second channel patterns CH1 and CH2 may have three semiconductor patterns SP. The semiconductor patterns SP may be vertically overlapped and spaced apart from each other in a vertical direction. The semiconductor patterns SP may include, for example, at least one of silicon (Si) and silicon-germanium (SiGe). The number of semiconductor patterns SP may be less than three or more than three.

A first gate electrode GE1 may be provided to extend in the first direction D1, while running across the first and second active patterns AP1 and AP2. The first gate electrode GE1 may have a portion that vertically overlaps the first and second channel patterns CH1 and CH2.

Figure 2C:
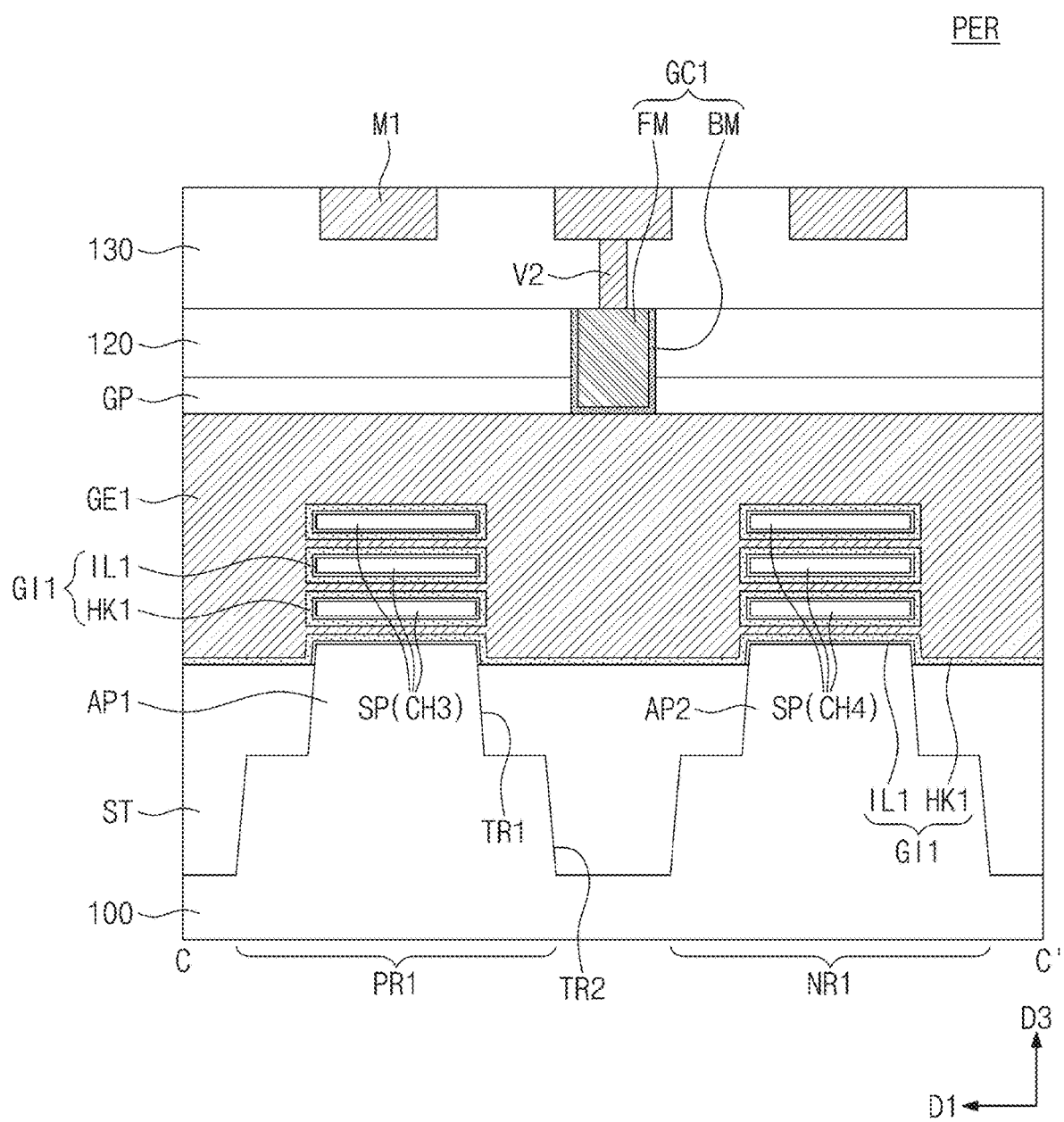
Figure 2D:
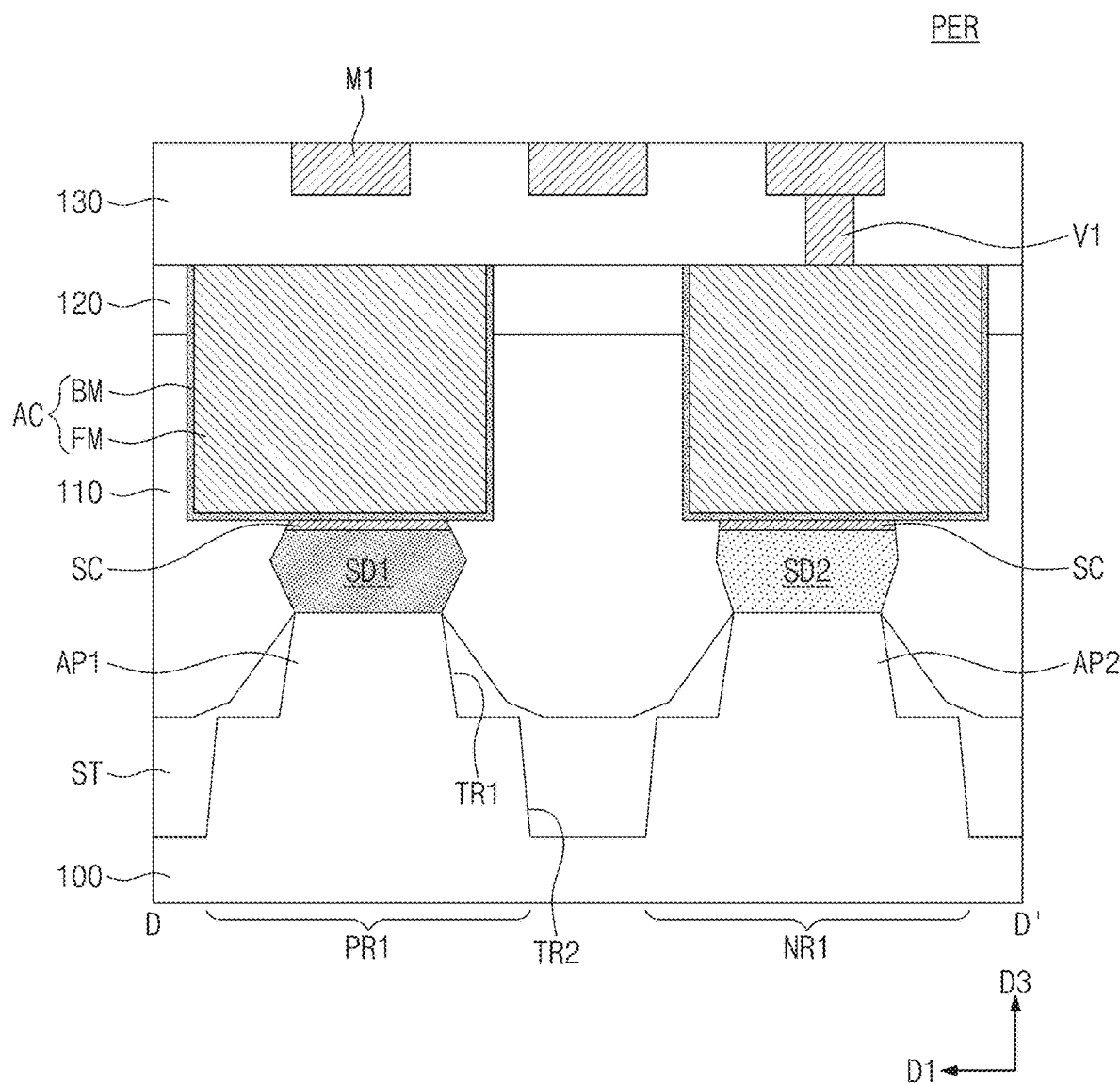

As shown in FIG. 2C, the first gate electrode GE1 may be provided on a top surface, a bottom surface, and opposite sidewalls of each of the first and second channel patterns CH1 and CH2. For example, according to some example embodiments, a transistor on the peripheral region PER may be or correspond to a three-dimensional field effect transistor in which the first channel pattern CH1 is three-dimensionally surrounded by the first gate electrode GE1.

Referring back to FIGS. 1 and 2A to 2D, a pair of gate spacers GS may be disposed on opposite sidewalls of the first gate electrode GE1. The gate spacers GS may extend in the first direction D1 along the first gate electrode GE1. The gate spacers GS may have their top surfaces higher than, e.g. higher than with respect to the substrate 100, that of the first gate electrode GE1. The top surfaces of the gate spacers GS may be coplanar with that of a first interlayer dielectric layer 110 which will be discussed below. For example, the gate spacers GS may include one or more of SiCN, SiCON, and SiN. Alternatively or additionally, the gate spacers GS may include a multi-layer formed of at least two selected from SiCN, SiCON, and SiN.

A gate capping pattern GP may be provided on the first gate electrode GE1. The gate capping pattern GP may extend in the first direction D1 along the first gate electrode GE1. The gate capping pattern GP may include a material having an etch selectivity with respect to, e.g. may etch slower than, first and second interlayer dielectric layers 110 and 120, which will be discussed below. The gate capping pattern GP may include, for example, one or more of SiON, SiCN, SiCON, and SiN.

A first gate dielectric layer GI1 may be interposed between the first gate electrode GE1 and the first channel pattern CH1 and between the first gate electrode GE1 and the second channel pattern CH2. The first gate dielectric layer GI1 may extend along a bottom surface of the first gate electrode GE1. The first gate dielectric layer GI1 may cover a top surface of the device isolation layer ST below the first gate electrode GE1.

The first gate dielectric layer GI1 may include a first interface dielectric layer IL1 and a first high-k dielectric layer HK1. The first interface dielectric layer IL1 may be disposed between the first gate electrode GE1 and the first channel pattern CH1 and between the first gate electrode GE1 and the second channel pattern CH2. The first interface dielectric layer IL1 may be directly disposed on surfaces of the first and second channel patterns CH1 and CH2. The first interface dielectric layer IL1 may cover a top surface, a bottom surface, and opposite sidewalls of the semiconductor pattern SP, which opposite sidewalls face each other in the first direction D1.

The first high-k dielectric layer HK1 may be disposed between the first gate electrode GE1 and the first interface dielectric layer IL1. The first high-k dielectric layer HK1 may also be disposed between the first gate electrode GE1 and the device isolation layer ST.

According to some example embodiments, the first high-k dielectric layer HK1 may be thicker than the first interface dielectric layer IL1. The first interface dielectric layer IL1 may include a silicon oxide layer and/or a silicon oxynitride layer. The first high-k dielectric layer HK1 may include a high-k dielectric material whose dielectric constant is greater than that of silicon oxide. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The first gate electrode GE1 may include a first metal pattern and a second metal pattern on the first metal pattern. The first gate dielectric layer GI1 may be provided thereon with the first metal pattern adjacent to the first and second channel patterns CH1 and CH2. The first metal pattern may include a work function metal that controls a threshold voltage, e.g. a magnitude of a threshold voltage, of a transistor. A thickness and/or a composition of the first metal pattern may be adjusted to control a threshold voltage of a transistor.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of work function metal layers that are stacked.

The second metal pattern may include metal whose resistance is less than that of the first metal pattern. For example, the second metal pattern may include at least one metal selected from tungsten (W), aluminum (Al), titanium (Ti), and tantalum (Ta).

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and those of the gate spacers GS. The first interlayer dielectric layer 110 may be provided thereon with a second interlayer dielectric layer 120 that covers the gate capping pattern GP. For example, the first and second interlayer dielectric layers 110 and 120 may include a silicon oxide layer.

Active contacts AC may be provided to penetrate the first and second interlayer dielectric layers 110 and 120 and to have electrical connections with the first and second source/drain patterns SD1 and SD2. A pair of active contacts AC may be provided on opposite sides of the first gate electrode GE1. When viewed in plan view, the active contact AC may have a bar shape that extends in the first direction D1.

The active contact AC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include one or more of titanium, tantalum, tungsten, nickel, cobalt, and platinum. The metal nitride layer may include one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

The active contact AC may be or correspond to a self-aligned contact. For example, the gate capping pattern GP and the gate spacer GS may be used to form the active contact AC in a self-alignment manner. For example, the active contact AC may cover at least a portion of a sidewall of the gate spacer GS. Although not shown, the active contact AC may partially cover the top surface of the gate capping pattern GP.

A silicide pattern SC (e.g. a salicide pattern) may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, one or more of titanium silicide, tantalum silicide, tungsten silicide, nickel silicide, and cobalt silicide.

A first gate contact GC1 may be provided to penetrate the second interlayer dielectric layer 120 and the gate capping pattern GP and to have an electrical connection with the first gate electrode GE1. The first gate contact GC1 may be provided on the device isolation layer ST between the first PMOSFET region PR1 and the first NMOSFET region NR1. When viewed in plan view, the first gate contact GC1 may have a bar shape that extends in the second direction D2. Likewise the active contact AC, the first gate contact GC1 may include a conductive pattern FM and a barrier pattern BM that surrounds the conductive pattern FM.

A third interlayer dielectric layer 130 may be provided on the second interlayer dielectric layer 120. A first metal layer may be provided in the third interlayer dielectric layer 130. The first metal layer may include first wiring lines M1, a first via V1, and a second via V2. The first and second vias V1 and V2 may be provided below the first wiring lines M1.

The first wiring lines M1 may parallel in the second direction D2. The first wiring lines M1 may be arranged in the first direction D1. Although not illustrated, the first wiring lines M1 may have portions, e.g. legs, that are not parallel in the second direction D2. The first via V1 may lie between and electrically connect the first wiring line M1 and the active contact AC. The second via V2 may line between and electrically connect the first wiring line M1 and the first gate contact GC1.

The first wiring line M1 and a respective underlying one of the first and second vias V1 and V2 may be integrally connected into a single conductive structure. For example, the first wiring line M1 and one of the first and second vias V1 and V2 may be formed together with each other. A dual damascene process may be performed such that the first wiring line M1 and one of the first and second vias V1 and V2 may be formed into a single conductive structure. Although not shown, the third interlayer dielectric layers 130 may further be provided thereon with stacked metal layers (e.g., M2, M3, and M4). Although not shown, M2 may extend in the first direction D1, M3 may extend in the second direct D2, and M4 may extend in the first direction D1; however, example embodiments are not limited thereto.

A transistor on the logic cell region LGC will be described in detail below with reference to FIGS. 1 and 2E to 2H. Omission will be made to avoid repetitive descriptions of technical features the same as or similar to those of the transistor on the peripheral region PER discussed with reference to FIGS. 1 and 2A to 2D, and differences thereof will be discussed in detail.

The logic cell region LGC may include a second PMOSFET region PR2 and a second NMOSFET region NR2. The second PMOSFET region PR2 and the second NMOSFET region NR2 may be defined by a fourth trench TR4 formed on an upper portion of the substrate 100. A third active pattern AP3 and a fourth active pattern AP4 may be defined by a third trench TR3 formed on the upper portion of the substrate 100. The third active pattern AP3 and the fourth active pattern AP4 may be respectively provided on the second PMOSFET region PR2 and the second NMOSFET region NR2.

Third source/drain patterns SD3 may be provided on an upper portion of the third active pattern AP3. Fourth source/drain patterns SD4 may be provided on an upper portion of the fourth active pattern AP4. A third channel pattern CH3 may be defined between a pair of third source/drain patterns SD3. A fourth channel pattern CH4 may be defined between a pair of fourth source/drain patterns SD4. Each of the third and fourth channel patterns CH3 and CH4 may include semiconductor patterns SP that are vertically overlapped and spaced apart from each other.

The semiconductor patterns SP of the third and fourth channel patterns CH3 and CH4 may be located at the same level as, e.g. the same level with respect to the substrate 100 as that of the semiconductor patterns SP of the first and second channel patterns CH1 and CH2 discussed with reference to FIGS. 1 and 2A to 2D. For example, the semiconductor patterns SP of the third and fourth channel patterns CH3 and CH4 may have their top and bottom surfaces at the same levels as those of the top and bottom surfaces of the semiconductor patterns SP of the first and second channel patterns CH1 and CH2. Alternatively or additionally, the first, second, third, and fourth channel patterns CH1, CH2, CH3, and CH4 may have the same number of the semiconductor patterns SP. For example, each of the first, second, third, and fourth channel patterns CH1, CH2, CH3, and CH4 may have three semiconductor patterns SP that are vertically stacked and are spaced apart from each other. According to some example embodiments, the semiconductor patterns SP in each of the first, second, third, and fourth channel patterns CH1, CH2, CH3, and CH4 may be formed by patterning a plurality of semiconductor layers that are stacked spaced apart from each other.

Each of the third source/drain patterns SD3 may be or include an epitaxial pattern that includes impurities having a first conductivity type (e.g., p-type such as boron). Each of the fourth source/drain patterns SD4 may be an epitaxial pattern that includes impurities having a second conductivity type (e.g., n-type such as phosphorus and/or arsenic).

A second gate electrode GE2 may be provided to extend in the first direction D1, while running across the third and fourth channel patterns CH3 and CH4. The second gate electrode GE2 may vertically overlap the third and fourth channel patterns CH3 and CH4. A pair of gate spacers GS may be disposed on opposite sidewalls of the second gate electrode GE2. A gate capping pattern GP may be provided on the second gate electrode GE2. The second gate electrode GE2 may, as shown in FIG. 1, have a width W2 (e.g. a width corresponding to a gate length) less than a width W1 of the first gate electrode GE1 (e.g. a width corresponding to a gate length).

Figure 2E:
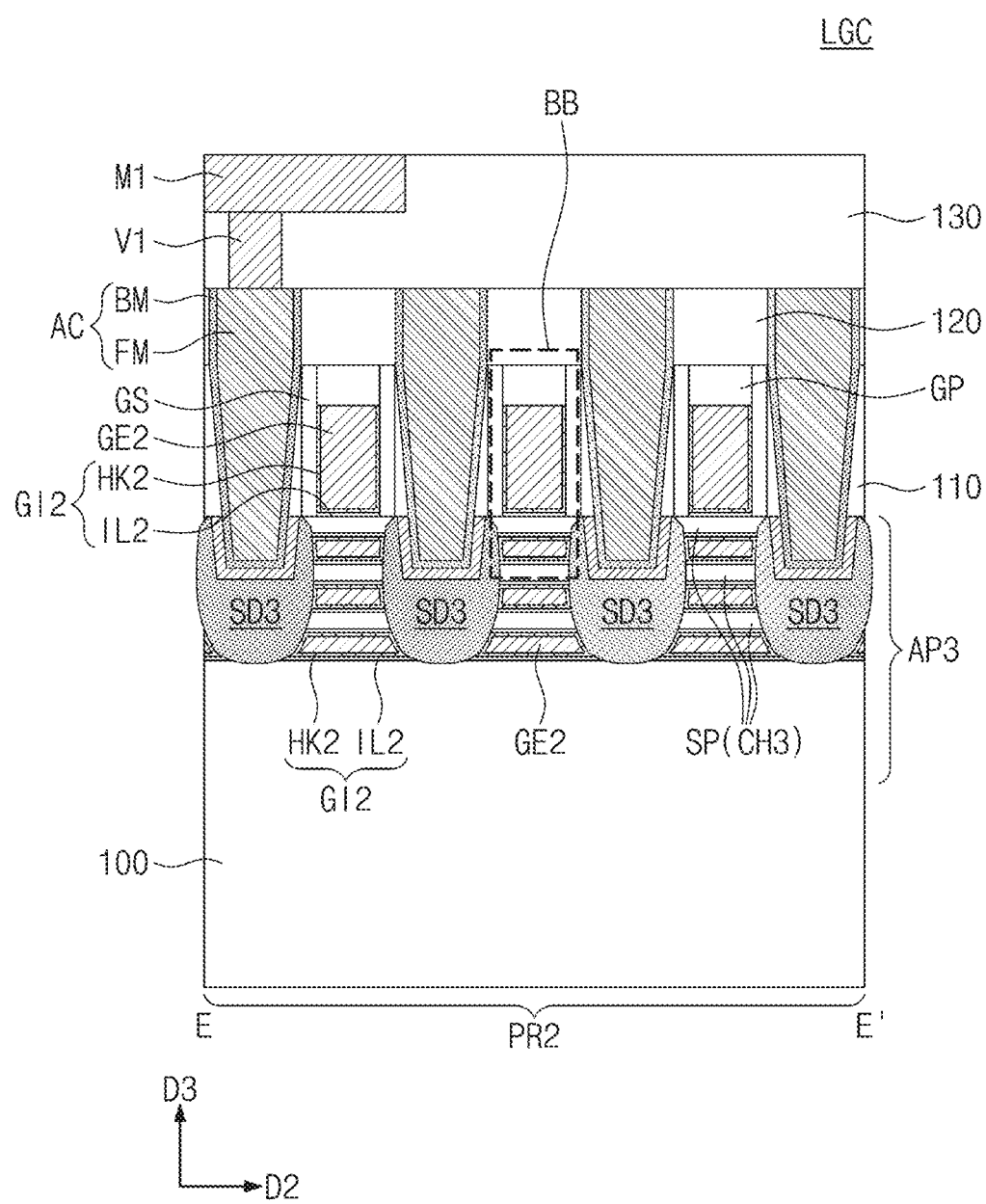
Figure 2F:
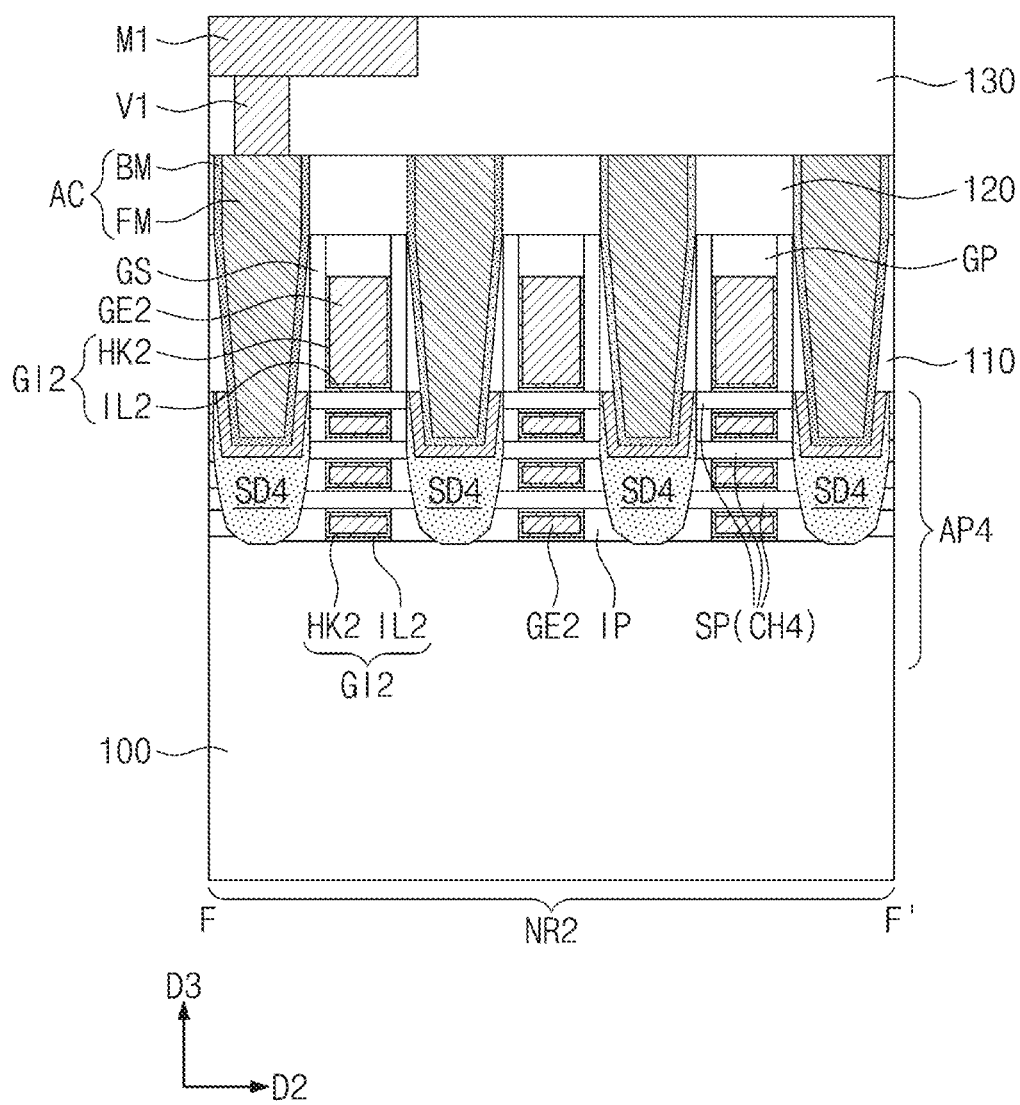
Figure 2G:
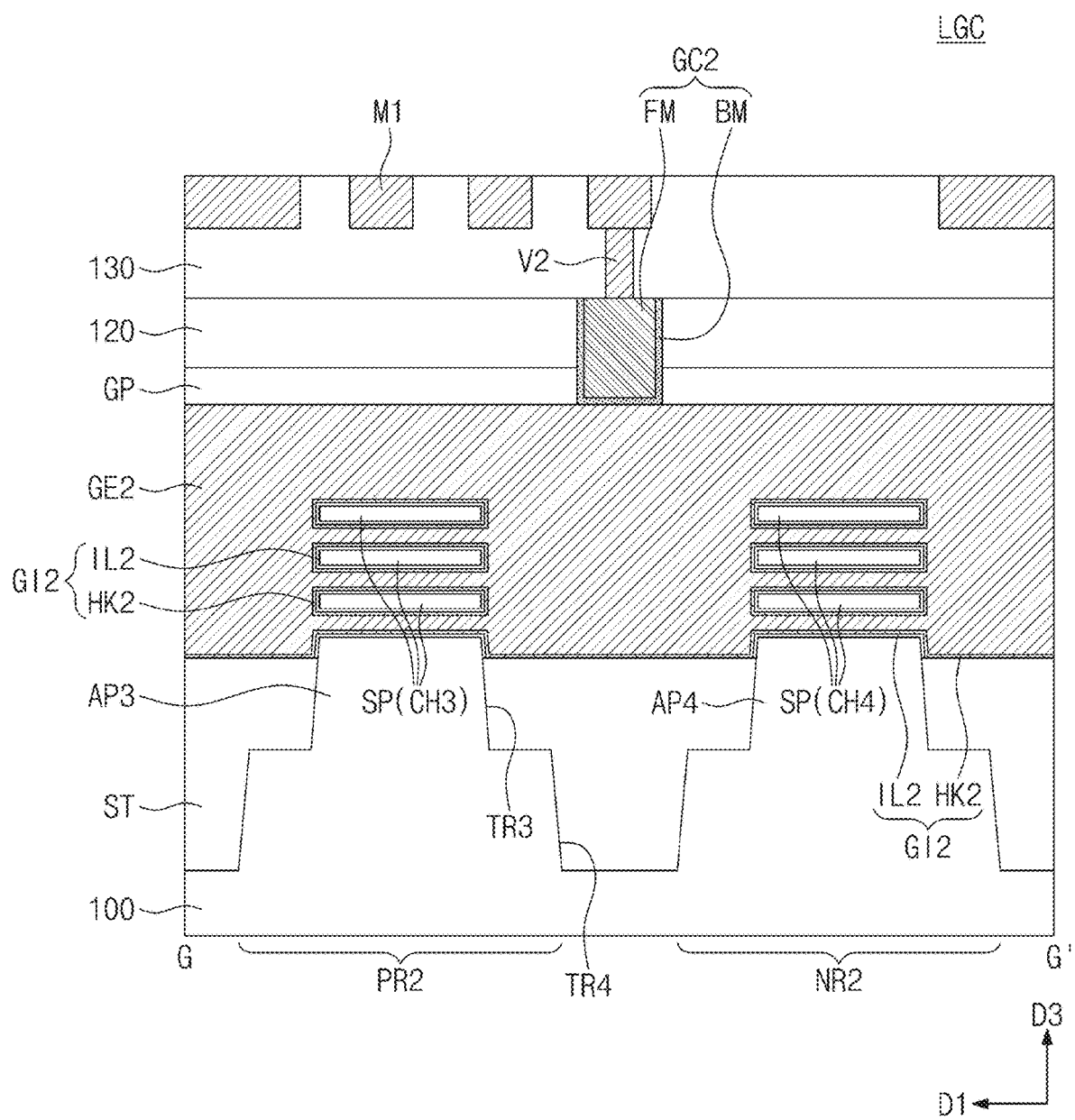
Figure 2H:
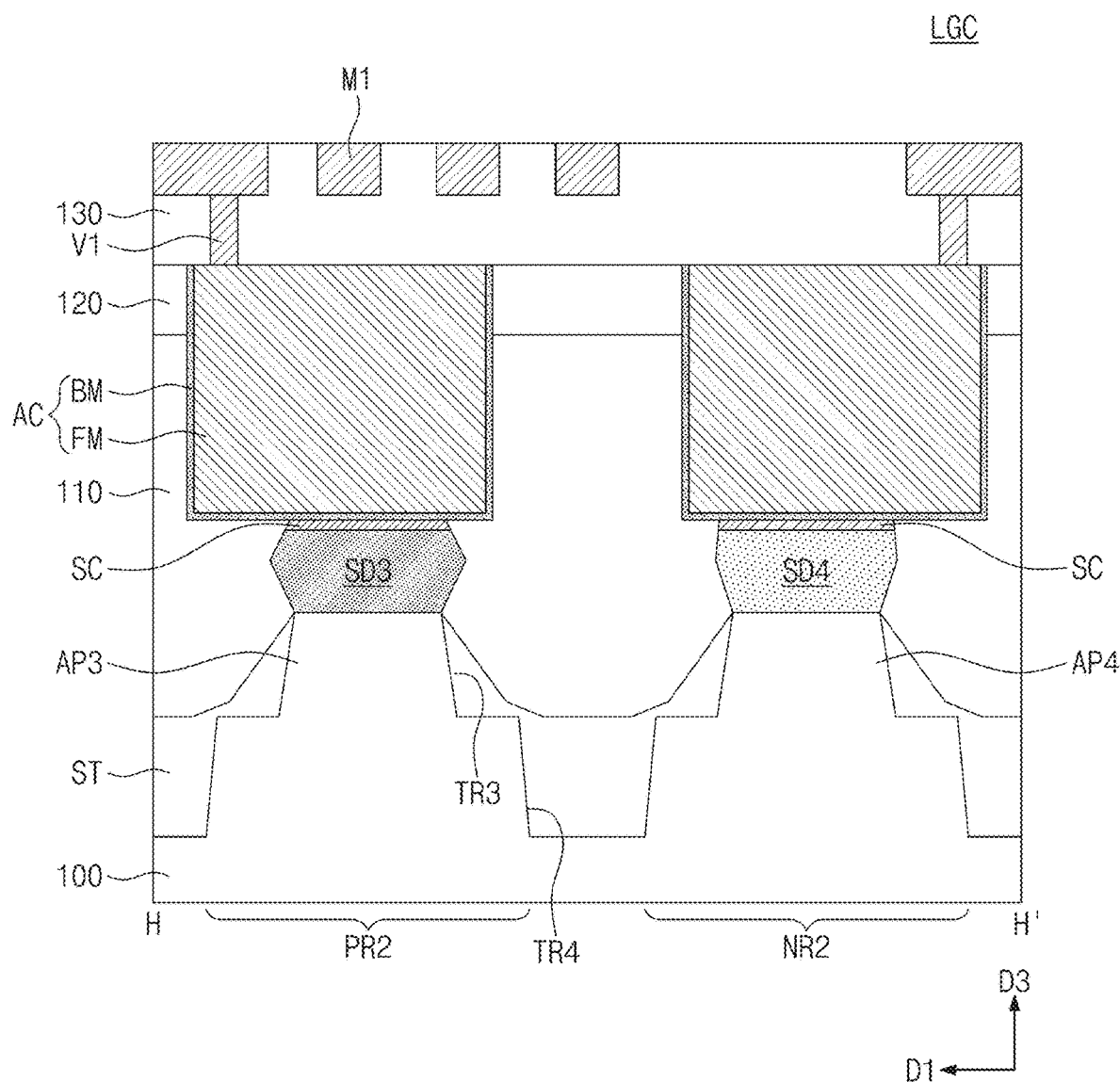

The second gate electrode GE2 may, as shown in FIG. 2G, surround each of the semiconductor patterns SP. The second gate electrode GE2 may be provided on a top surface, opposite sidewalls, and a bottom surface of the semiconductor pattern SP. The second gate electrode GE2 may surround the semiconductor patterns SP that constitute or correspond to the third channel pattern CH3 or the fourth channel pattern CH4. For example, according to the present embodiment, a transistor on the logic cell region LGC may be a three-dimensional field effect transistor (e.g., MBCFET) in which the second channel CH2 is three-dimensionally surrounded by the second gate electrode GE2.

A second gate dielectric layer GI2 may be interposed between the second gate electrode GE2 and the third channel pattern CH3 and between the second gate electrode GE2 and the fourth channel pattern CH4. The second gate electrode GE2 and the second gate dielectric layer GI2 may fill a space between the semiconductor patterns SP that are vertically adjacent to each other. The second gate dielectric layer GI2 may include a second interface dielectric layer IL2 that covers, e.g. directly covers each of the semiconductor patterns SP. The second gate dielectric layer GI2 may further include a second high-k dielectric layer HK2 on the second interface dielectric layer IL2. The second high-k dielectric layer HK2 may have a thickness less than that of the first high-k dielectric layer HK1 discussed with reference to FIGS. 1 and 2A to 2D. On the second NMOSFET region NR2, a dielectric pattern IP may be interposed between the second gate dielectric layer GI2 and the fourth source/drain pattern SD4. The second gate dielectric layer GI2 and the dielectric pattern IP may separate the second gate electrode GE2 from the fourth source/drain pattern SD4. In contrast, the dielectric pattern IP may be omitted from the second PMOSFET region PR2.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to have connections with the third and fourth source/drain patterns SD3 and SD4. A detailed description of the active contact AC may be substantially the same as that discussed above with reference to FIGS. 1 and 2A to 2D. A second gate contact GC2 may be provided to penetrate the second interlayer dielectric layer 120 and the gate capping pattern GP and to have an electrical connection with the second gate electrode GE2. The second gate contact GC2 may be provided on, e.g., above, a device isolation layer ST between the second PMOSFET region PR2 and the second NMOSFET region NR2. When viewed in plan view, the second gate contact GC2 may have a bar shape that extends in the second direction D2. As shown in FIG. 1, the second gate contact GC2 may have a width (not labeled) in the second direction D2 less than a width (not labeled) in the second direction D2 of the first gate contact GC1. The second gate contact GC2 may include a conductive pattern FM and a barrier pattern BM that surrounds the conductive pattern FM.

A third interlayer dielectric layer 130 may be provided on the second interlayer dielectric layer 120. A first metal layer may be provided in the third interlayer dielectric layer 130. The first metal layer may include first wiring lines M1, first vias V1, and second vias V2. Although not illustrated, other metal layers, e.g. M2, M3, M4, may be on or above the first wiring lines M1.

Figure 4:
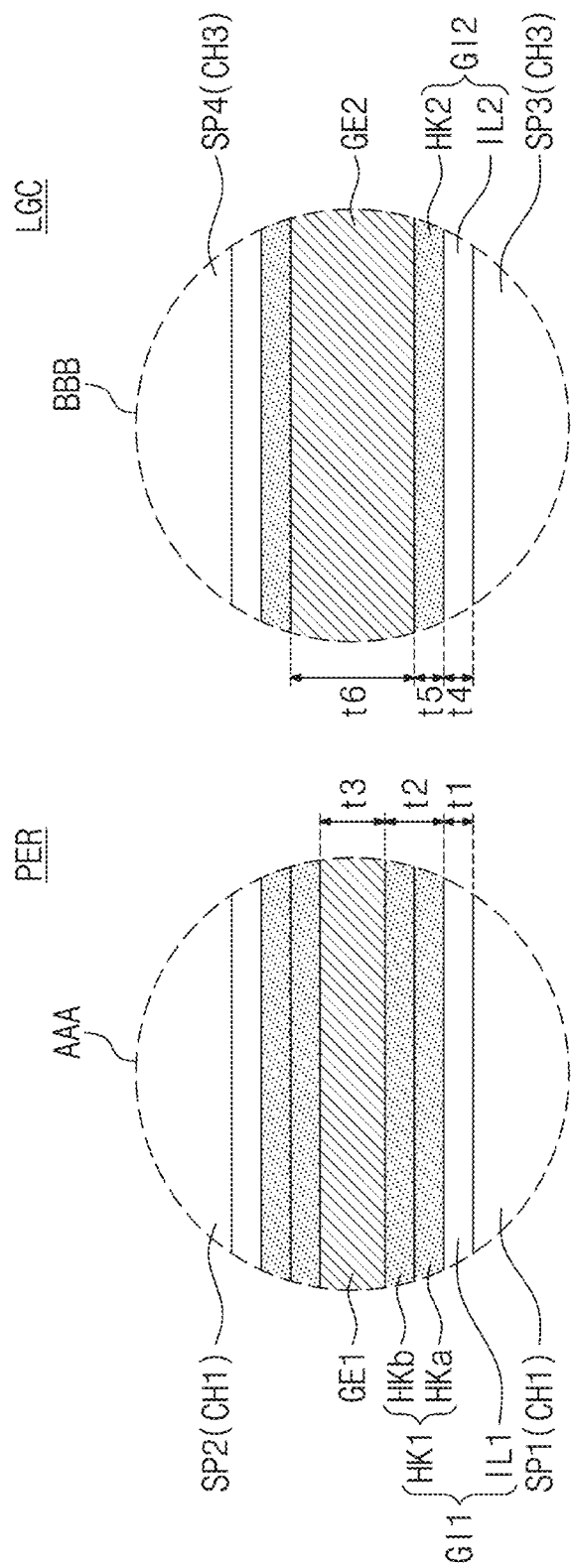
FIG. 4 illustrates enlarged cross-sectional views showing sections AAA and BBB of FIG. 3.

FIG. 3 illustrates enlarged cross-sectional views showing section AA of FIG. 2A and section BB of FIG. 2E. FIG. 4 illustrates enlarged cross-sectional views showing sections AAA and BBB of FIG. 3.

With reference to FIGS. 3 and 4, the following will describe in detail a transistor on the peripheral region PER and a transistor on the logic cell region LGC.

A first semiconductor pattern SP1 and a second semiconductor pattern SP2 may be stacked and spaced apart from each other on the peripheral region PER. The first and second semiconductor patterns SP1 and SP2 may be or correspond to portions of a transistor on the peripheral region PER and may be disposed between the first source/drain patterns SD1. The second semiconductor pattern SP2 may be or correspond to an uppermost one, e.g. an uppermost one with respect to the substrate 100, of semiconductor patterns included in a channel pattern.

The first gate electrode GE1 may have a first part P1 between the first and second semiconductor patterns SP1 and SP2, and may also have a second part P2 on a top surface of the second semiconductor pattern SP2. For the first gate electrode GE1, the second part P2 may have a width W1 greater than a thickness of the second part P2. For example, for the first gate electrode GE1, the width W1 of the second part P2 may be about 2 to 5 times the thickness of the second part P2. In addition, the width W1 of the first gate electrode GE1 may be greater than the width W2 of the second gate electrode GE2. For example, the width W1 of the first gate electrode GE1 may be about 4 to 10 times the width W2 of the second gate electrode GE2.

Between the first and second semiconductor patterns SP1 and SP2, the first high-k dielectric layer HK1 may be disposed on top, bottom, and lateral surfaces of the first part P1 included in the first gate electrode GE1. The first high-k dielectric layer HK1 may surround the first part P1.

The first high-k dielectric layer HK1 may include or consist of a first material layer HKa and a second material layer HKb. The first material layer HKa may be disposed between the first part P1 of the first gate electrode GE1 and the first and second semiconductor patterns SP1 and SP2, and the second material layer HKb may be in contact with, e.g. in direct contact with the first material layer HKa while being disposed between the first material layer HKa and the first part P1 of the first gate electrode GE1.

The first material layer HKa may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. The second material layer HKb may include at least selected from the example materials of the first material layer HKa.

According to some example embodiments, the first and second material layers HKa and HKb may include, e.g. may consist of, the same material. For example, each of the first and second material layers HKa and HKb may include hafnium oxide. When the first and second material layers HKa and HKb include or consist of the same material, the first and second material layers HKa and HKb may have an indistinct boundary therebetween, e.g. may not have a boundary that is visible or determined with a microscope such as a transmission electron microscope (TEM).

According to some example embodiments, the first and second material layers HKa and HKb may include or have different materials from each other. For example, the first material layer HKa may include one of hafnium oxide and lanthanum oxide. The second material layer HKb may include the other of hafnium oxide and lanthanum oxide, and may not include the one of hafnium oxide and lanthanum oxide included in the first material layer HKa.

The first interface dielectric layer IL1 may be disposed between the first semiconductor pattern SP1 and the first high-k dielectric layer HK1 and between the second semiconductor pattern SP2 and the first high-k dielectric layer HK1. The first interface dielectric layer IL1 may lie on top and bottom surfaces of the first high-k dielectric layer HK1, but may not cover lateral surfaces of the first high-k dielectric layer HK1. The first interface dielectric layer IL1 may contact, e.g. directly contact a top surface of the first semiconductor pattern SP1 and a bottom surface of the second semiconductor pattern SP2.

On a top surface of the second semiconductor pattern SP2, the first high-k dielectric layer HK1 may be positioned on lateral and bottom surfaces of the second part P2. The first high-k dielectric layer HK1 may contact, e.g. directly contact the lateral and bottom surfaces of the second part P2 included in the first gate electrode GE1. The first interface dielectric layer IL1 may be disposed between the first high-k dielectric layer HK1 and the top surface of the second semiconductor pattern SP2. The first interface dielectric layer IL1 may not be positioned on the lateral surfaces of the second part P2.

A third semiconductor pattern SP3 and a fourth semiconductor pattern SP4 may be stacked and spaced apart from each other on the logic cell region LGC. The third and fourth semiconductor patterns SP3 and SP4 may be or correspond to portions of a channel of a transistor on the logic cell region LGC and may be disposed between a pair of third source/drain patterns SD3. The fourth semiconductor pattern SP4 may be an uppermost one of semiconductor patterns disposed between the pair of third source/drain patterns SD3.

The second gate electrode GE2 may have a third part P3 between the third and fourth semiconductor patterns SP3 and SP4, and may also have a fourth part P4 on a top surface of the fourth semiconductor pattern SP4. For the second gate electrode GE2, the fourth part P4 may have a width W2 less than a thickness of the fourth part P4.

Between the third and fourth semiconductor patterns SP3 and SP4, the second high-k dielectric layer HK2 may be disposed on top, bottom, and lateral surfaces of the third part P3 included in the second gate electrode GE2. The second high-k dielectric layer HK2 may surround the third part P3.

The second interface dielectric layer IL2 may be disposed between the third semiconductor pattern SP3 and the second high-k dielectric layer HK2 and between the fourth semiconductor pattern SP4 and the second high-k dielectric layer HK2. The second interface dielectric layer IL2 may not cover lateral surfaces of the second high-k dielectric layer HK2. The second interface dielectric layer IL2 may contact, e.g. directly contact a top surface of the third semiconductor pattern SP3 and a bottom surface of the fourth semiconductor pattern SP4.

On a top surface of the fourth semiconductor pattern SP4, the second high-k dielectric layer HK2 may be positioned on lateral and bottom surfaces of the fourth part P4 included in the second gate electrode GE2. The second high-k dielectric layer HK2 may contact, e.g. directly contact the lateral and bottom surfaces of the fourth part P4 included in the second gate electrode GE2. The second interface dielectric layer IL2 may be disposed between the second high-k dielectric layer HK2 and the top surface of the fourth semiconductor pattern SP4. The second interface dielectric layer IL2 may not be positioned on the lateral surfaces of the fourth part P4.

According to some example embodiments, the second high-k dielectric layer HK2 may be a single layer that includes only one of or at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, and any compound thereof.

As shown in FIG. 4, the first high-k dielectric layer HK1 may have a thickness t2 greater than a thickness t5 of the second high-k dielectric layer HK2. The thickness t2 of the first high-k dielectric layer HK1 may be about 1.5 to 2.5 times the thickness t5 of the second high-k dielectric layer HK2. The first material layer HKa and the second high-k dielectric layer HK2 may include the same material and may have the same thickness.

A thickness t1 of the first interface dielectric layer IL1 and a thickness t4 of the second interface dielectric layer IL2 may be less than the thickness t2 of the first high-k dielectric layer HK1. The first and second interface dielectric layers IL1 and IL2 may include the same material and may have the same thickness.

A thickness t3 at a portion of the first gate electrode GE1 positioned between the first and second semiconductor patterns SP1 and SP2 may be less than a thickness t6 at a portion of the second gate electrode GE2 positioned between the third and fourth semiconductor patterns SP3 and SP4. Accordingly, an interval between a top surface of the first semiconductor pattern SP1 and a bottom surface of the second semiconductor pattern SP2 may be the same as an interval between a top surface of the third semiconductor pattern SP3 and a bottom surface of the fourth semiconductor pattern SP4.

Figure 5:
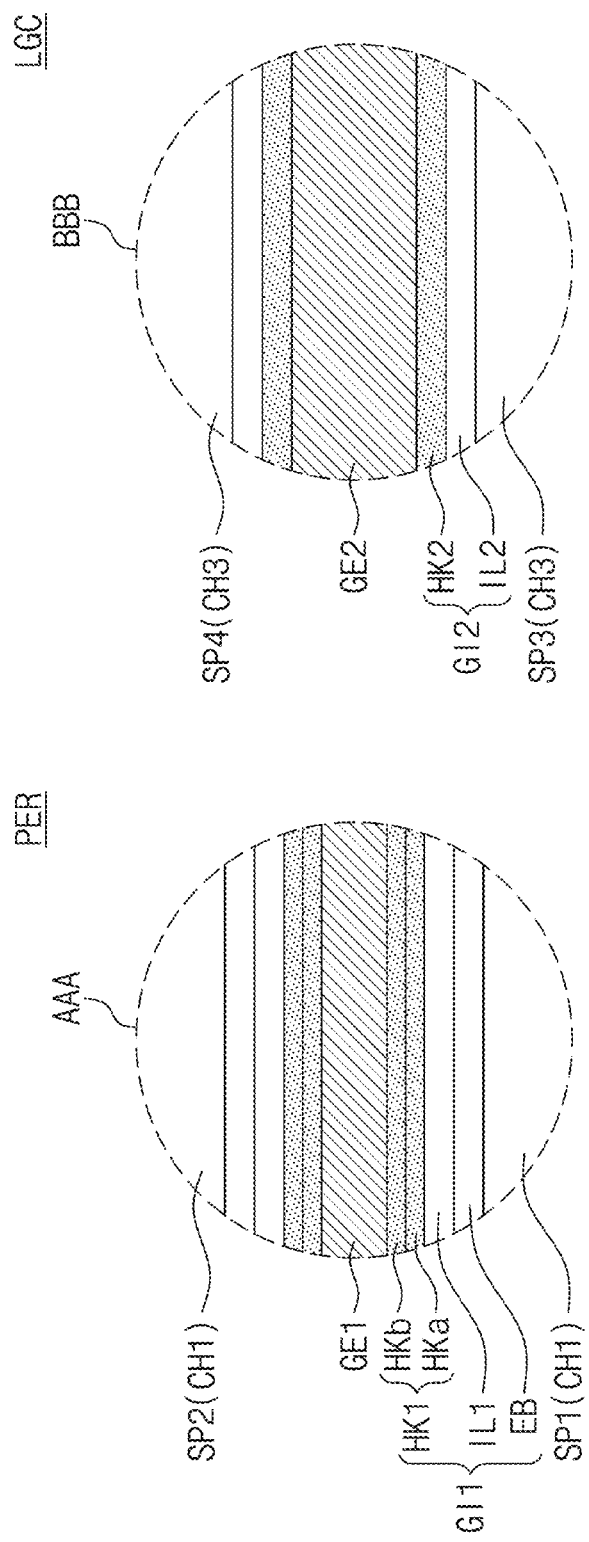
FIG. 5 illustrates cross-sectional views of sections AAA and BBB of FIG. 3, showing a semiconductor device according to some example embodiments of inventive concepts.
Figure 6:
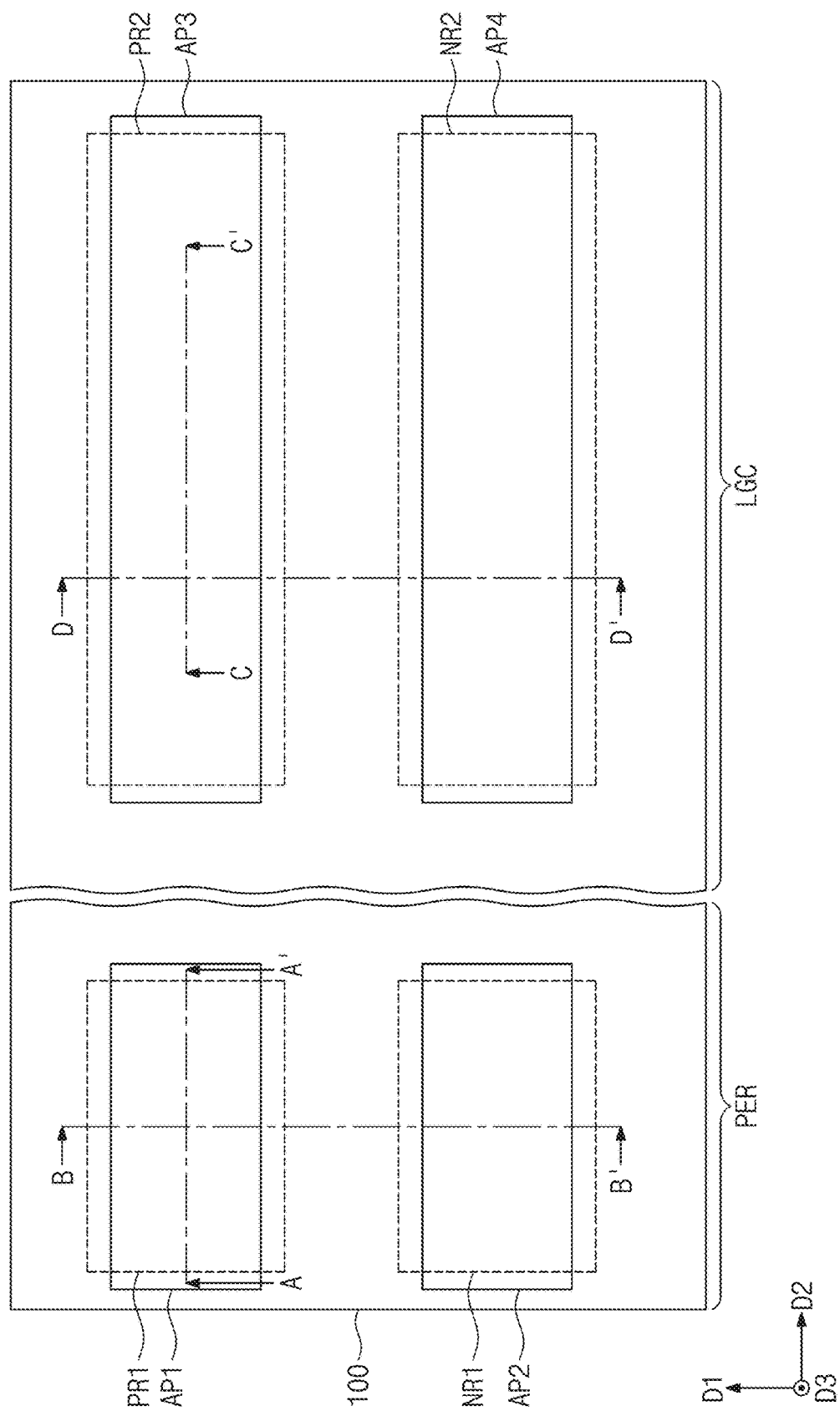
Figure 7A:
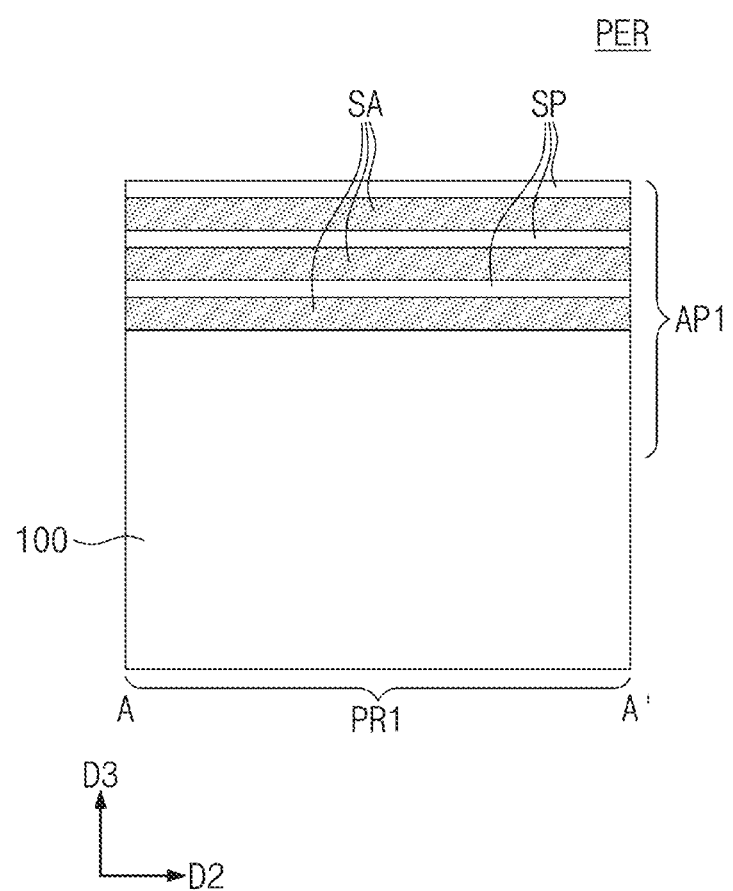
FIGS. 7A, 9A, 11A, 13A, 15A, 17A, 19A, and 21A illustrate cross-sectional views taken along line A-A' of FIGS. 6, 8, 10, 12, 14, 16, 18, and 20, respectively.
Figure 7B:
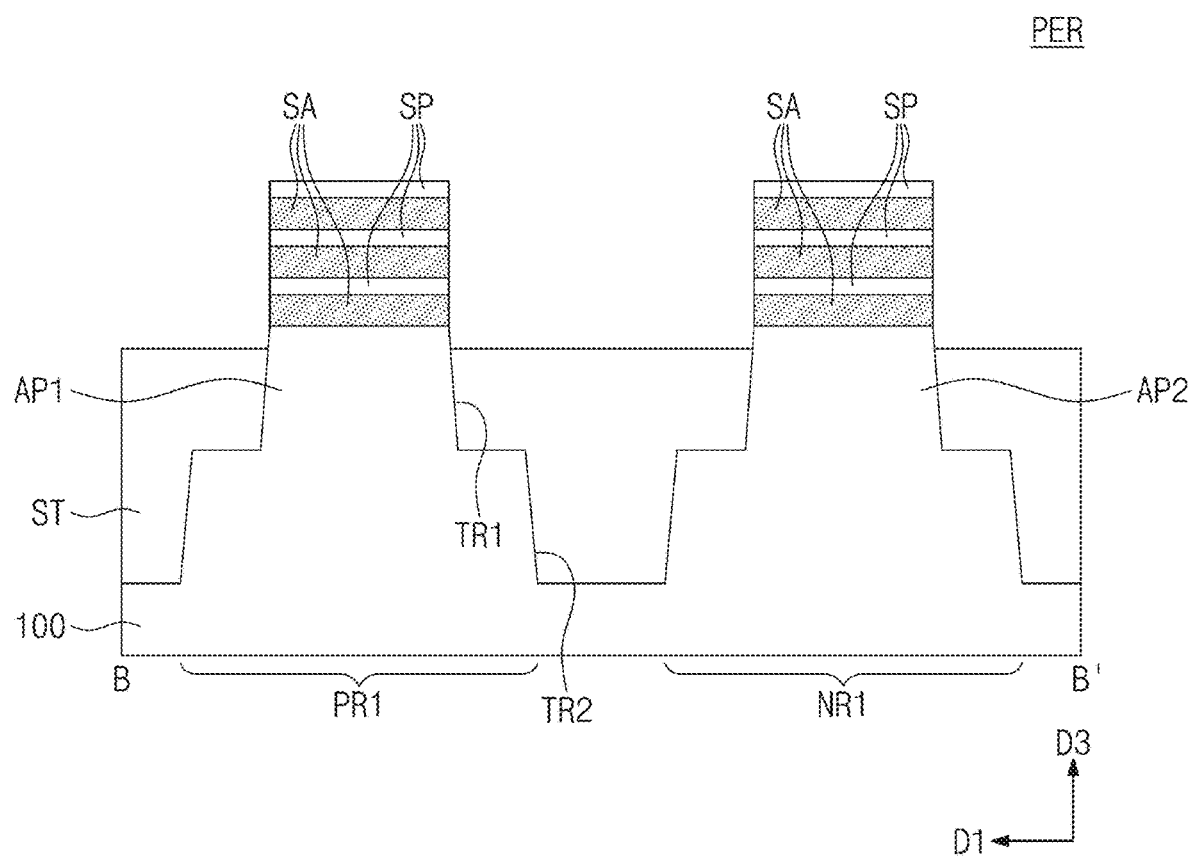
FIGS. 7B, 9B, 11B, 13B, 15B, 17B, 19B, and 21B illustrate cross-sectional views taken along line B-B' of FIGS. 6, 8, 10, 12, 14, 16, 18, and 20, respectively.
Figure 7C:
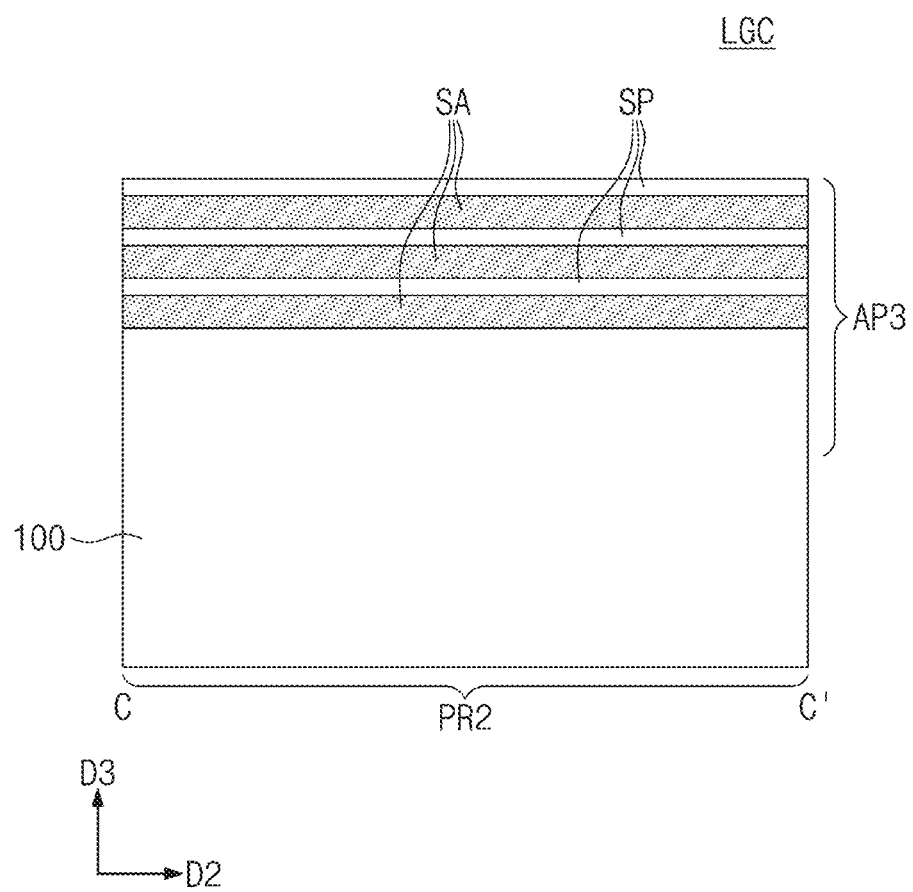
FIGS. 7C, 9C, 11C, 13C, 15C, 17C, 19C, and 21C illustrate cross-sectional views taken along line C-C' of FIGS. 6, 8, 10, 12, 14, 16, 18, and 20, respectively.
Figure 7D:
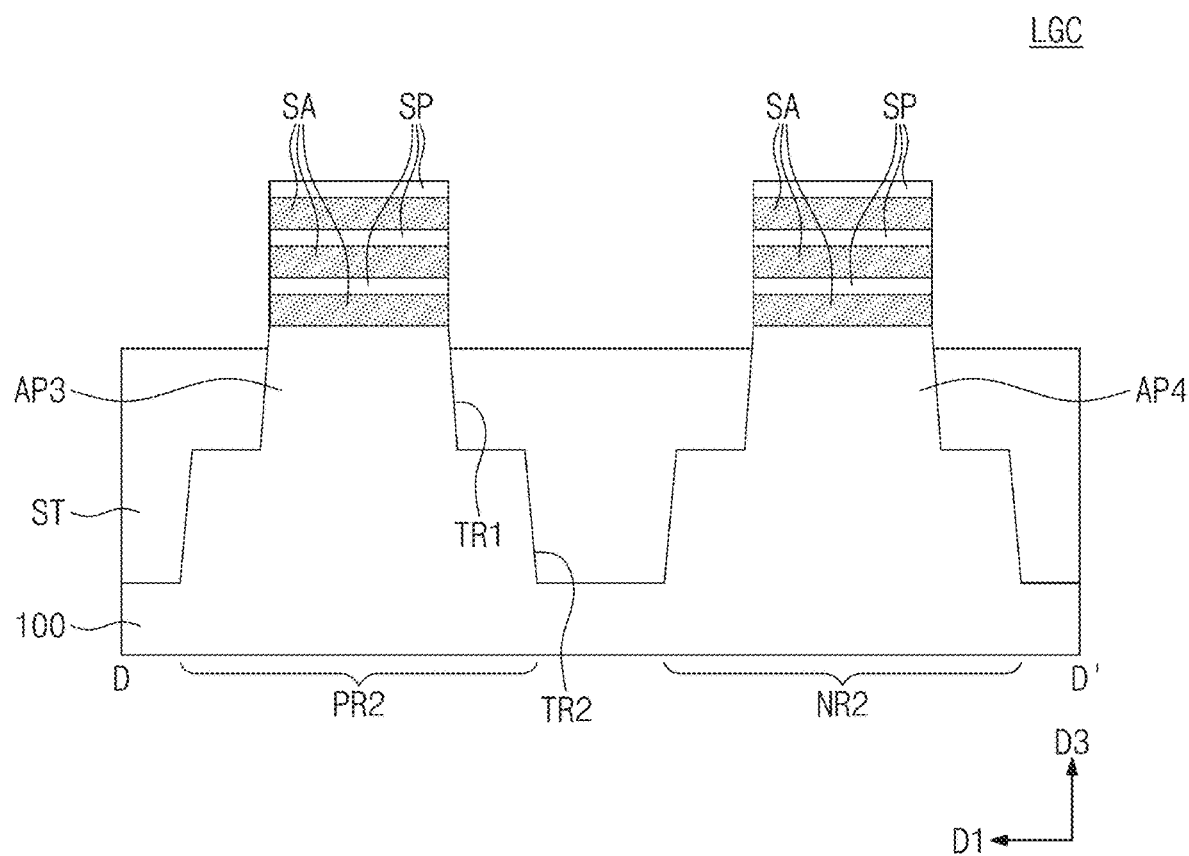
FIGS. 7D, 9D, 11D, 13D, 15D, 17D, 19D, and 21D illustrate cross-sectional views taken along line D-D' of FIGS. 6, 8, 10, 12, 14, 16, 18, and 20, respectively.
Figure 9A:
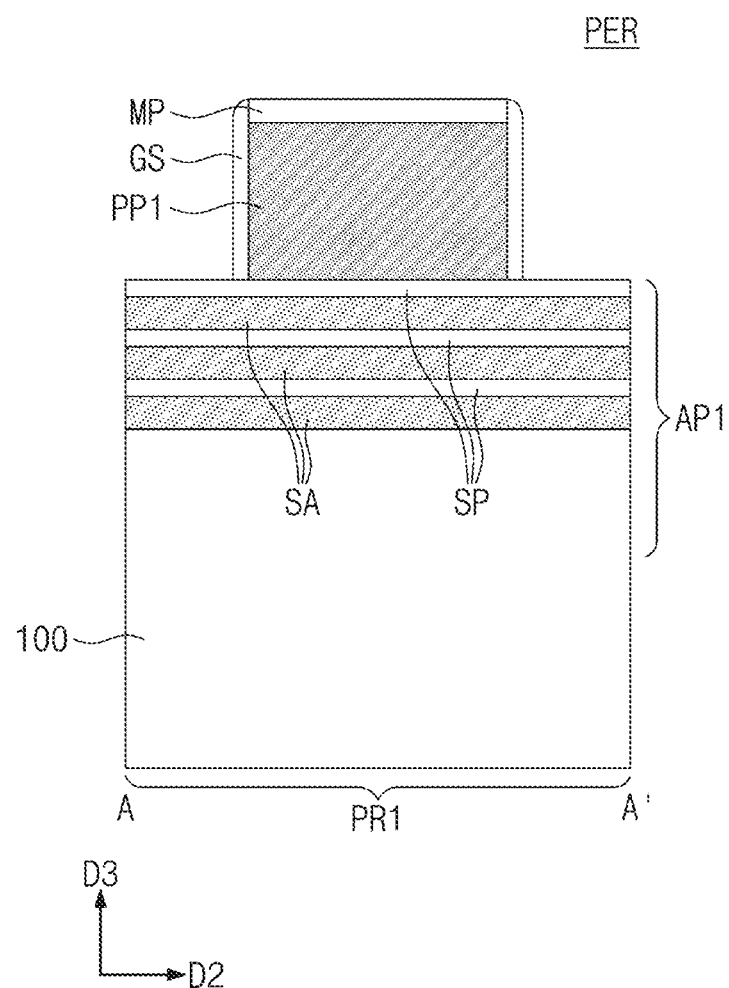
Figure 9B:
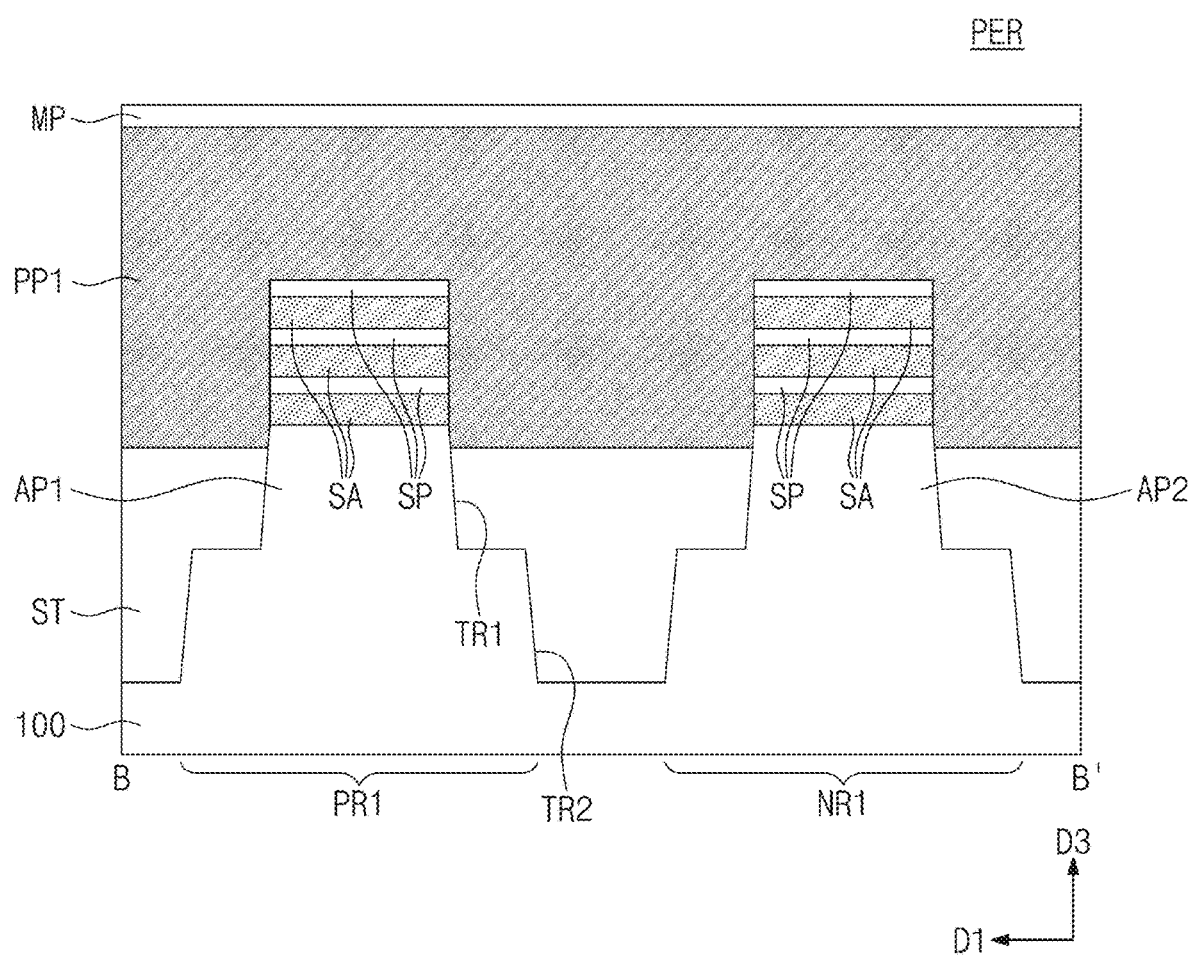
Figure 9C:
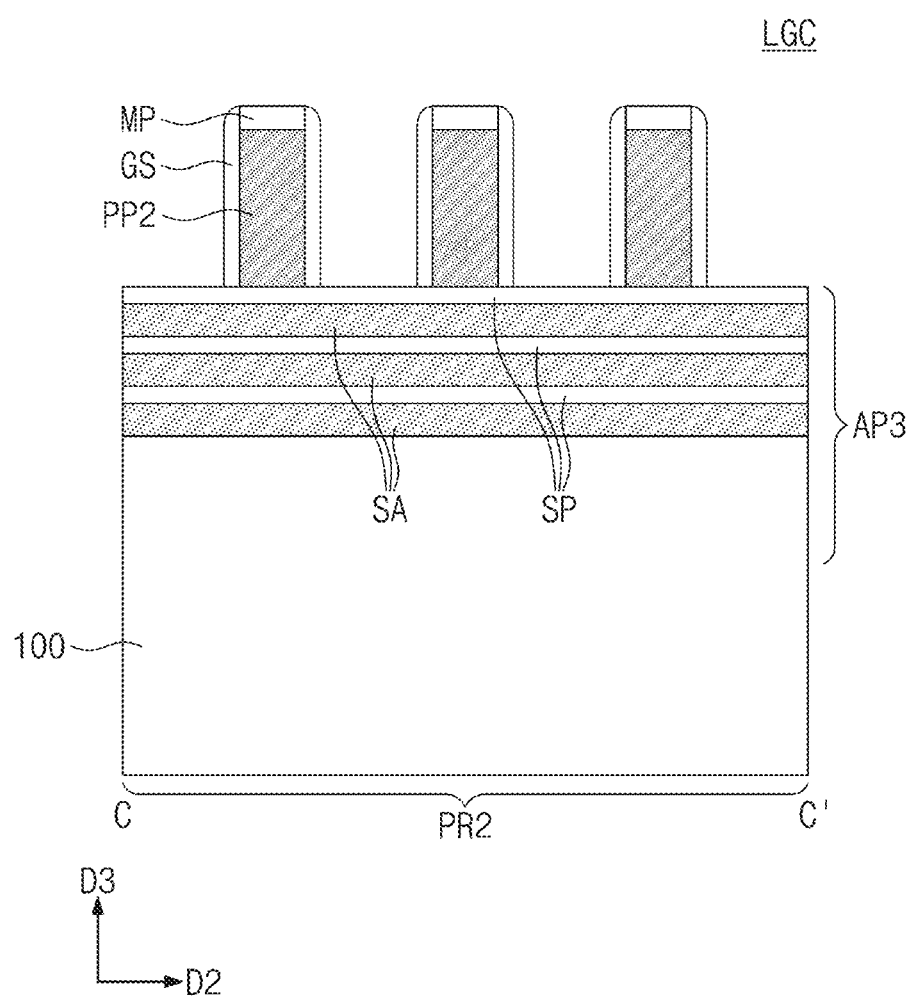
Figure 9D:
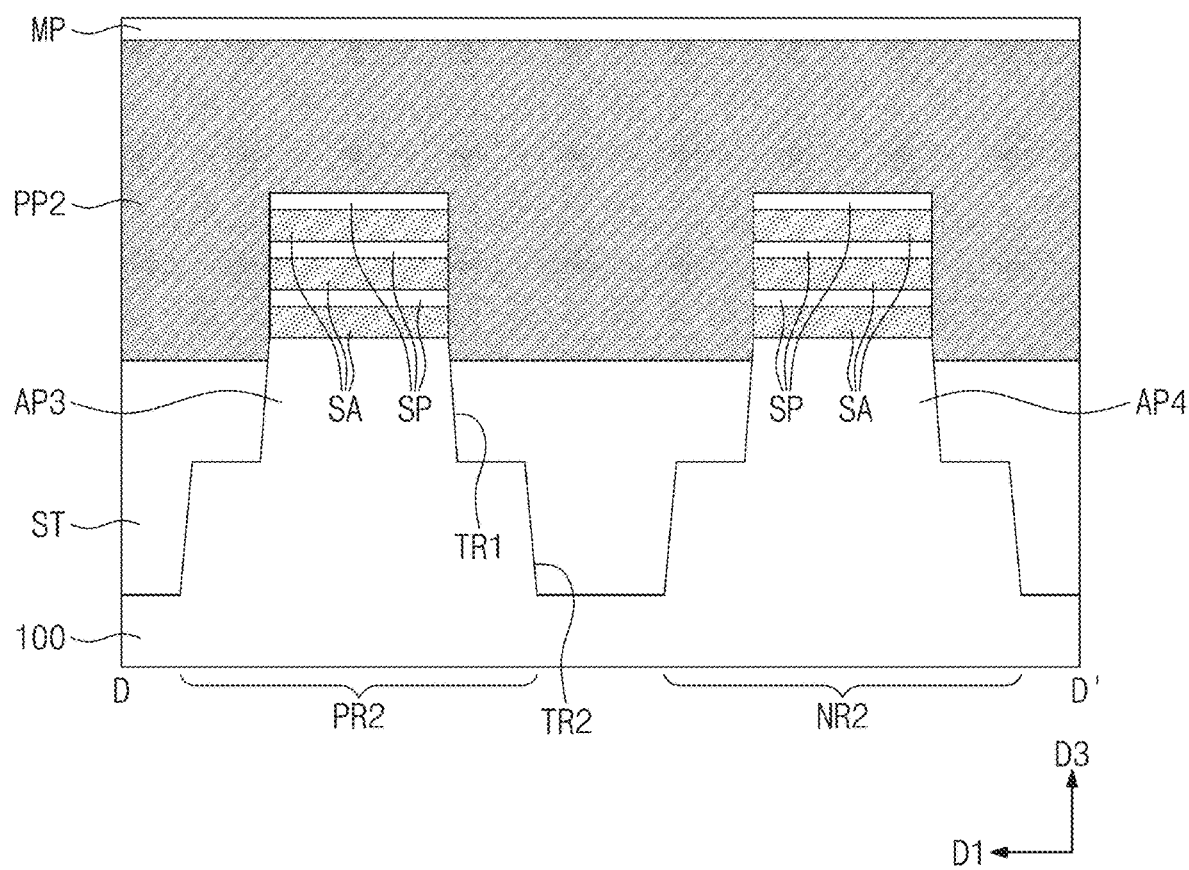
Figure 10:
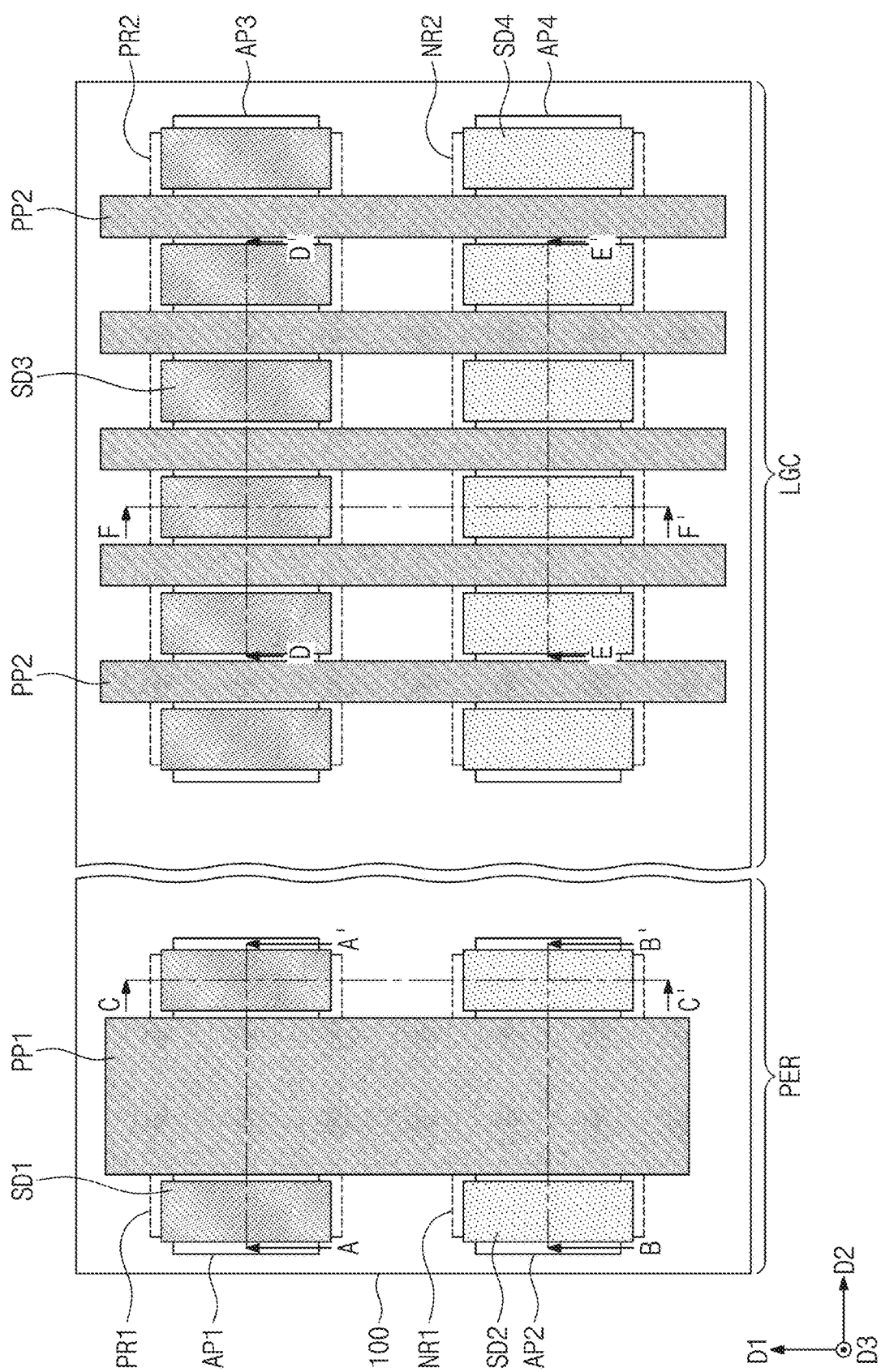
Figure 11A:
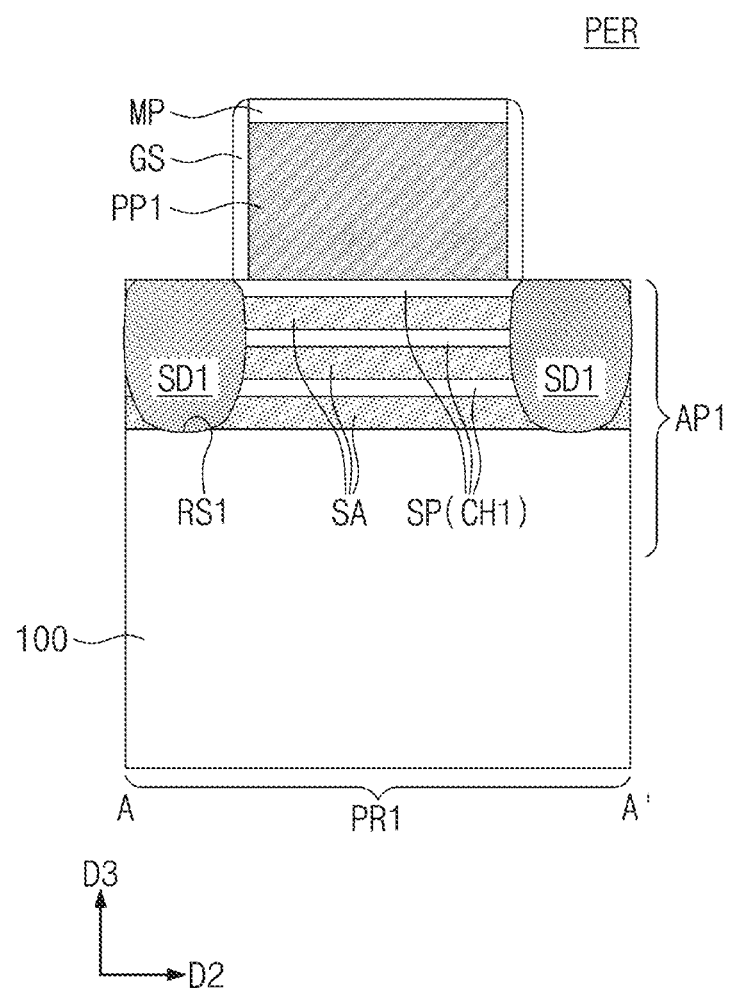
Figure 11B:
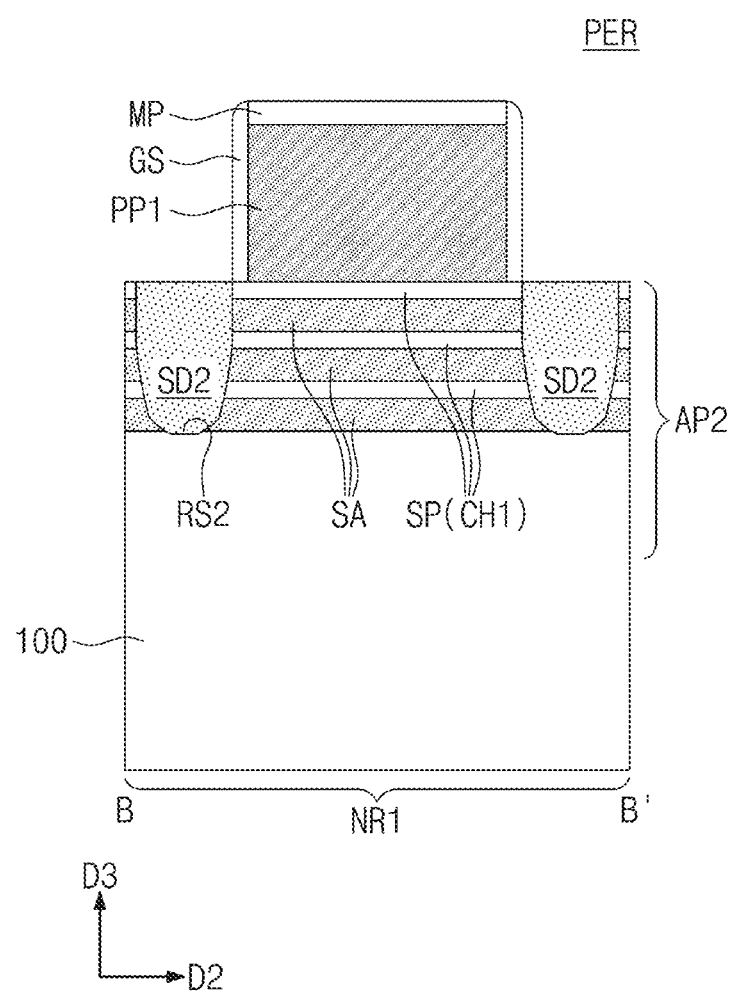
Figure 11C:
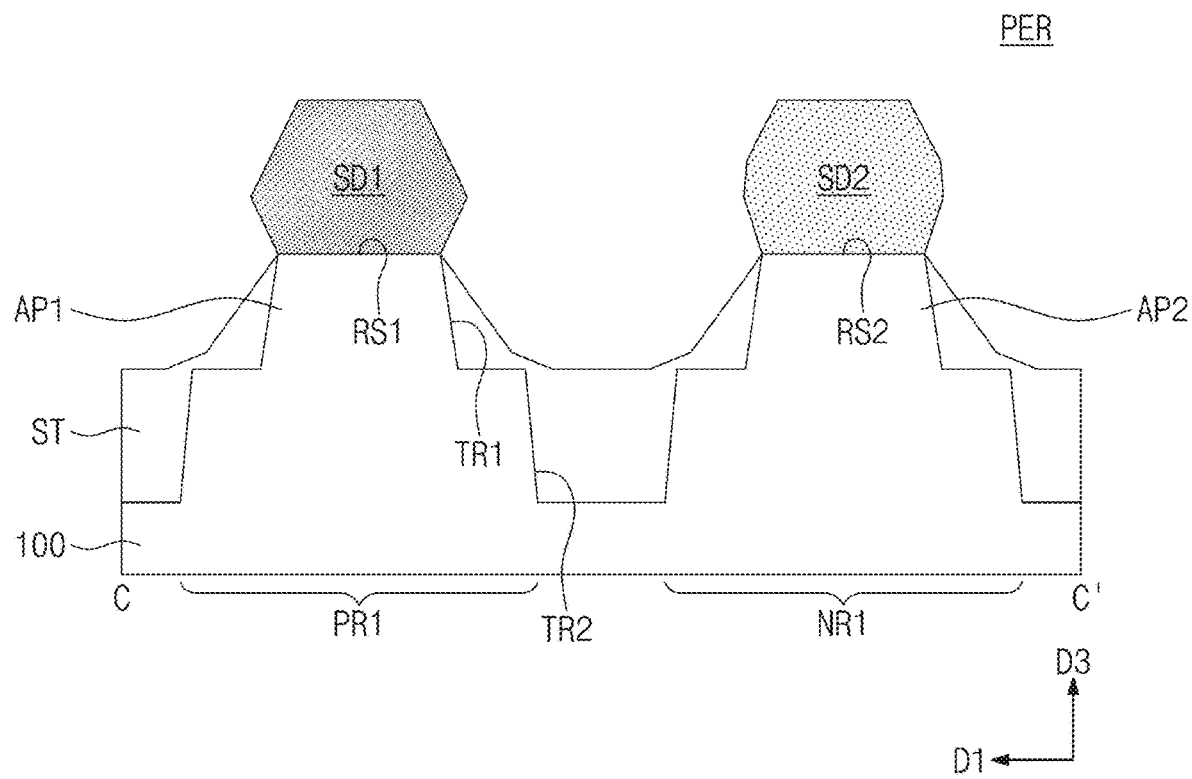
Figure 11D:
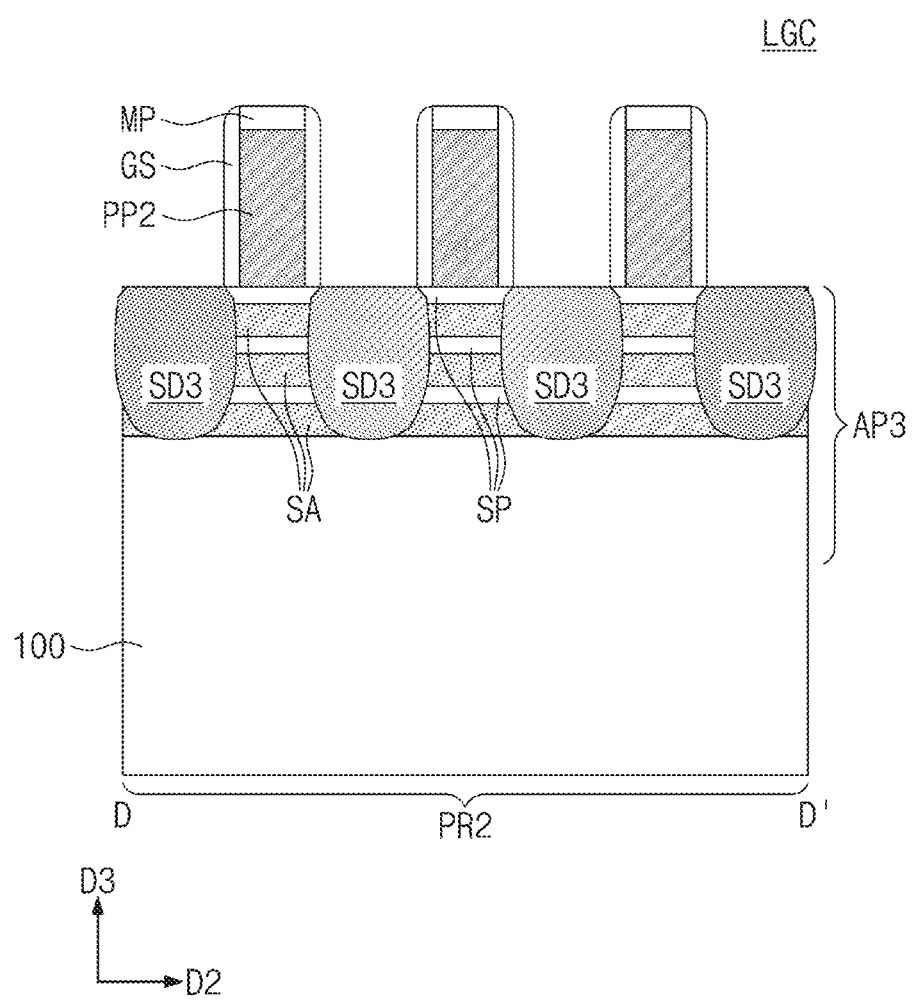
Figure 11E:
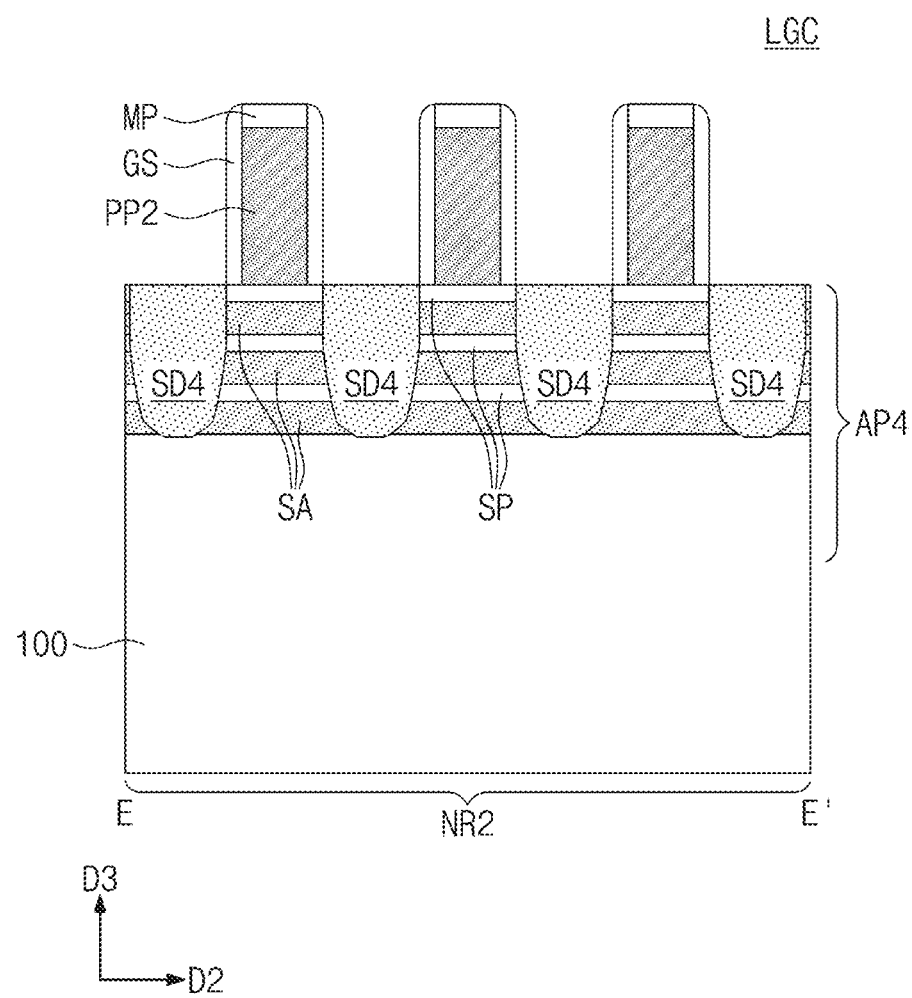
FIGS. 11E, 13E, 15E, 17E, 19E, and 21E illustrate cross-sectional views taken along line E-E' of FIGS. 10, 12, 14, 16, 18, and 20, respectively.
Figure 11F:
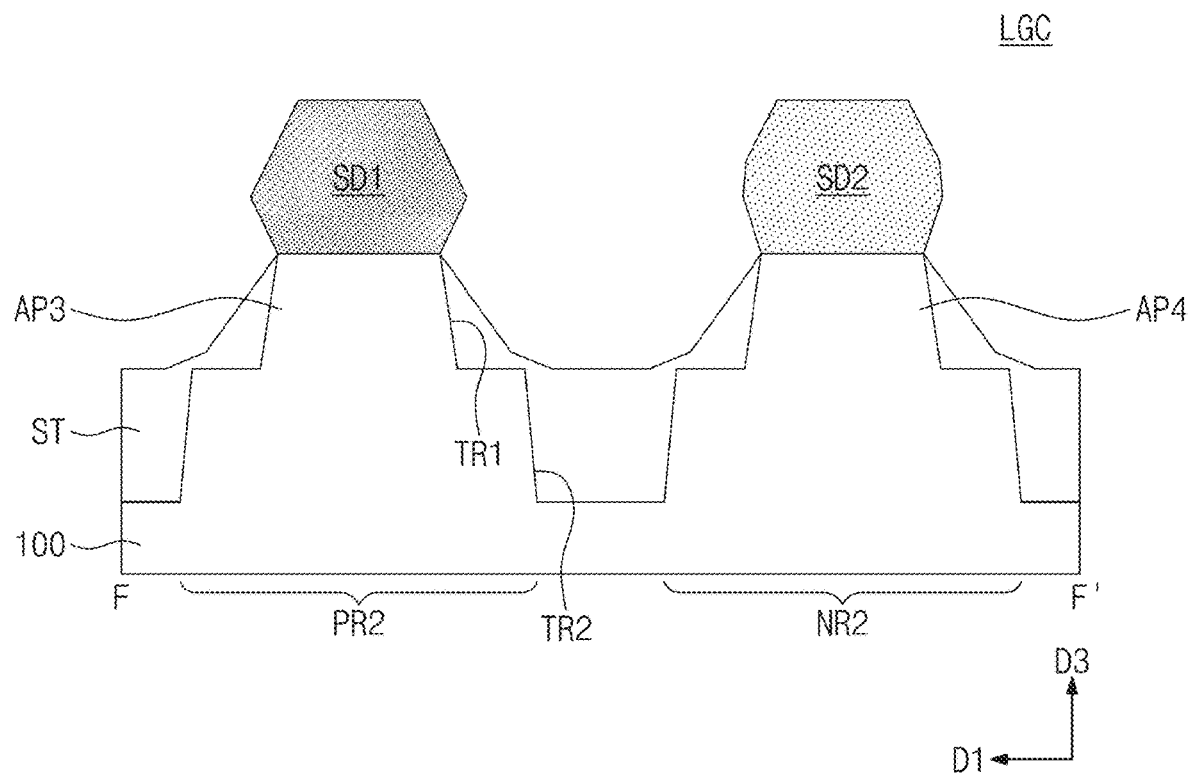
FIGS. 11F, 13F, 15F, 17F, 19F, and 21F illustrate cross-sectional views taken along line F-F' of FIGS. 10, 12, 14, 16, 18, and 20, respectively.
Figure 13A:
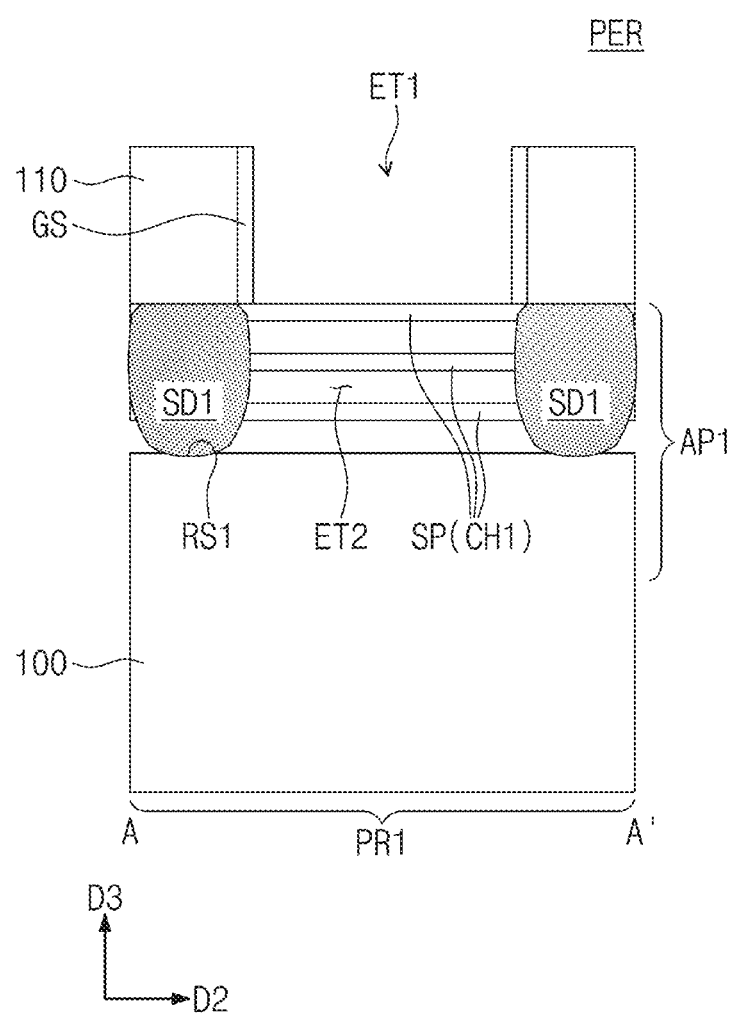
Figure 13B:
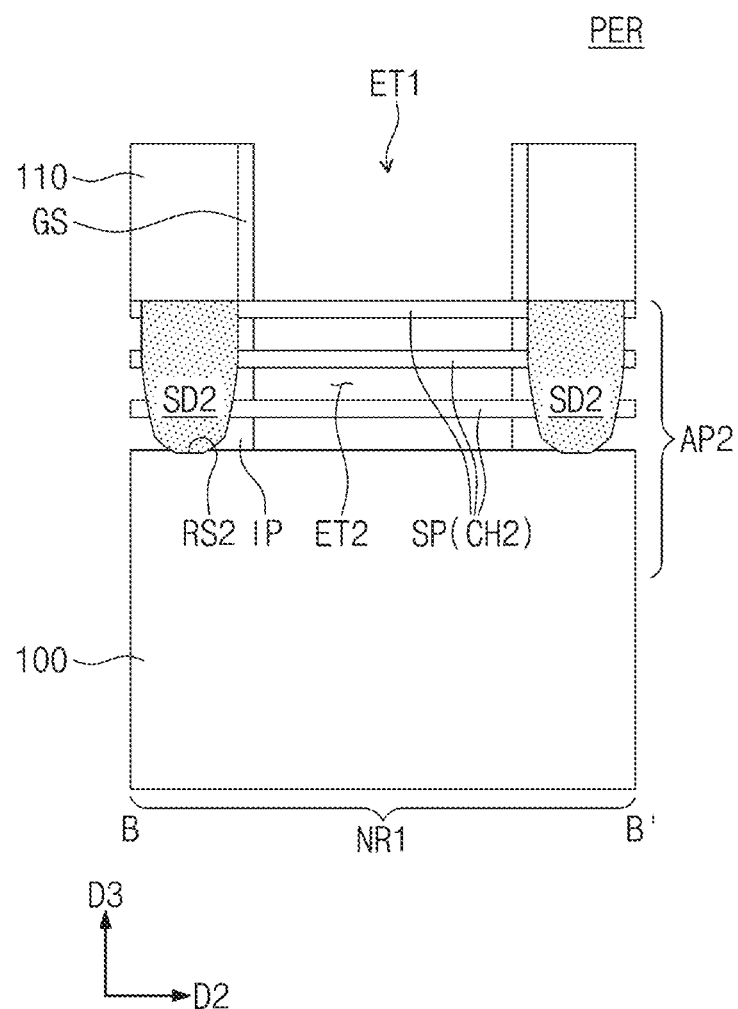
Figure 13C:
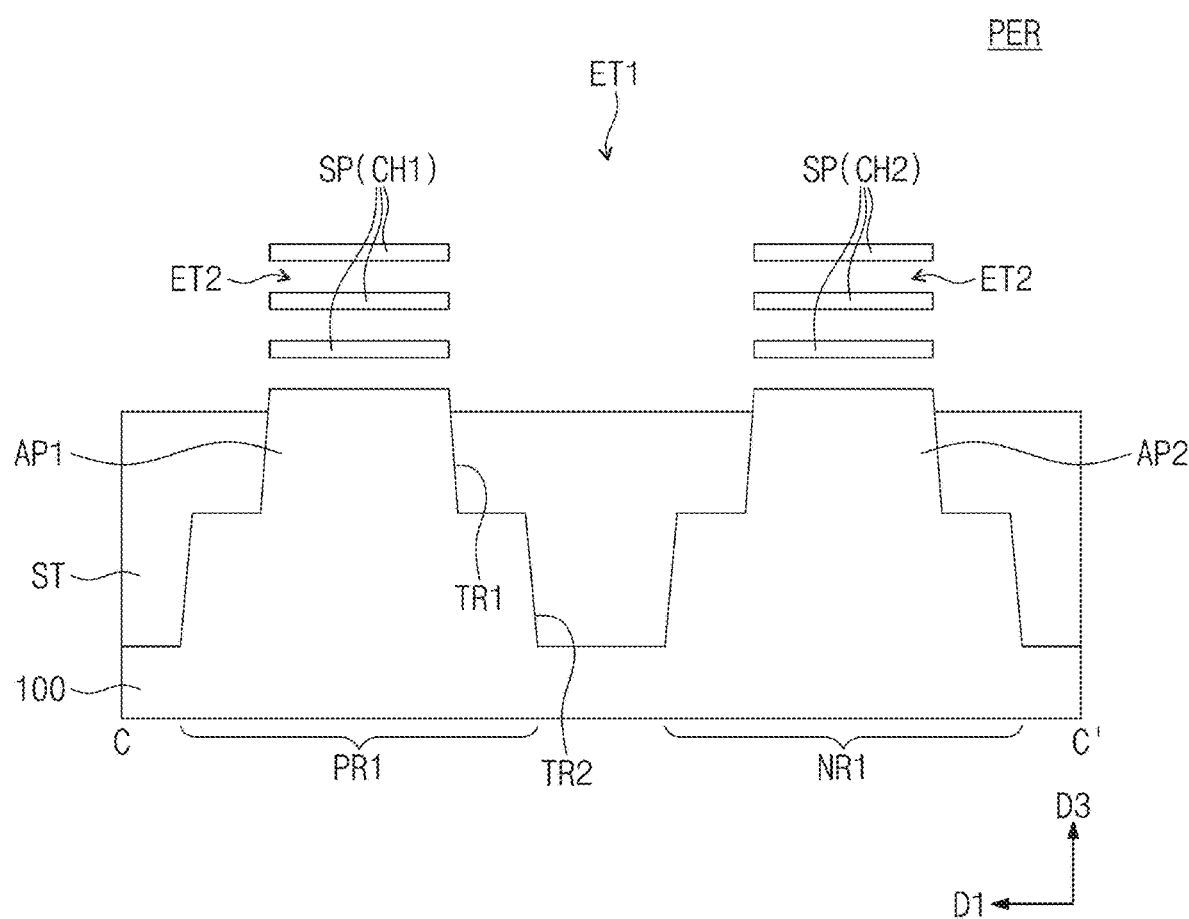
Figure 13D:
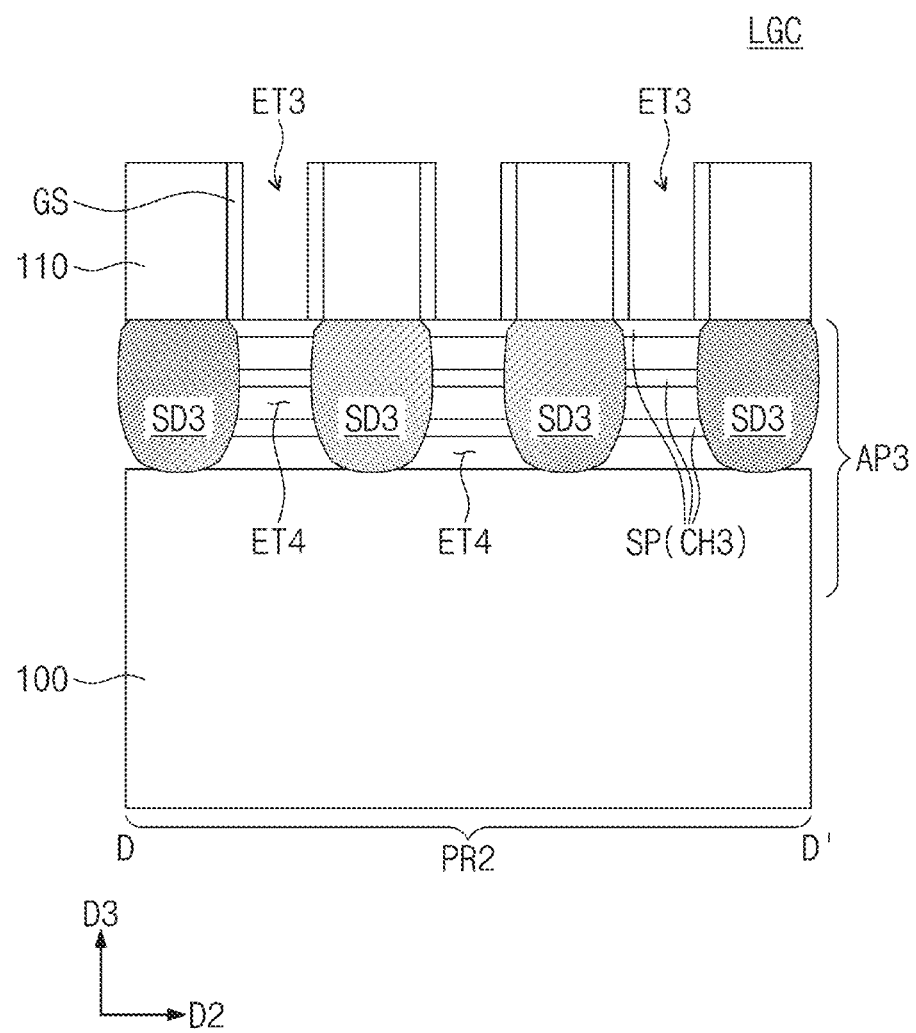
Figure 13E:
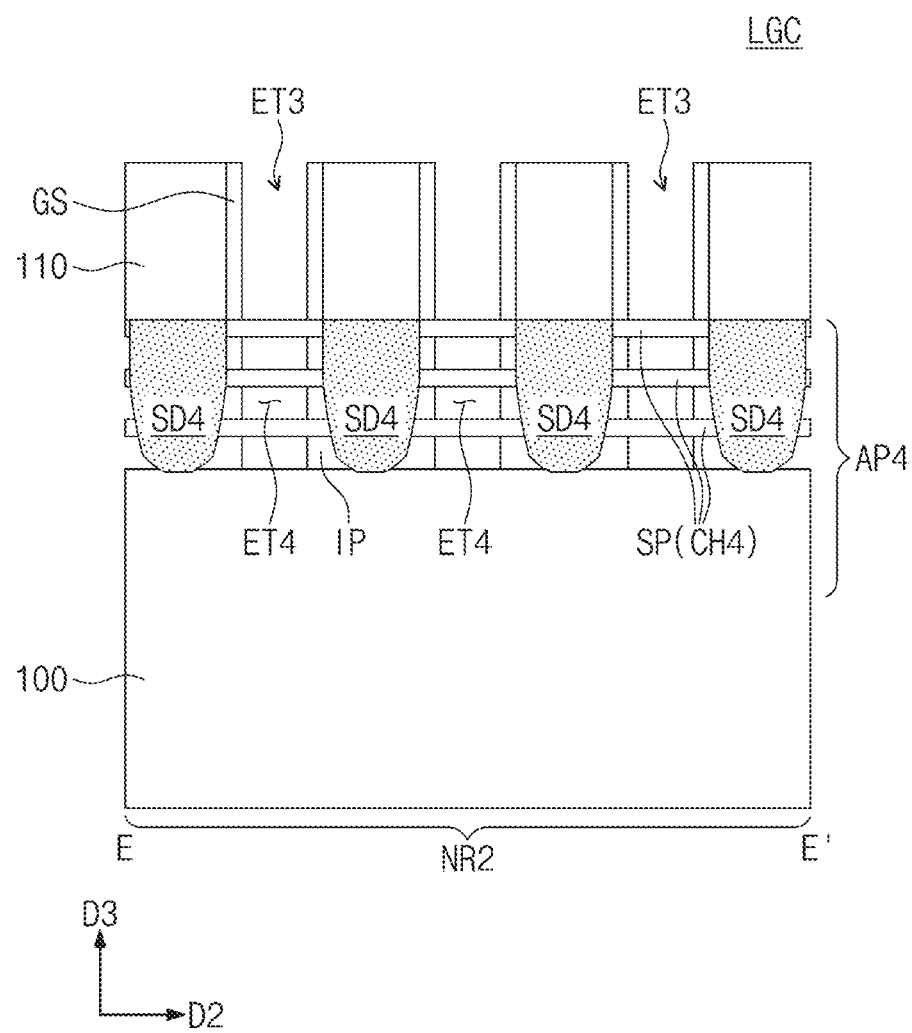
Figure 13F:
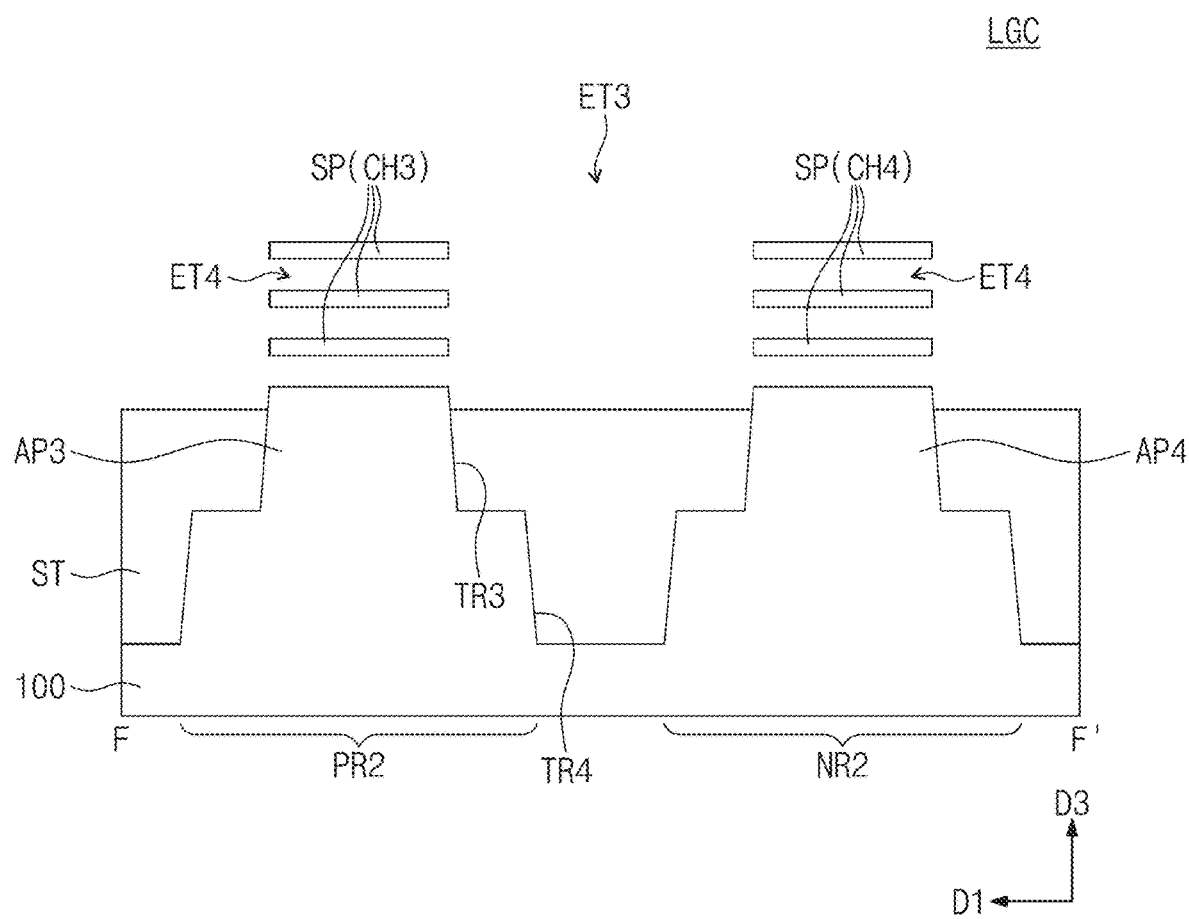
Figure 15A:
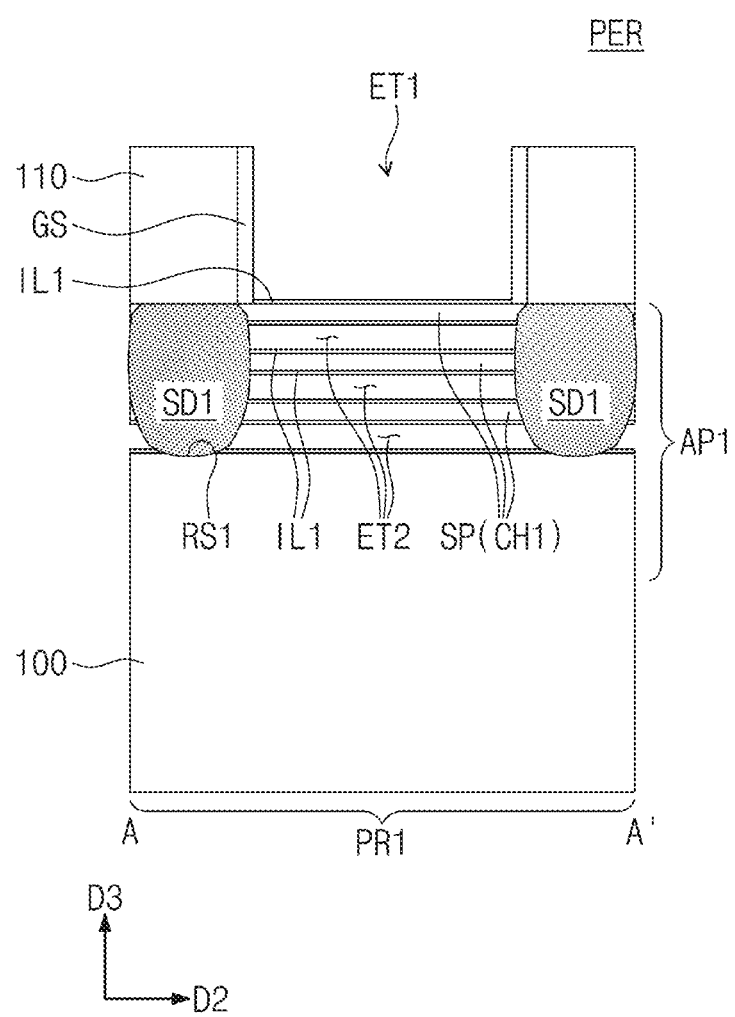
Figure 15B:
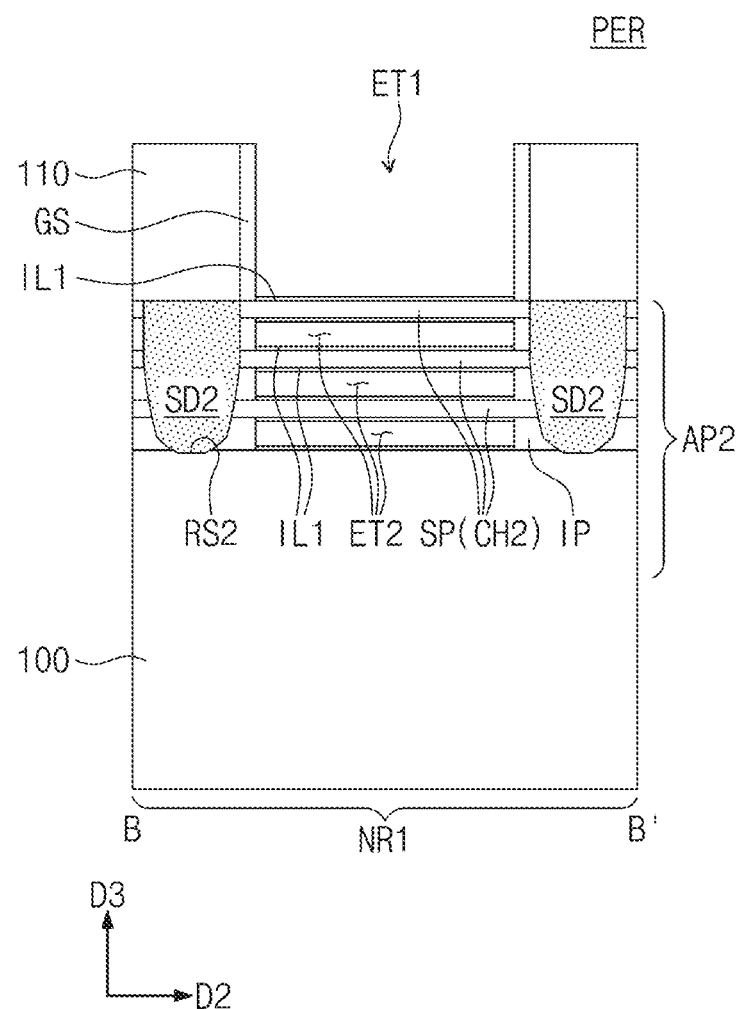
Figure 15C:
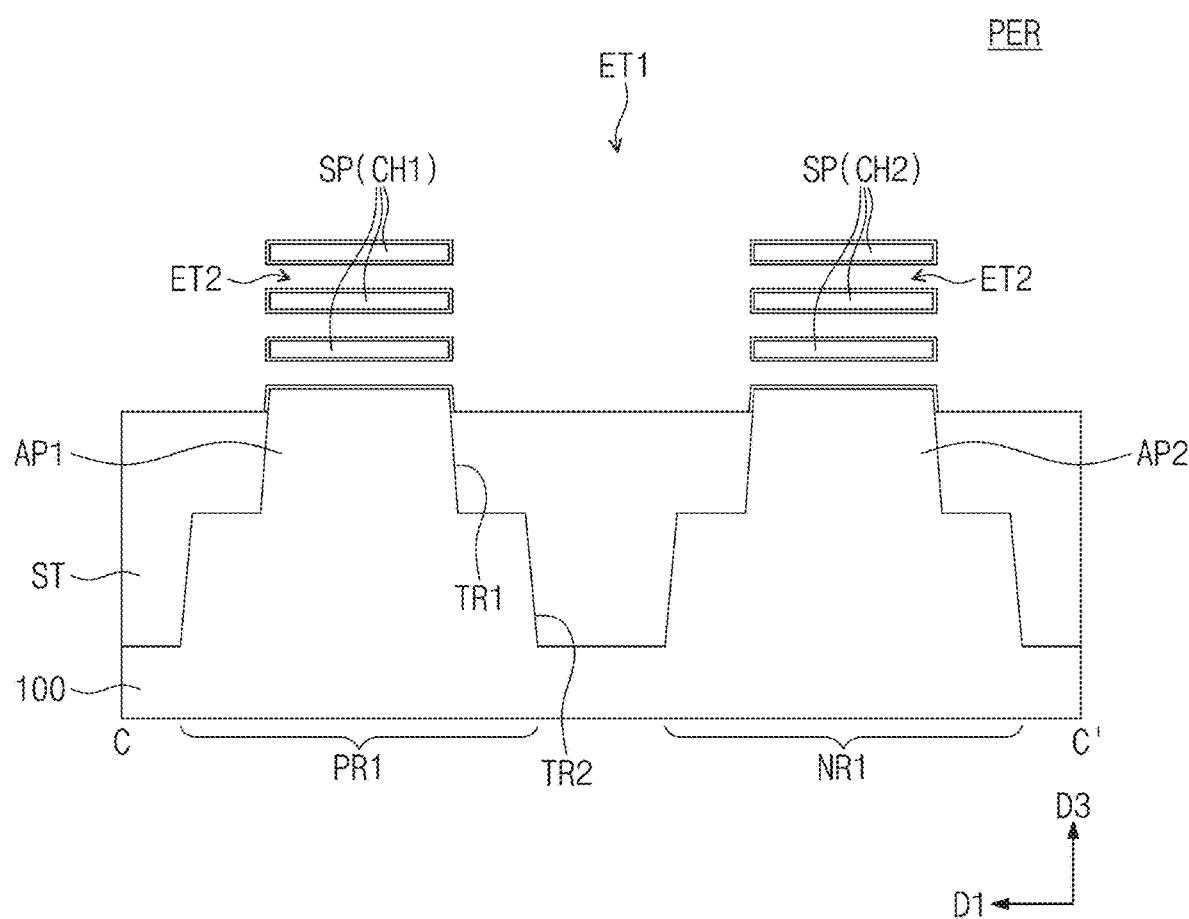
Figure 15D:
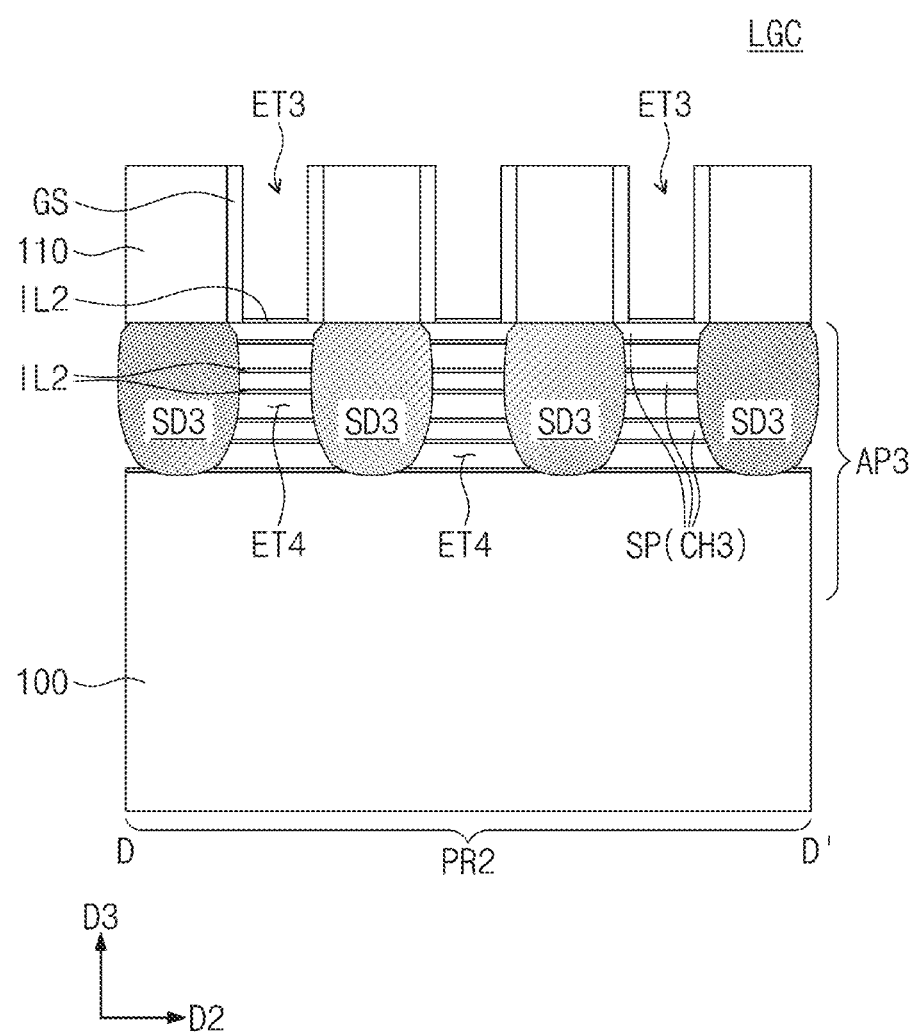
Figure 15E:
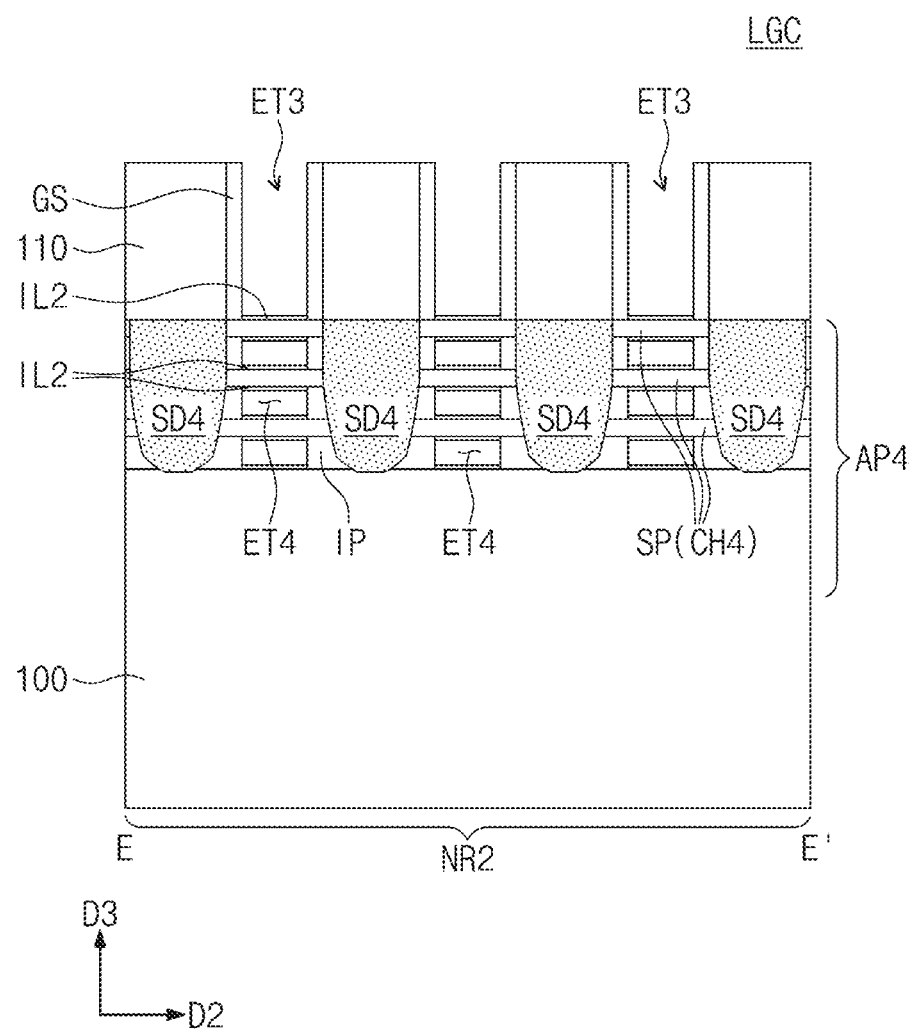
Figure 15F:
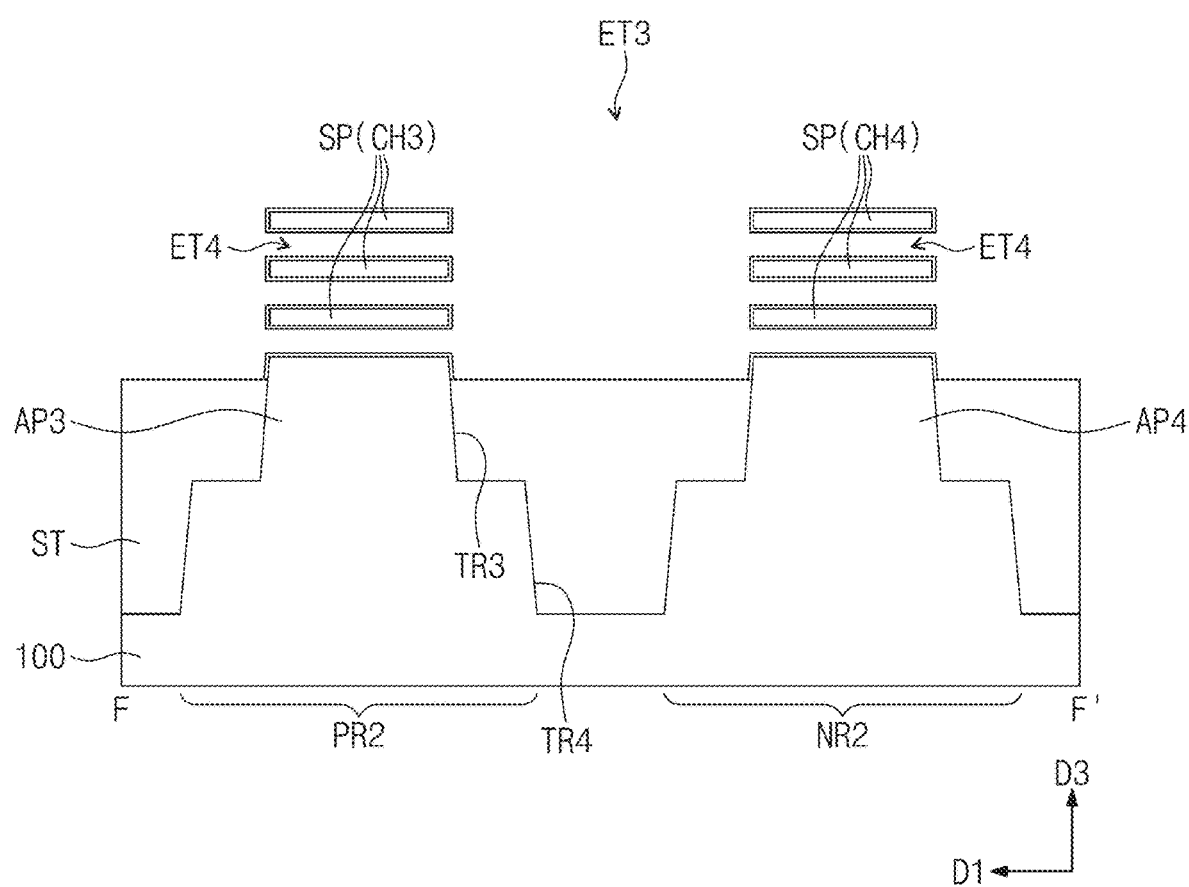
Figure 16:
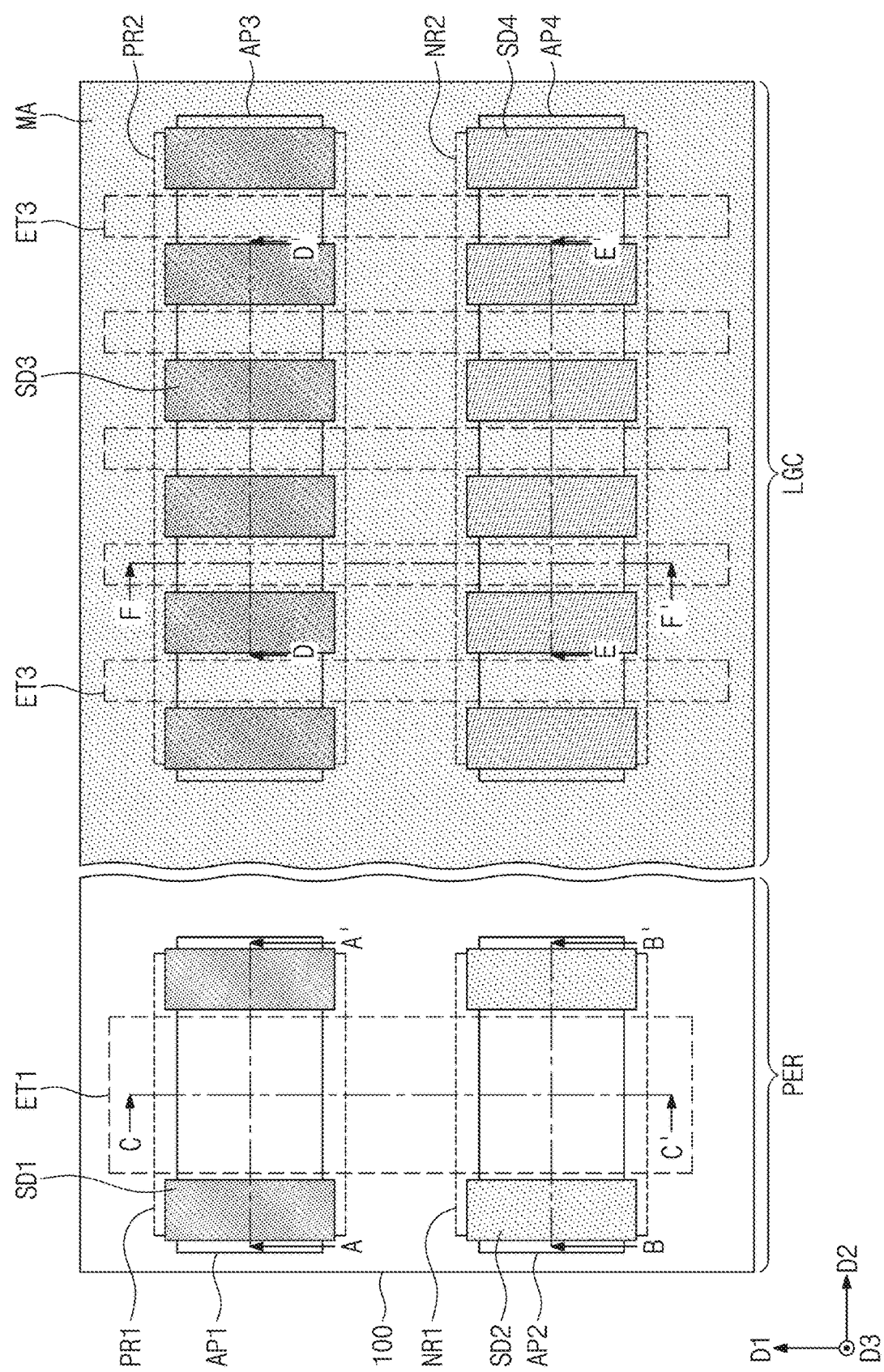
Figure 17A:
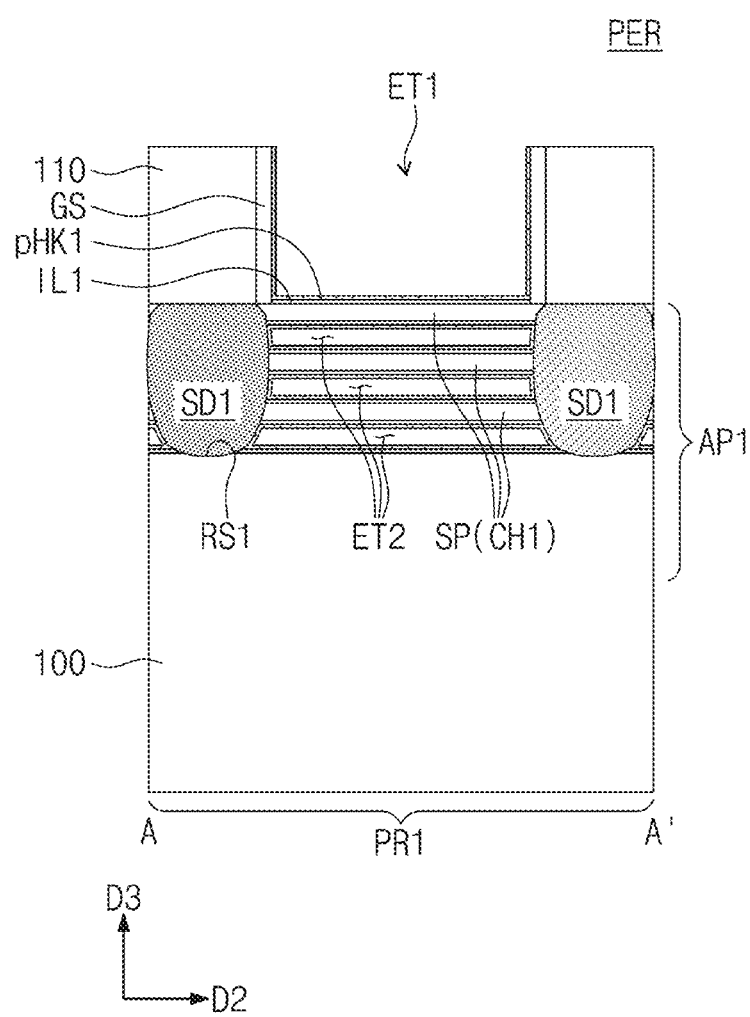
Figure 17B:
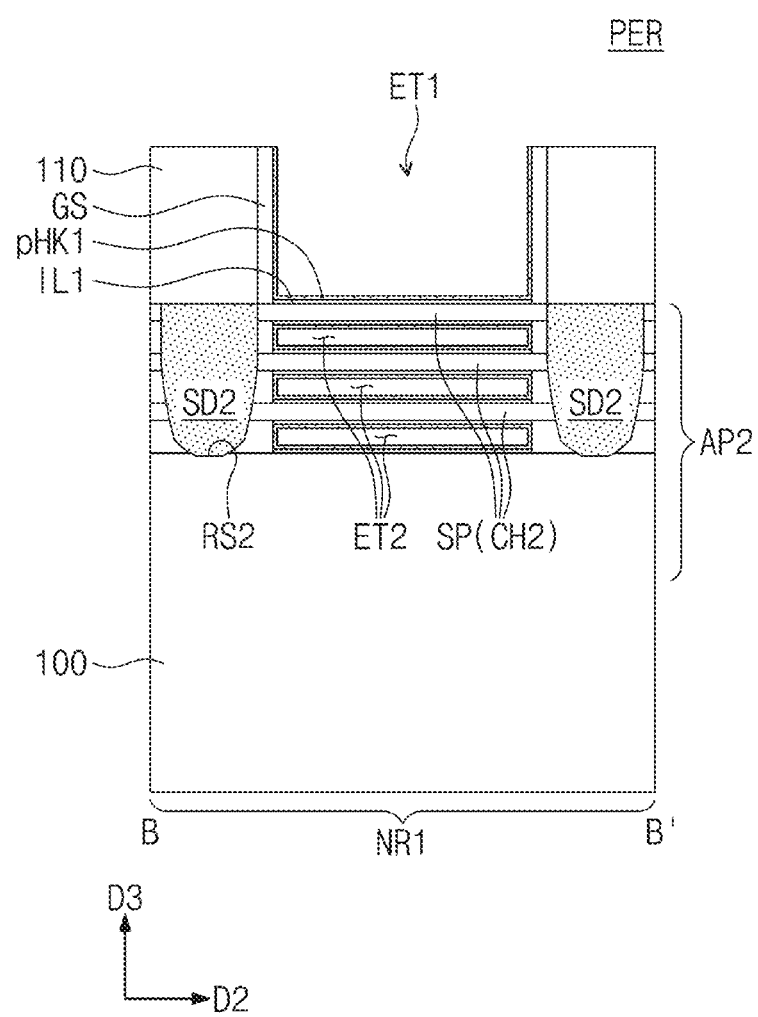
Figure 17C:
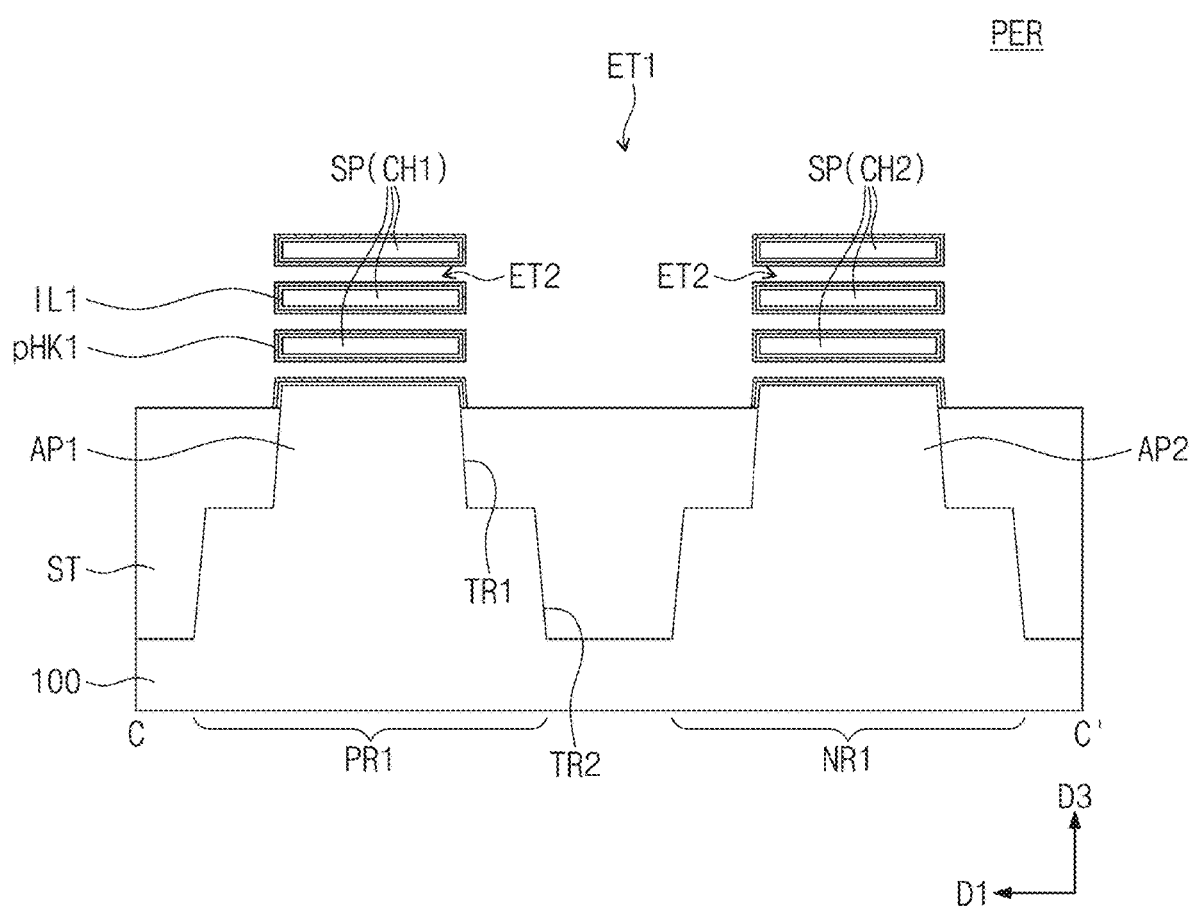
Figure 17D:
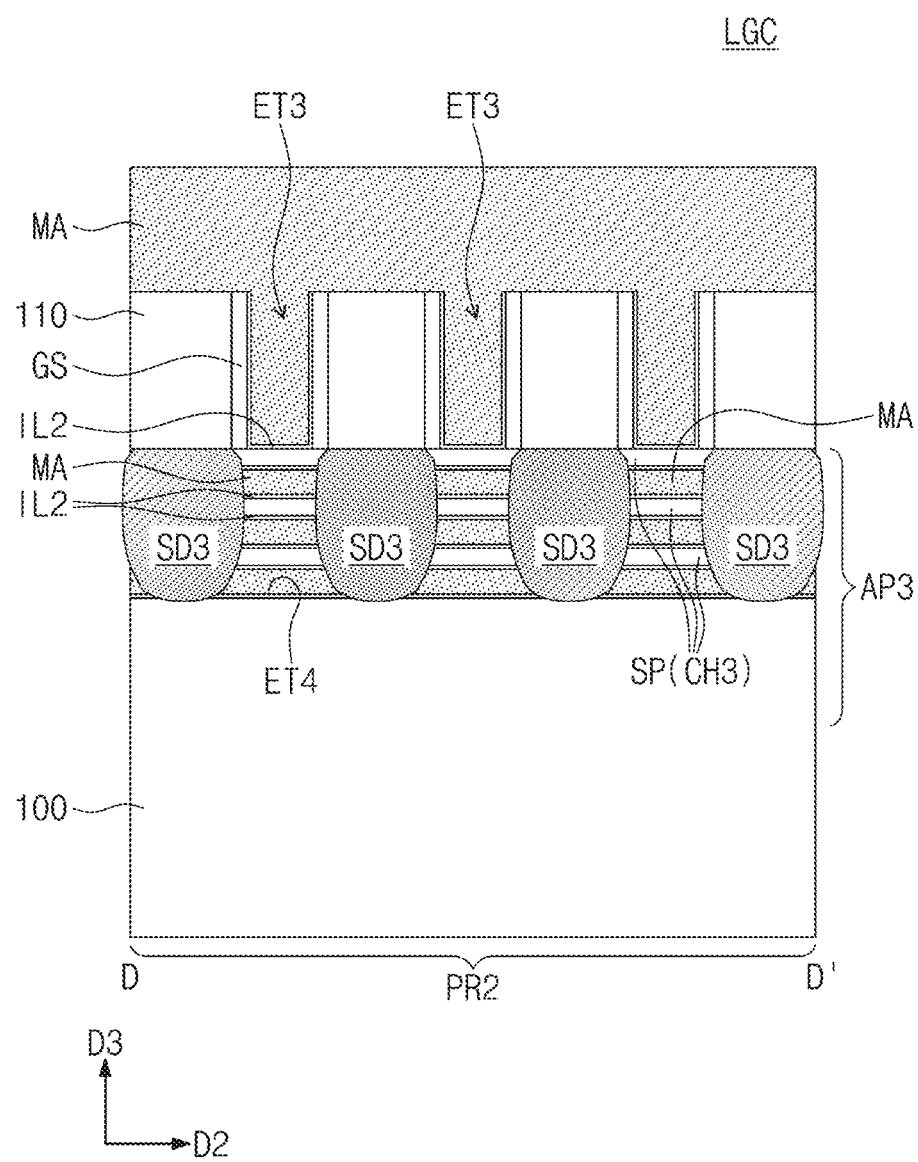
Figure 17E:
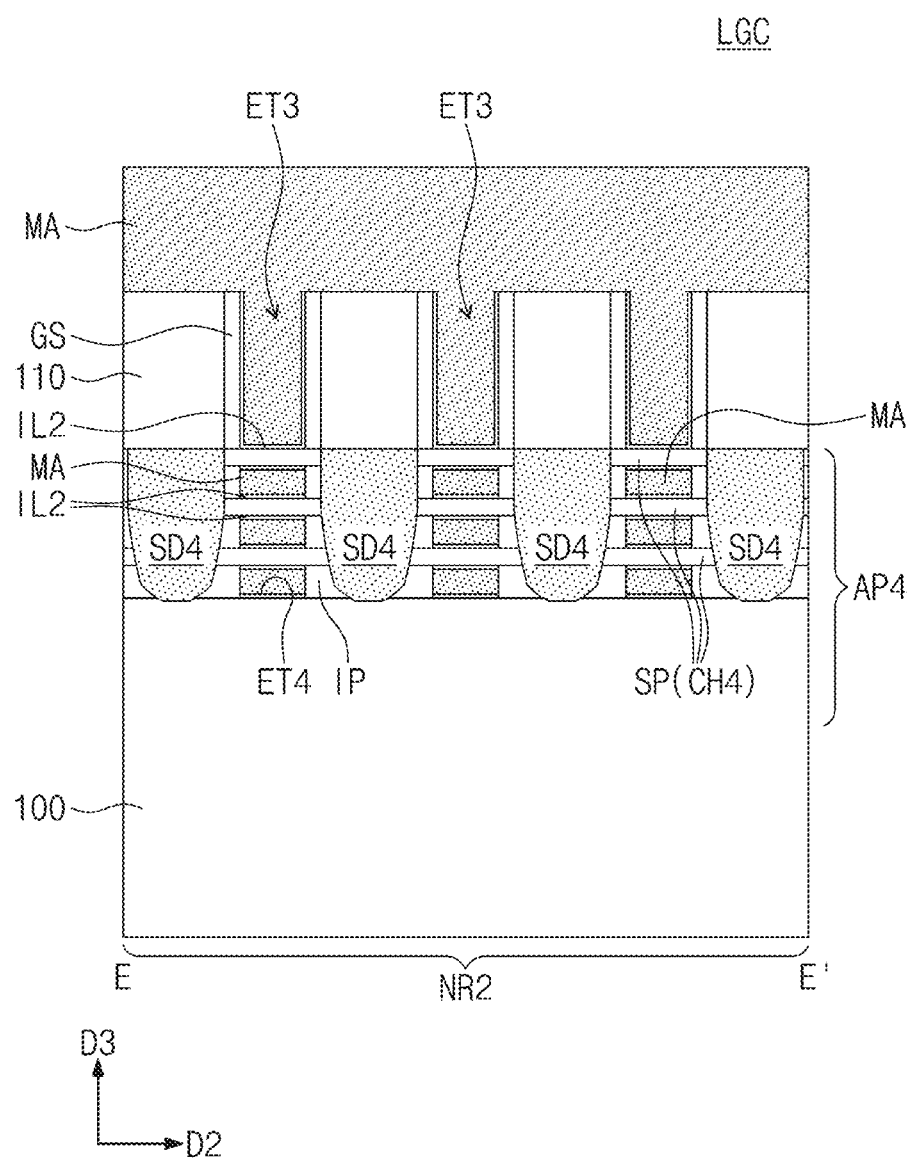
Figure 17F:
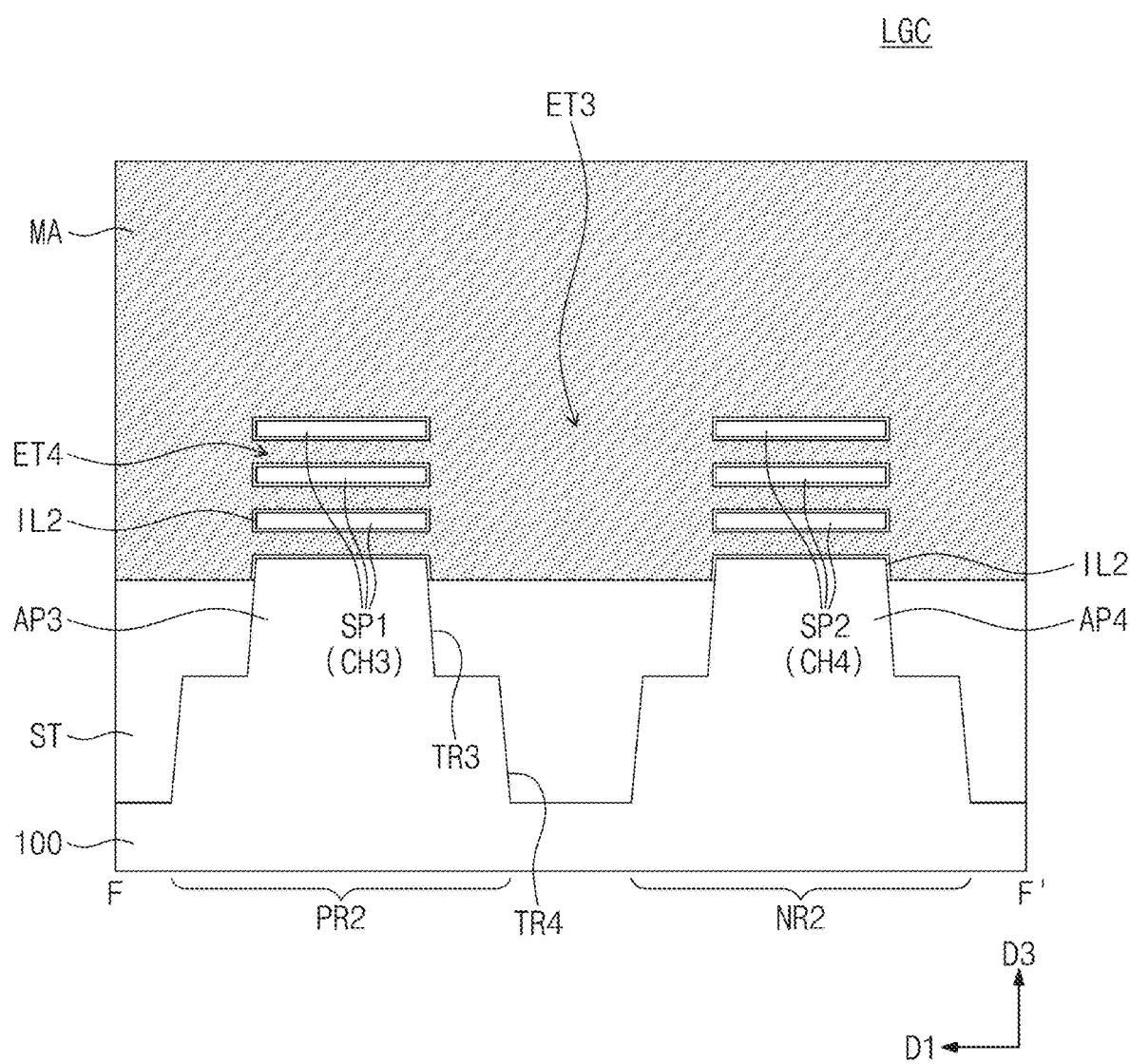
Figure 18:
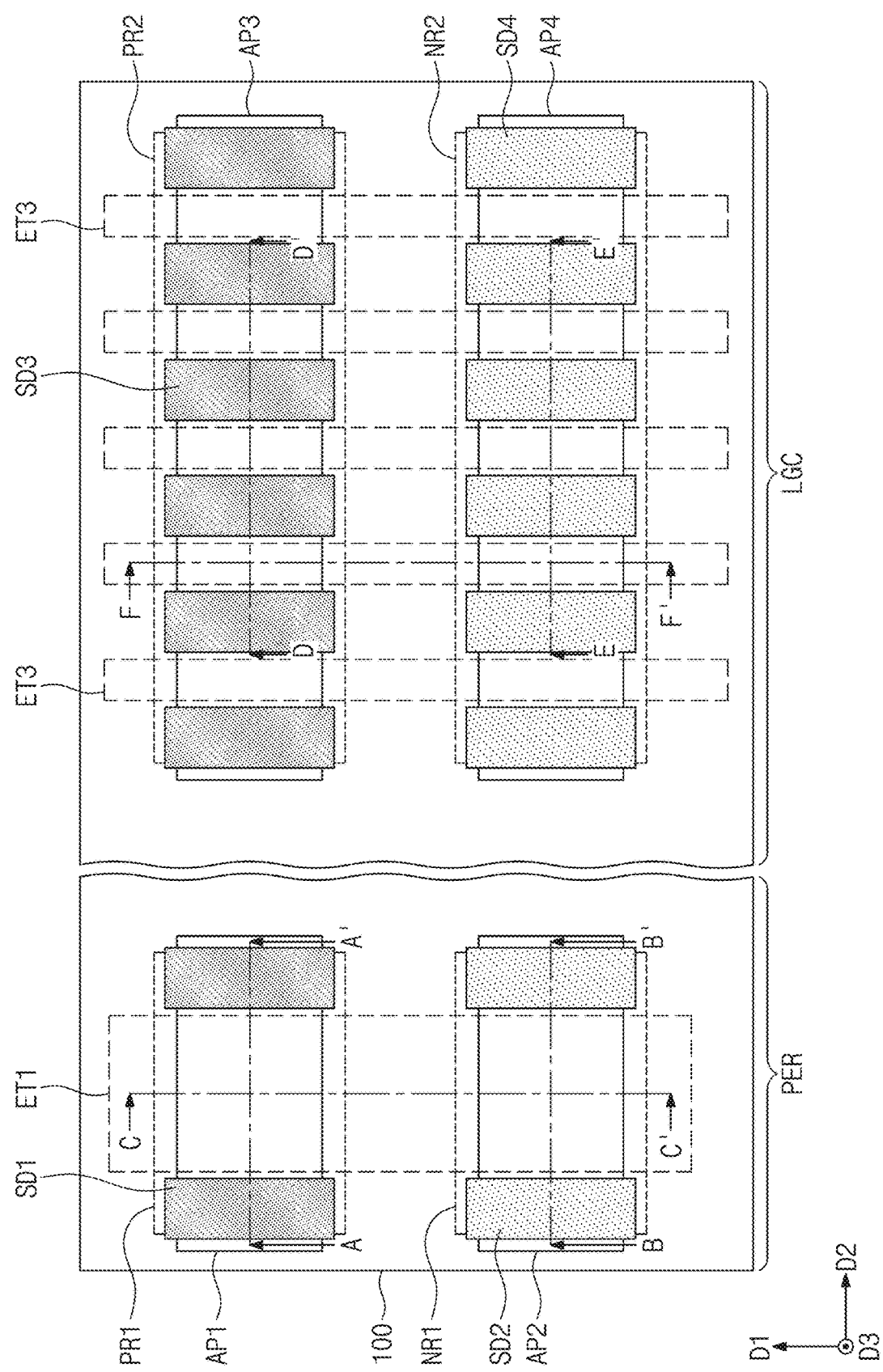
Figure 19A:
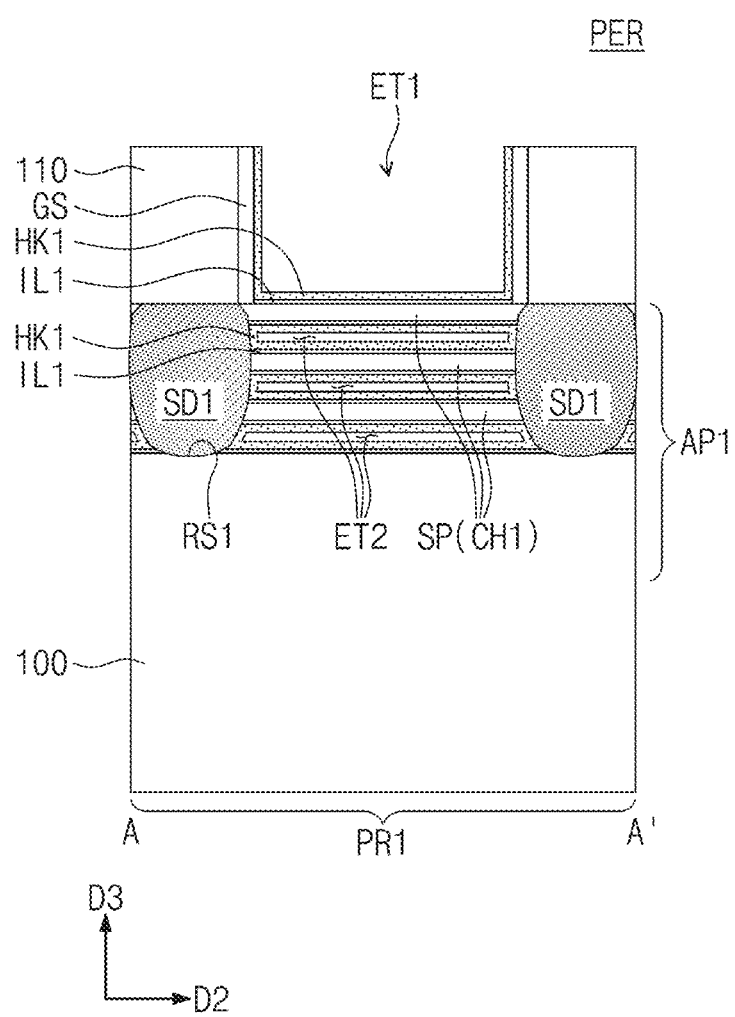
Figure 19B:
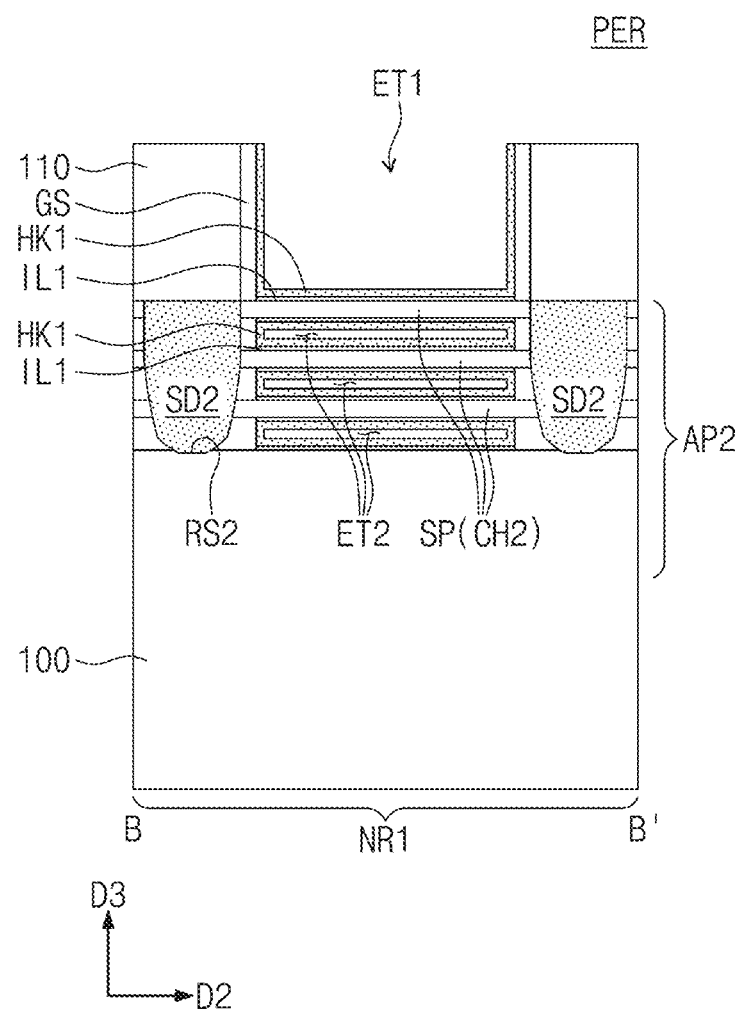
Figure 19C:
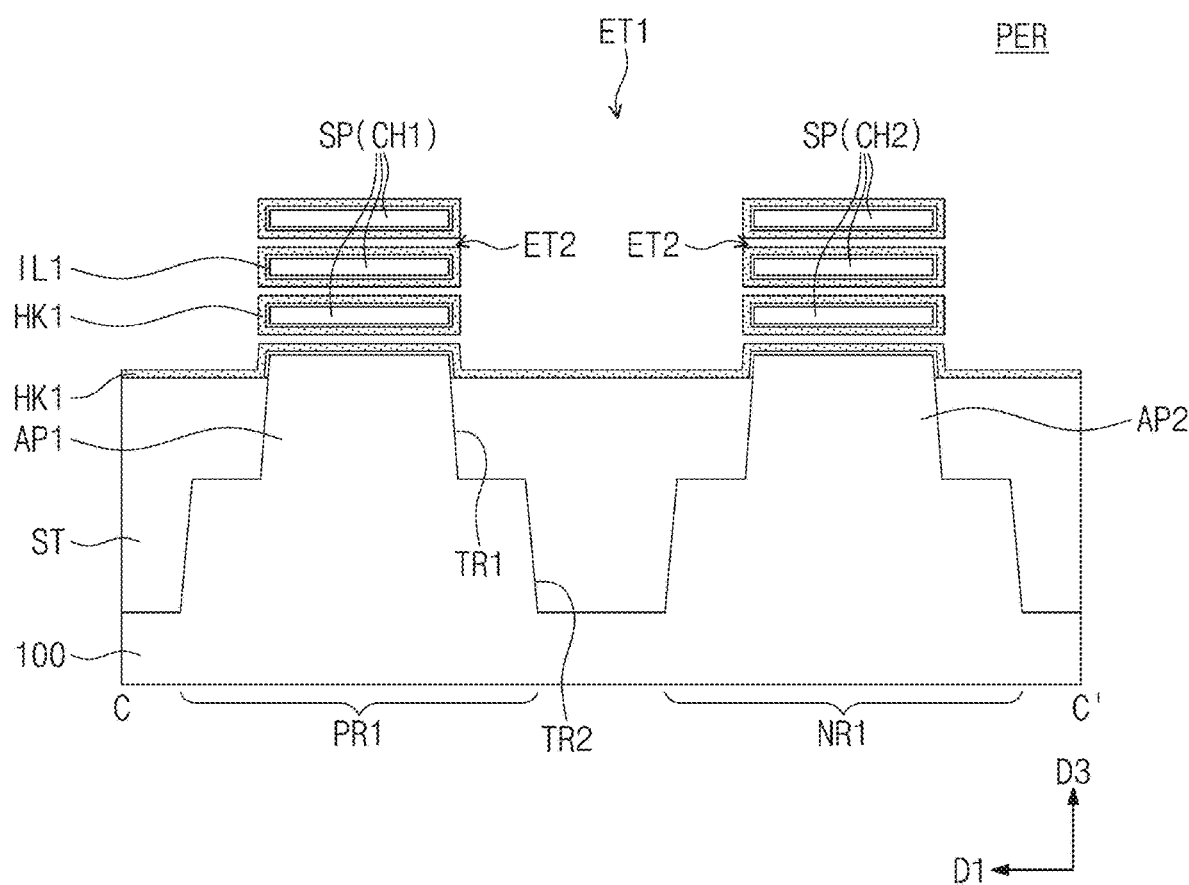
Figure 19D:
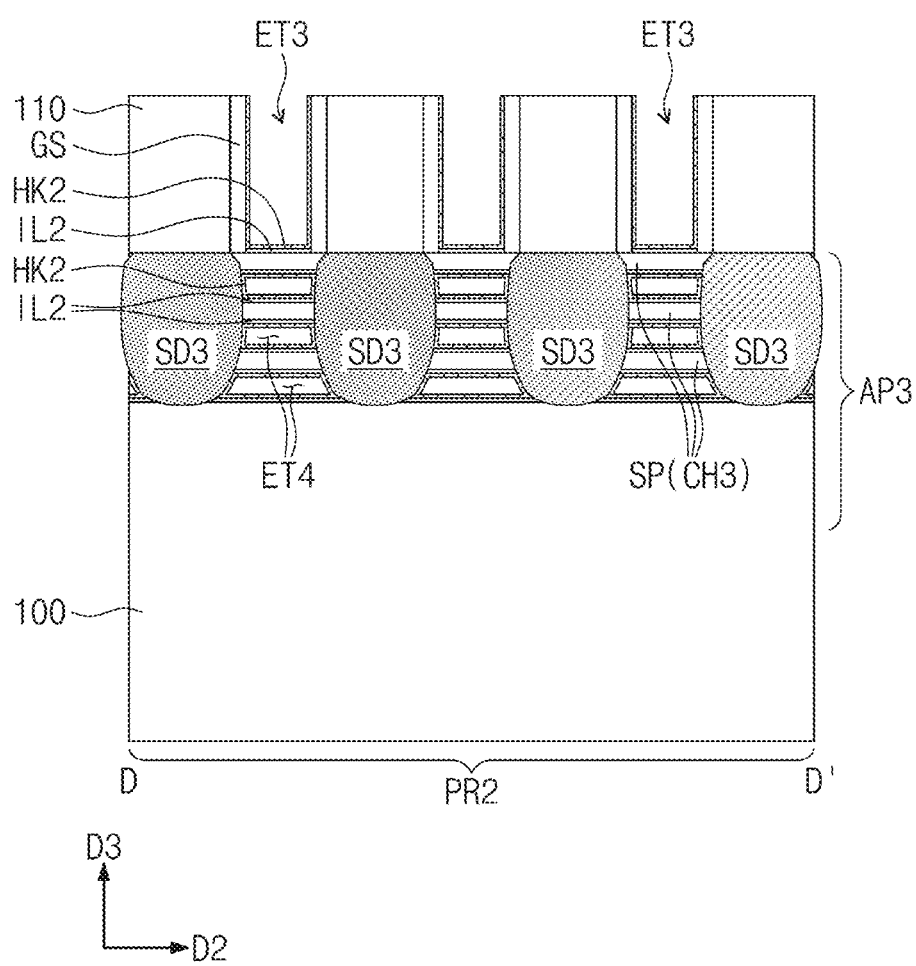
Figure 19E:
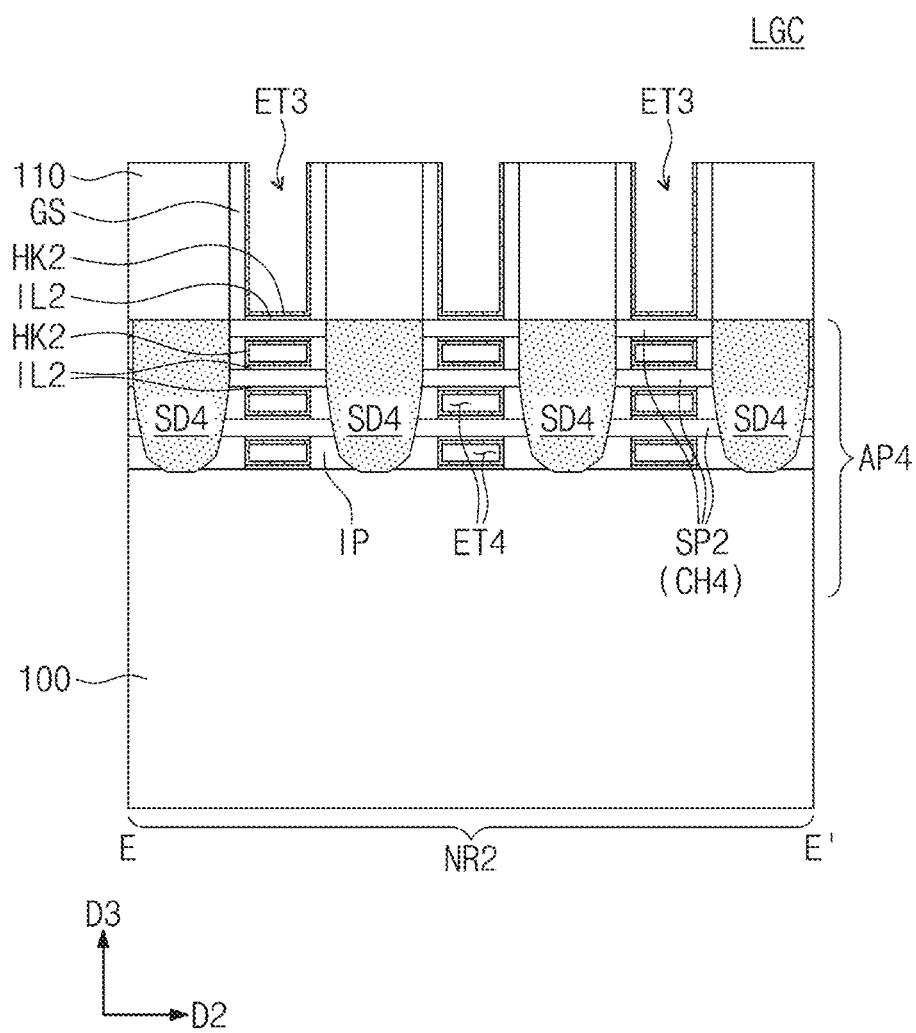
Figure 19F:
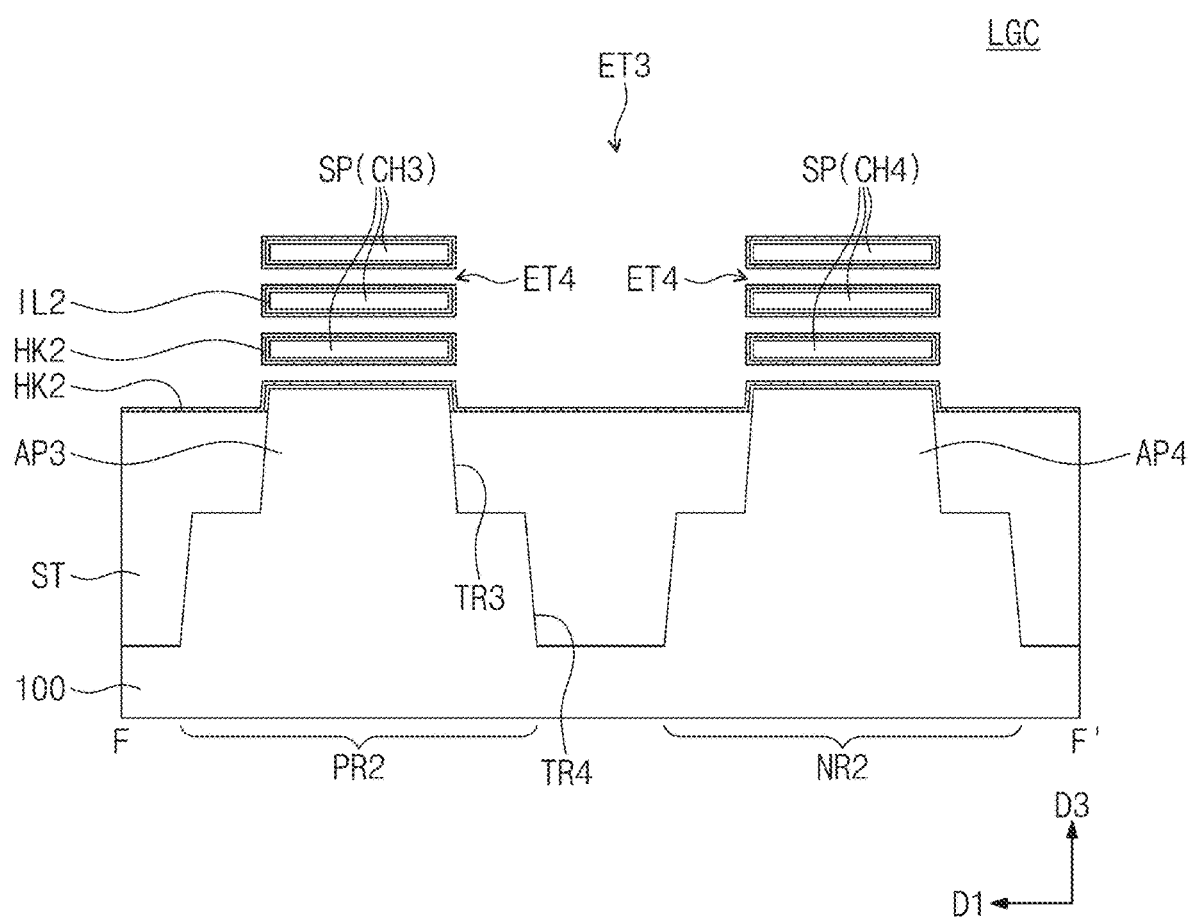
Figure 20:
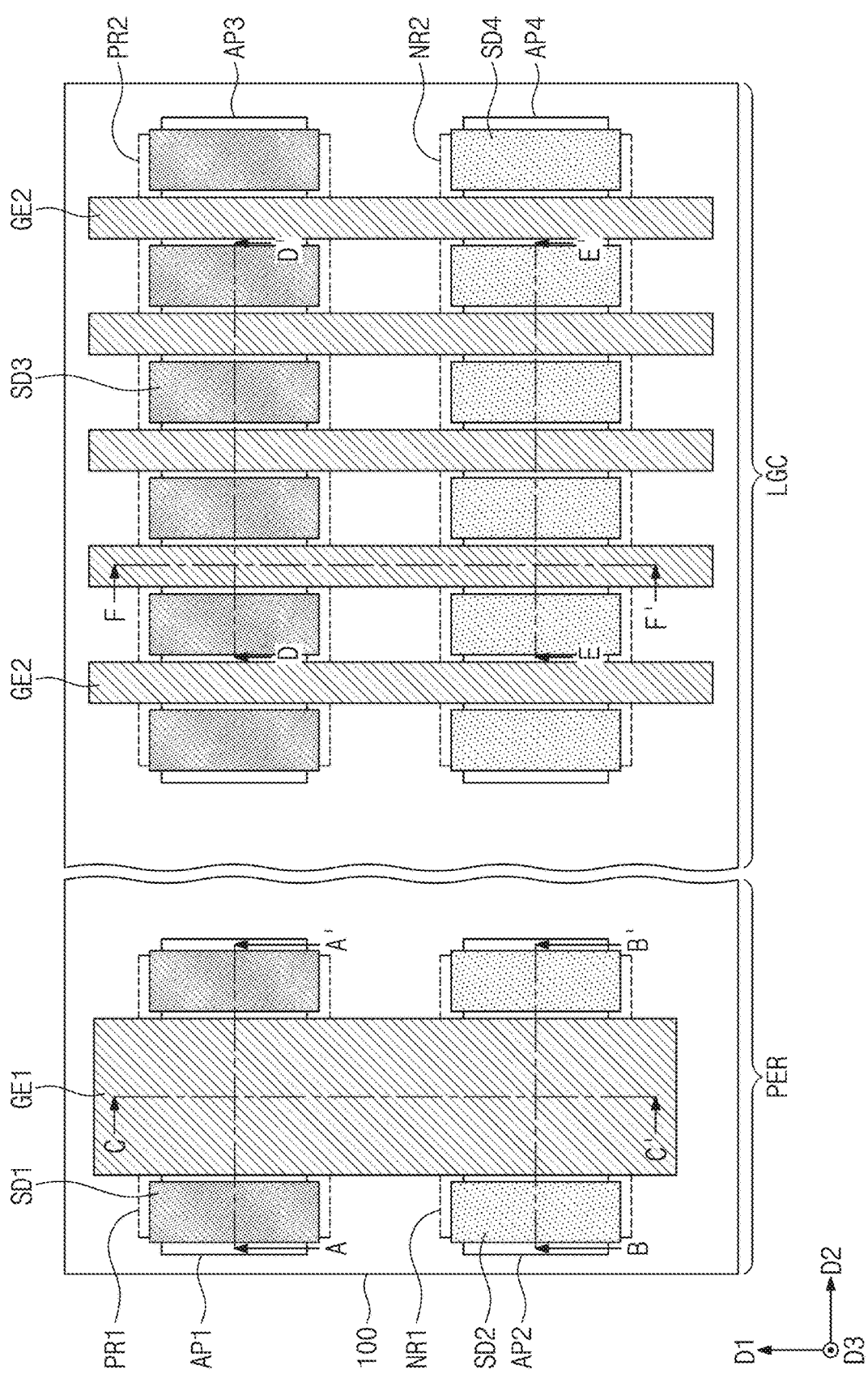
Figure 21A:
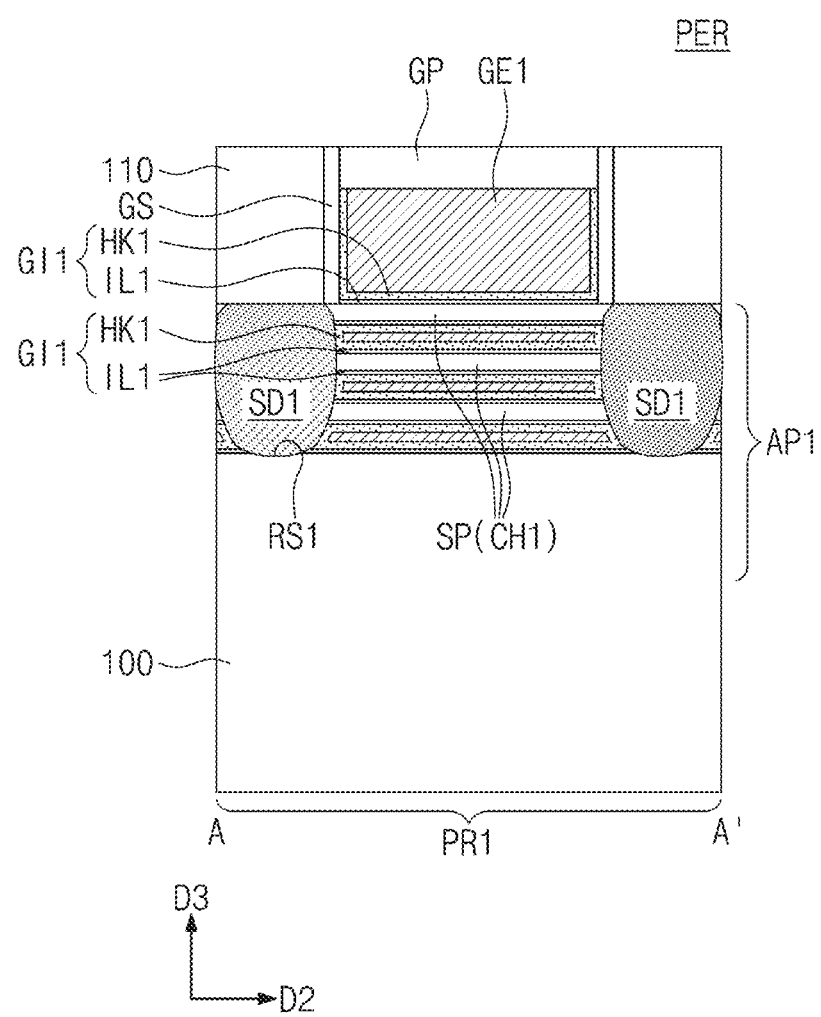
Figure 21B:
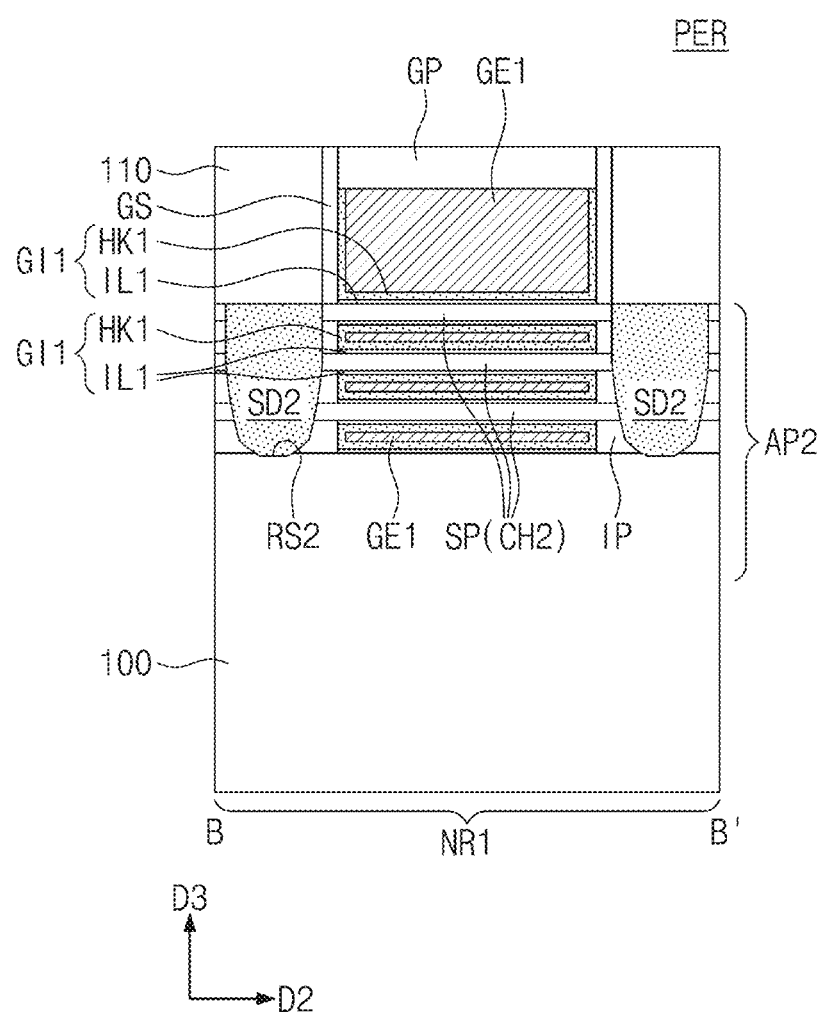
Figure 21C:
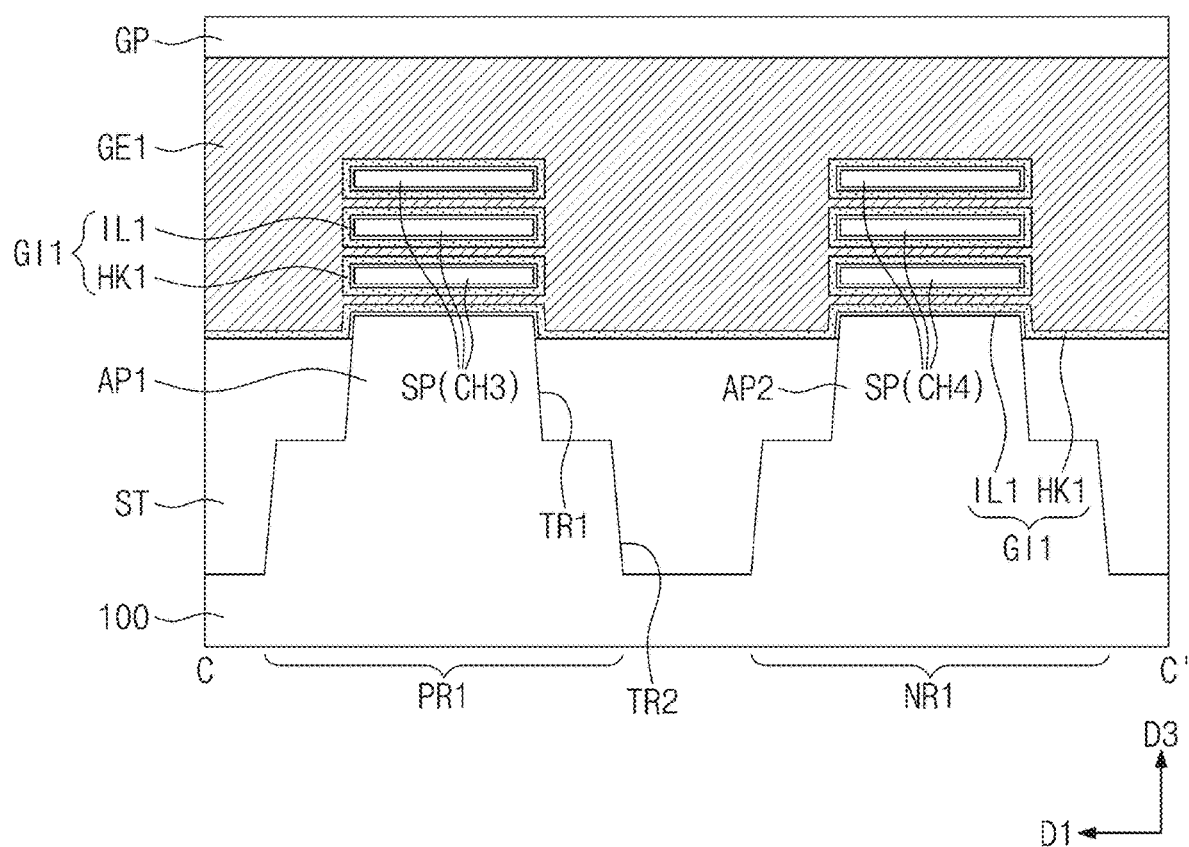
Figure 21D:
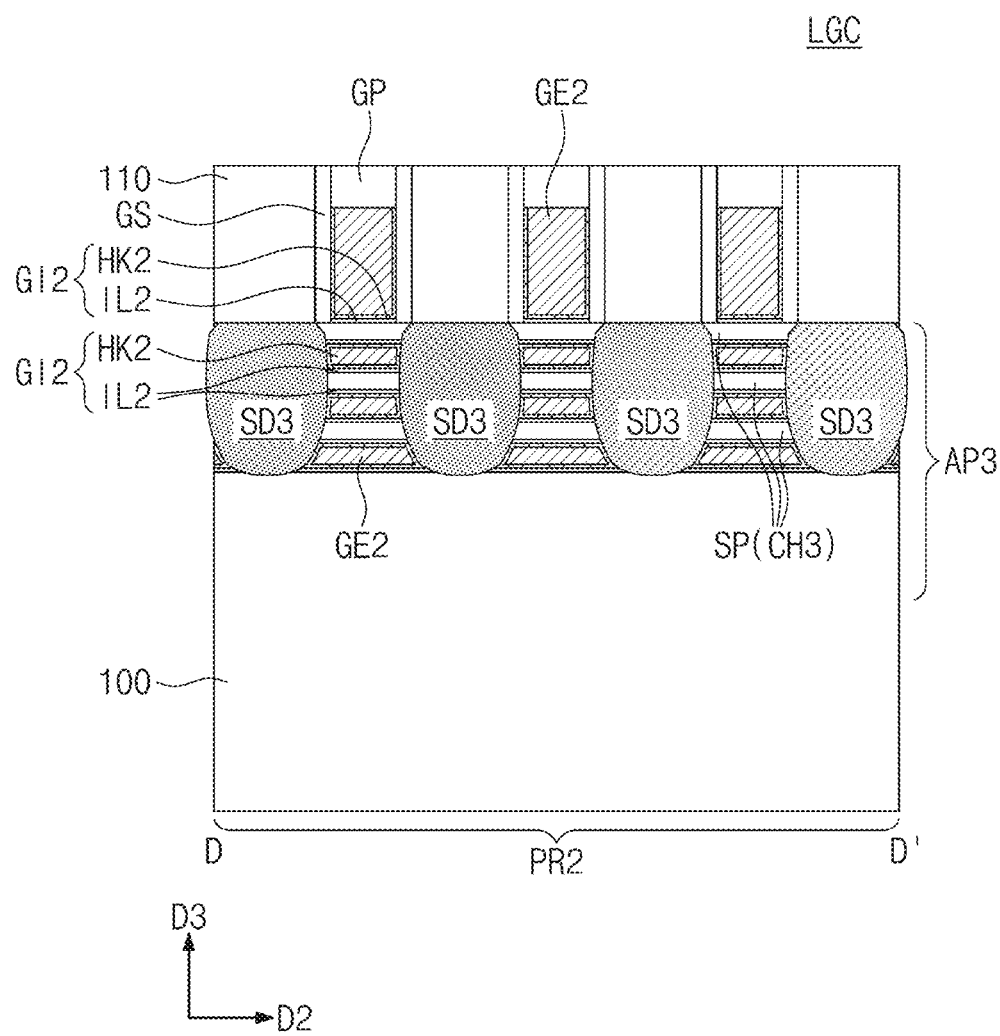
Figure 21E:
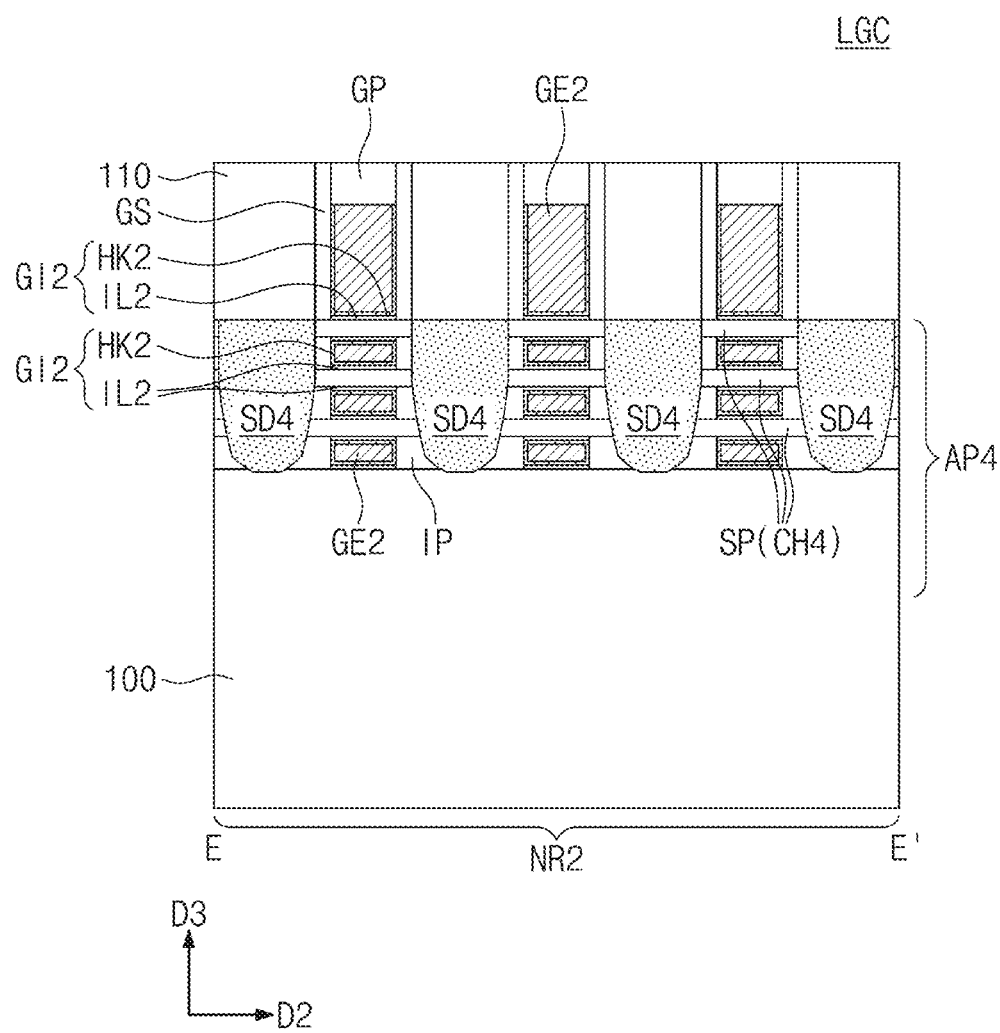
Figure 21F:
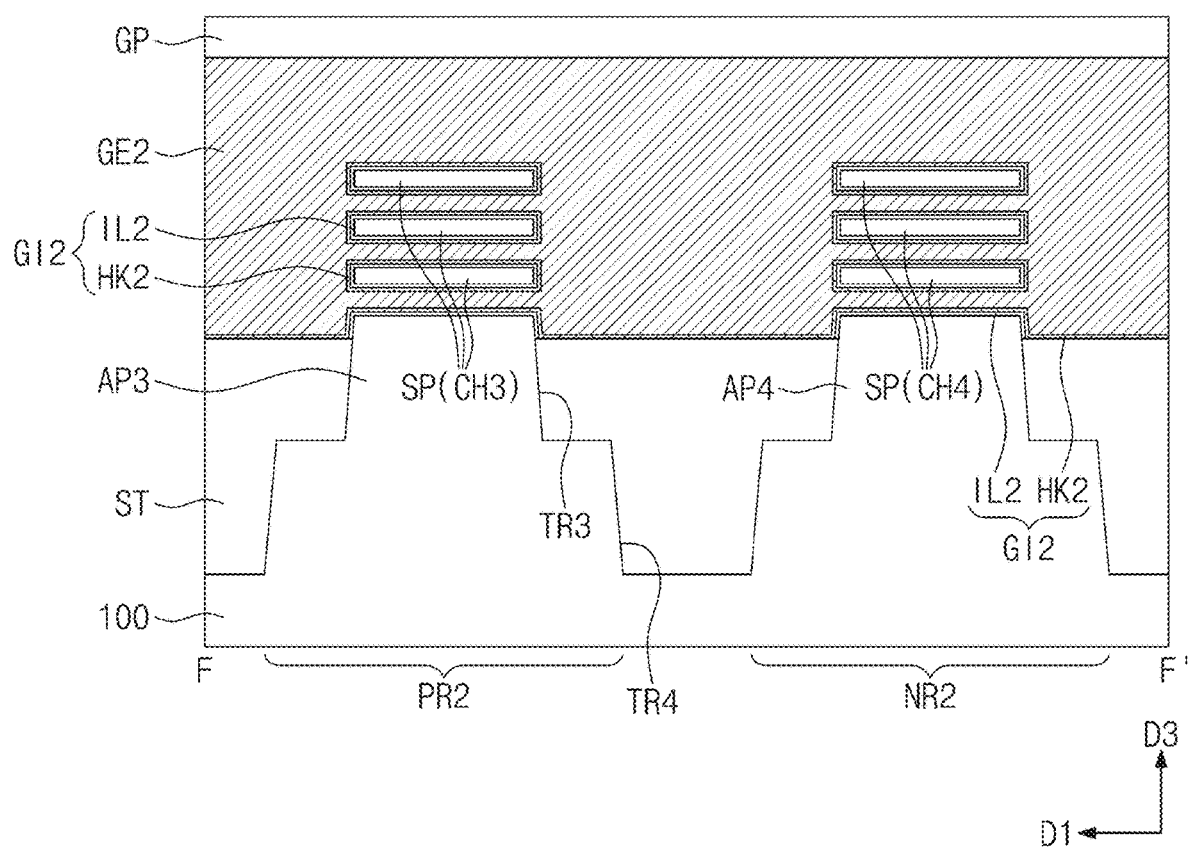

FIG. 5 illustrates cross-sectional views of sections AAA and BBB of FIG. 3, showing a semiconductor device according to some example embodiments of inventive concepts. In example embodiments that follow, a detailed description of technical features repetitive to those discussed above with reference to FIG. 4 will be omitted, and a difference thereof will be discussed in detail.

Referring to FIG. 5, the first gate dielectric layer GI1 on the peripheral region PER may further include a third interface dielectric layer EB between the first interface dielectric layer IL1 and the first channel pattern CHL The third interface dielectric layer EB may be positioned between the first interface dielectric layer IL1 and the top surface of the first semiconductor pattern SP1 and between the first interface dielectric layer IL1 and the bottom surface of the second semiconductor pattern SP2. The third interface dielectric layer EB may include a silicon oxide layer and/or a silicon oxynitride layer. The third interface dielectric layer EB may be disposed, e.g. directly disposed on a surface of the first channel pattern CHL The third interface dielectric layer EB may be formed on a semiconductor pattern on the peripheral region PER before the first and second interface dielectric layers IL1 and IL2 are formed. According to some example embodiments, the third interface dielectric layer EB may include, e.g. may consist of, the same material as that of the first interface dielectric layer ILL For example, an indistinct boundary may be provided between the third interface dielectric layer EB and the first interface dielectric layer ILL Alternatively, the third interface dielectric layer EB may include at least one different material from that of the first interface dielectric layer IL1.

FIGS. 6, 8, 10, 12, 14, 16, 18, and 20 illustrate plan views showing a method of fabricating a semiconductor device according to some example embodiments of inventive concepts. FIGS. 7A, 9A, 11A, 13A, 15A, 17A, 19A, and 21A illustrate cross-sectional views taken along line A-A' of FIGS. 6, 8, 10, 12, 14, 16, 18, and 20, respectively. FIGS. 7B, 9B, 11B, 13B, 15B, 17B, 19B, and 21B illustrate cross-sectional views taken along line B-B' of FIGS. 6, 8, 10, 12, 14, 16, 18, and 20, respectively. FIGS. 7C, 9C, 11C, 13C, 15C, 17C, 19C, and 21C illustrate cross-sectional views taken along line C-C' of FIGS. 6, 8, 10, 12, 14, 16, 18, and 20, respectively. FIGS. 7D, 9D, 11D, 13D, 15D, 17D, 19D, and 21D illustrate cross-sectional views taken along line D-D' of FIGS. 6, 8, 10, 12, 14, 16, 18, and 20, respectively. FIGS. 11E, 13E, 15E, 17E, 19E, and 21E illustrate cross-sectional views taken along line E-E' of FIGS. 10, 12, 14, 16, 18, and 20, respectively. FIGS. 11F, 13F, 15F, 17F, 19F, and 21F illustrate cross-sectional views taken along line F-F' of FIGS. 10, 12, 14, 16, 18, and 20, respectively.

Referring to FIGS. 6 and 7A to 7D, a substrate 100 may be provided which includes a peripheral region PER and a logic cell region LGC. Semiconductor layers and sacrificial layers may be alternately stacked on the substrate 100. The semiconductor layers may include one of silicon (Si), germanium (Ge), and silicon-germanium (SiGe), and the sacrificial layers may include another of silicon (Si), germanium (Ge), and silicon-germanium (SiGe). For example, the semiconductor layers may include silicon (Si), and the sacrificial layers may include silicon-germanium (SiGe). The semiconductor layers and the sacrificial layers may be formed with a chemical vapor deposition (CVD) process and/or with an atomic layer deposition (ALD) process; however, example embodiments are not limited thereto. The semiconductor layers and the sacrificial layers may be single-crystal, or may be polycrystalline.

The substrate 100 may undergo a first patterning process to form a first trench TR1 that defines first to fourth active patterns AP1 to AP4. The substrate 100 may be patterned with a photolithographic process and may be etched with an etching process such as a reactive ion etching (RIE) process; however, example embodiments are not limited thereto. Furthermore during the first patterning process, the semiconductor layers and the sacrificial layers may be patterned to form semiconductor patterns SP and sacrificial patterns SA, respectively. The semiconductor patterns SP and the sacrificial patterns SA may be alternately stacked on each of the first to fourth active patterns AP1 to AP4.

The substrate 100 may undergo a second patterning process to form a second trench TR2 that defines a first PMOSFET region PR1, a first NMOSFET region NR1, a second PMOSFET region PR2, and a second NMOSFET region NR2. The substrate 100 may be patterned with a photolithographic process and may be etched with an etching process such as a reactive ion etching (RIE) process; however, example embodiments are not limited thereto. The second trench TR2 may be formed to extend from a bottom surface of the first trench TR1 toward a bottom surface of the substrate 100.

The first PMOSFET region PR1 and the first NMOSFET region NR1 may be disposed on the peripheral region PER. A first active pattern AP1 and a second active pattern AP2 may be respectively formed on the first PMOSFET region PR1 and the first NMOSFET region NR1. The second PMOSFET region PR2 and the second NMOSFET region NR2 may be disposed on the logic cell region LGC. A third active pattern AP3 and a fourth active pattern AP4 may be respectively formed on the second PMOSFET region PR2 and the second NMOSFET region NR2.

A device isolation layer ST may be formed on the substrate 100, filling the first and second trenches TR1 and TR2. The device isolation layer ST may include a dielectric material, such as a silicon oxide layer, and may be formed with an HDP process and/or with a SOG process; however, example embodiments are not limited thereto. The device isolation layer ST may be recessed, e.g. recessed with an etching process such as a blanket wet-etching and/or a blanket dry-etching process, until upper portions of the first to fourth active patterns AP1 to AP4 are exposed. Therefore, the first and second active patterns AP1 and AP2 may have their upper portions that protrude upwardly from a top surface of the device isolation layer ST.

Referring to FIGS. 8 and 9A to 9D, on the peripheral region PER, a first sacrificial gate pattern PP1 may be formed to run across the first and second active patterns AP1 and AP2. On the logic cell region LGC, second sacrificial gate patterns PP2 may be formed to run across the third and fourth active patterns AP3 and AP4. The first sacrificial gate pattern PP1 and the second sacrificial gate patterns PP2 may be formed to have linear or bar shapes that extend in a first direction D1. The first sacrificial gate pattern PP1 may be formed to have a width greater than that of the second sacrificial gate pattern PP2.

The formation of the first and second sacrificial gate patterns PP1 and PP2 may include, for example, forming a sacrificial layer on an entire surface of the substrate 100, forming hardmask patterns MP on, e.g. to block etching of, the sacrificial layer, and using the hardmask patterns MP as an etching mask to pattern the sacrificial layer. The sacrificial layer may include doped or undoped polysilicon.

A pair of gate spacers GS may be formed on opposite sidewalls of each of the first and second sacrificial gate patterns PP1 and PP2. The formation of the gate spacers GS may include conformally forming a gate spacer layer on the entire surface of the substrate 100, e.g. with a CVD process, and anisotropically etching the gate spacer layer, e.g. with a dry etching process. The gate spacer layer may include one or more of SiCN, SiCON, and SiN. Alternatively, the gate spacer layer may be a multi-layer including two or more of SiCN, SiCON, and SiN.

Referring to FIGS. 10 and 11A to 11F, first to fourth source/drain patterns SD1 to SD4 may be respectively formed on the first to fourth active patterns AP1 to AP4.

For example, the first source/drain patterns SD1 may be formed on an upper portion of the first active pattern AP1. A pair of first source/drain patterns SD1 may be formed on opposite sides of the first sacrificial gate pattern PP1. For example, the hardmask patterns MP and the gate spacers GS may be used as an etching mask to etch the upper portion of the first active pattern AP1, and thus first recess regions RS1 may be formed. While the upper portion of the first active pattern AP1 is etched, the device isolation layer ST may be recessed between the first active patterns AP1 (see FIG. 11C).

The first source/drain pattern SD1 may be formed by performing a selective epitaxial growth process in which an inner wall of the first recess region RS1 on the first active pattern AP1 is adopted as a seed layer. For example, the selective epitaxial growth process may include a chemical vapor deposition (CVD) process and/or a molecular beam epitaxy (MBE) process. The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

For example, impurities such as boron and/or phosphorus and/or arsenic may be in-situ deposited and incorporated during the selective epitaxial growth process for the formation of the first source/drain patterns SD1. Alternatively or additionally, after the first source/drain patterns SD1 are formed, impurities may be implanted into the first source/drain patterns SD1. The first source/drain patterns SD1 may be doped to have a first conductivity type (e.g., p-type).

Second source/drain patterns SD2 may be formed on an upper portion of the second active pattern AP2. A pair of second source/drain patterns SD2 may be formed on opposite sides of the first sacrificial gate pattern PM.

For example, the hardmask patterns MP and the gate spacers GS may be used as an etching mask to etch the upper portion of the second active pattern AP2, and thus second recess regions RS2 may be formed. The second source/drain pattern SD2 may be formed by performing a selective epitaxial growth process in which an inner wall of the second region RS2 on the second active pattern AP2 is adopted as a seed layer. For example, the second source/drain patterns SD2 may include the same semiconductor element (e.g., Si) as that of the substrate 100. The second source/drain patterns SD2 may be doped to have a second conductivity type (e.g., n-type such as arsenic and/or phosphorus).

The formation of the third source/drain patterns SD3 on an upper portion of the third active pattern AP3 may be substantially the same as the formation of the first source/drain patterns SD1 discussed above. The first source/drain patterns SD1 and the third source/drain patterns SD3 may be formed at the same time. The formation of the fourth source/drain patterns SD4 on an upper portion of the fourth active pattern AP4 may be substantially the same as the formation of the second source/drain patterns SD2 discussed above. The second source/drain patterns SD2 and the fourth source/drain patterns SD4 may be formed at the same time, and may be formed at different times, e.g. before or after, the formation of the first source/drain patterns SD1 and the third source/drain patterns SD3. A shape, e.g. a profile, of the first source/drain patterns SD1 may be different from a shape, e.g. a profile, of the second source/drain patterns SD2; however, example embodiments are not limited thereto.

Referring to FIGS. 12 and 13A to 13F together with FIGS. 10 and 11A to 11F, a first interlayer dielectric layer 110 may be formed to cover the first to fourth source/drain patterns SD1 to SD4, the hardmask patterns MP, and the gate spacers GS. For example, the first interlayer dielectric layer 110 may include a silicon oxide layer.

The first interlayer dielectric layer 110 may be planarized until top surfaces of the first and second sacrificial gate patterns PP1 and PP2 are exposed. An etch-back and/or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the first and second sacrificial gate patterns PP1 and PP2 and those of the gate spacers GS.

The first and second sacrificial gate patterns PP1 and PP2 may be selectively removed, e.g. may be removed with a wet etching process and/or a dry etching process. The removal of the first sacrificial gate pattern PP1 may form a first empty space ET1 that exposes the first and second active patterns AP1 and AP2. The removal of the second sacrificial gate patterns PP2 may form third empty spaces ET3 that expose the third and fourth active patterns AP3 and AP4.

Referring back to FIGS. 12 and 13A to 13F, an etching process may be performed to selectively remove the sacrificial patterns SA. The semiconductor patterns SP may remain without being removed. The removal of the sacrificial patterns SA may form second empty spaces ET2 between the semiconductor patterns SP on the peripheral region PER. In addition, fourth empty spaces ET4 may be formed between the semiconductor patterns SP on the logic cell region LGC. Each of the second and fourth empty spaces ET2 and ET4 may be defined between the semiconductor patterns SP that are vertically adjacent to each other.

Dielectric patterns IP may be formed in the second empty space ET2 on the first NMOSFET region NR1. The dielectric pattern IP may partially fill the second empty space ET2. The dielectric pattern IP may contact the second source/drain pattern SD2. Dielectric patterns IP may be formed in the fourth empty space ET4 on the second NMOSFET region NR2. The dielectric pattern IP may partially fill the fourth empty space ET4. The dielectric pattern IP may contact the fourth source/drain pattern SD4. The dielectric patterns IP may be formed with a CVD process; however, example embodiments are not limited thereto.

Referring to FIGS. 14 and 15A to 15F, a first interface dielectric layer IL1 may be formed on the first and second active patterns AP1 and AP2 on the peripheral region PER. The first interface dielectric layer IL1 may surround the semiconductor patterns SP on the peripheral region PER. The first interface dielectric layer IL1 may cover upper surfaces of the first and second active patterns AP1 and AP2 exposed by the device isolation layer ST, and may not extend onto the top surface of the device isolation layer ST.

A second interface dielectric layer IL2 may be formed on the third and fourth active patterns AP3 and AP4 on the logic cell region LGC. The second interface dielectric layer IL2 may surround the semiconductor patterns SP on the logic cell region LGC. The second interface dielectric layer IL2 may cover upper surfaces of the third and fourth active patterns AP3 and AP4, and may not extend onto the top surface of the device isolation layer ST.

According to some example embodiments, an oxidation process, e.g. a thermal oxidation process, may form the first and second interface dielectric layer IL1 and IL2 on surfaces of the first to fourth active patterns AP1 to AP4 and surfaces of the semiconductor patterns SP. According to some example embodiments, a deposition process, e.g. a CVD process and/or an ALD process, may form the first and second interface dielectric layers IL1 and IL2. The first and second interface dielectric layers IL1 and IL2 may be formed at the same time, and may be formed to have the same thickness. The first and second interface dielectric layer IL1 and IL2 may include a silicon oxide layer or a silicon oxynitride layer.

Referring to FIGS. 16 and 17A to 17F, a mask layer MA may be formed on the logic cell region LGC. The mask layer MA may cover the logic cell region LGC and may expose the peripheral region PER.

For example, the mask layer MA may fill the third empty spaces ET3 and the fourth empty spaces ET4 on the logic cell region LGC. The mask layer MA may cover the top surface of the first interlayer dielectric layer 110 and the top surface of the gate spacer GS. The mask layer MA may include a material having an etch selectivity, e.g. may etch slower, with respect to the semiconductor pattern SP. The mask layer MA may include, for example, silicon-germanium (SiGe).

Referring still to FIGS. 16 and 17A to 17F, a preliminary first high-k dielectric layer pHK1 may be conformally formed on the peripheral region PER. In the first empty space ET1, the preliminary first high-k dielectric layer pHK1 may cover a top surface of the first interface dielectric layer IL1 and lateral surfaces of the gate spacers GS. Moreover, in the second empty space ET2, the preliminary first high-k dielectric layer pHK1 may cover a surface of the first interface dielectric layer IL1 and a portion of a lateral surface of the first source/drain pattern SD1. A first deposition process may be employed to form the preliminary first high-k dielectric layer pHK1. The first deposition process may include, for example, at least one of a chemical vapor deposition process and an atomic layer deposition process. The preliminary first high-k dielectric layer pHK1 may include the first material layer HKa discussed with reference to FIG. 4. As the logic cell region LGC is covered with the mask layer MA, the preliminary first high-k dielectric layer pHK1 may not be formed on the logic cell region LGC.

Referring to FIGS. 18 and 19A to 19F, the mask layer MA may be removed from the logic cell region LGC.

Referring to FIGS. 18 and 19A to 19F together with FIG. 4, a first high-k dielectric layer HK1 may be formed on the peripheral region PER. The formation of the first high-k dielectric layer HK1 may include performing a second deposition process to increase a thickness of the preliminary first high-k dielectric layer pHK1. For example, the first high-k dielectric layer HK1 may further include the second material layer HKb discussed with reference to FIG. 4. The second deposition process may include at least one of a CVD process or an ALD process.

During the second deposition process, a second high-k dielectric layer HK2 may be formed on the logic cell region LGC. In the third empty space ET3, the second high-k dielectric layer HK2 may cover a top surface of the second interface dielectric layer IL2 and lateral surfaces of the gate spacers GS. Moreover, in the fourth empty space ET4, the second high-k dielectric layer HK2 may cover a surface of the second interface dielectric layer IL2 and a portion of a lateral surface of the third source/drain pattern SD3. The second high-k dielectric layer HK2 may be formed simultaneously with the second material layer HKb discussed with reference to FIG. 4. The second high-k dielectric layer HK2 and the second material layer HKb may include, e.g. may consist of, the same material.

Referring to FIGS. 20 and 21A to 21F, a first gate electrode GE1 may be formed in the first and second empty spaces ET1 and ET2 on the peripheral region PER. A second gate electrode GE2 may be formed in the third and fourth empty space ET3 and ET4 on the logic cell region LGC. A gate capping pattern GP may be formed on each of the first and second gate electrodes GE1 and GE2. The first gate electrode GE1 and the second gate electrode GE2 may be formed with a CVD process and/or with a physical vapor deposition (PVD) process, and may be formed at the same time; however, example embodiments are not limited thereto. The gate capping pattern GP may be formed with a CVD process; however, example embodiments are not limited thereto.

Referring back to FIGS. 1 and 2A to 2H, a second interlayer dielectric layer 120 may be formed on the first interlayer dielectric layer 110. The second interlayer dielectric layer 120 may include a silicon oxide layer, and may be deposited with a CVD process. Active contacts AC may be formed to penetrate the second and first interlayer dielectric layers 120 and 110 and to have electrical connections with the first and second source/drain patterns SD1 and SD2. A gate contact GC may be formed to penetrate the second interlayer dielectric layer 120 and the gate capping pattern GP and to have an electrical connection with either the first gate electrode GE1 or the second gate electrode GE2.

A third interlayer dielectric layer 130 may be formed on the active contacts AC and the gate contacts GC. A first metal layer may be formed in the third interlayer dielectric layer 130. The first metal layer may include first wiring lines M1, first vias V1, and second vias V2.

Figure 22A:
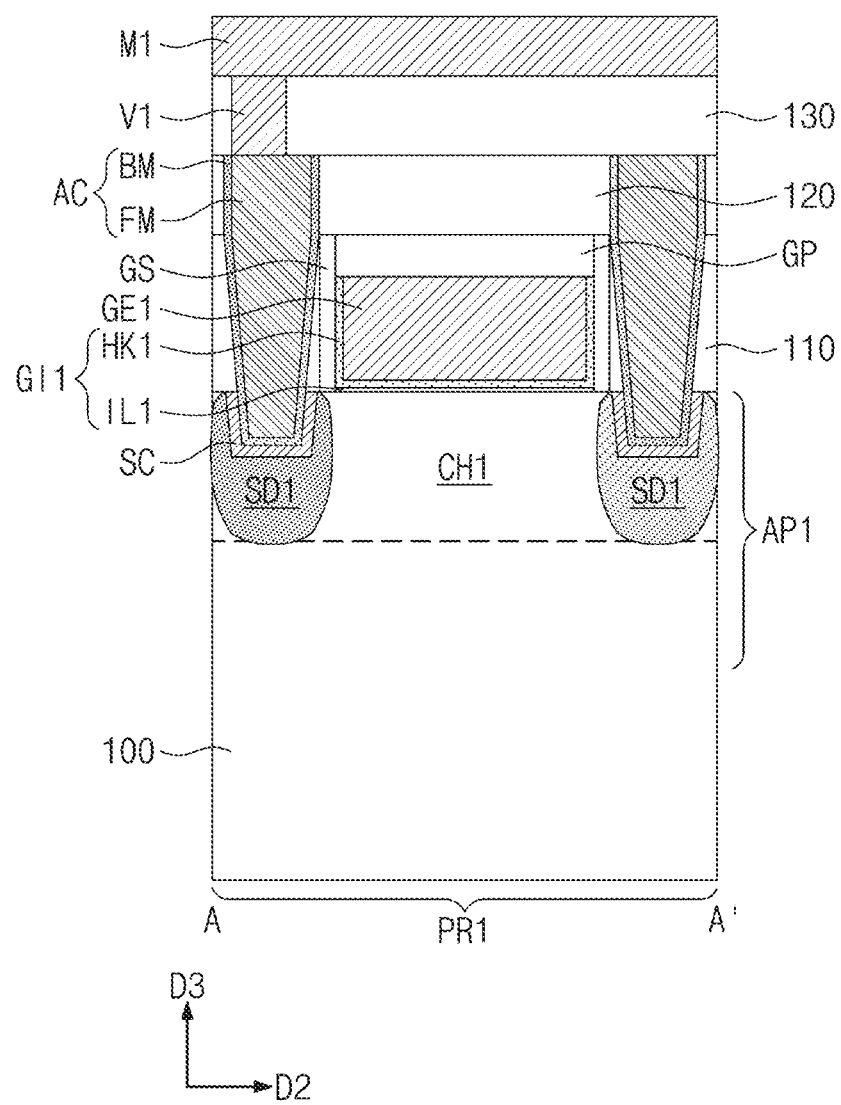
FIGS. 22A, 22B, and 22C illustrate cross-sectional views respectively taken along lines A-A', B-B', and C-C' of FIG. 1, showing a semiconductor device according to some example embodiments of inventive concepts.
Figure 22B:
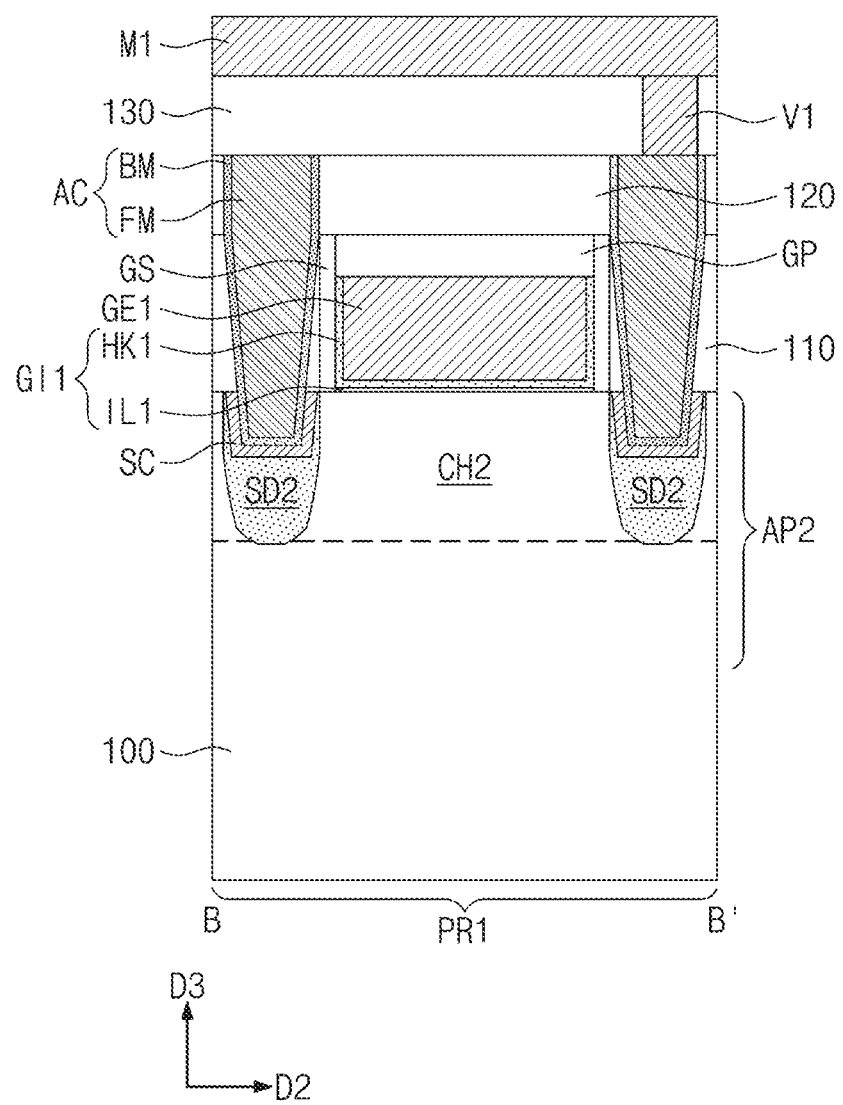
Figure 22C:
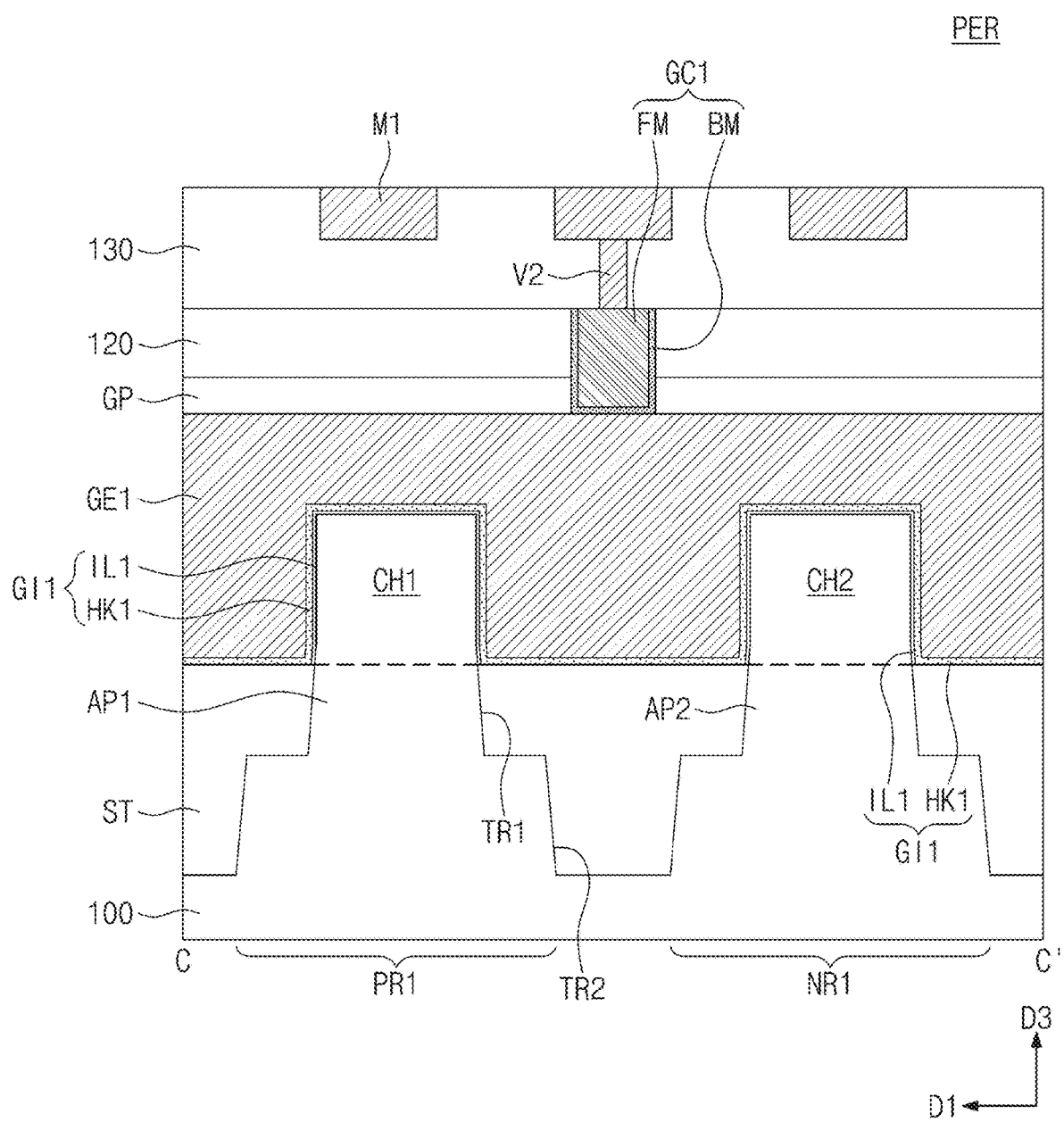

FIGS. 22A, 22B, and 22C illustrate cross-sectional views respectively taken along lines A-A', B-B', and C-C' of FIG. 1, showing a semiconductor device according to some example embodiments of inventive concepts.

In example embodiments that follow, a detailed description of technical features repetitive to those discussed above with reference to FIGS. 1 and 2A to 2H will be omitted, and a difference thereof will be discussed in detail.

Referring to FIGS. 1 and 22A to 22C, unlike the first and second active patterns AP1 and AP2 of FIGS. 1 and 2A to 2C, each of the first and second active patterns AP1 and AP2 may include none of the semiconductor pattern SP and the sacrificial pattern SA that are stacked. For example, each of the first and second active patterns AP1 and AP2 may have a fin shape at its upper portion that protrudes upwardly from the device isolation layer ST. According to some example embodiments, a transistor on the peripheral region PER may be a FinFET.

In some example embodiments, a transistor on the logic cell region LGC may be an MBCFET in which the second gate electrode GE2 three-dimensionally surrounds a channel as discussed with reference to FIGS. 1 and 2A to 2H. In some example embodiments, similar to the transistor on the peripheral region PER discussed with reference to FIGS. 1 and 22A to 22C, a transistor on the logic cell region LGC may be a FinFET.

A semiconductor device according to inventive concepts, a multi-layered high-k dielectric layer may be formed between a channel and a gate electrode on a peripheral region, and thus it may be possible to prevent current leakage of a peripheral transistor through which a relatively high voltage flows, compared to a logic cell transistor. In conclusion, a semiconductor device according to inventive concepts may have increased reliability and excellent electrical characteristics.

Although some example embodiments of inventive concepts have been discussed with reference to accompanying figures, it will be understood that various changes in form and details may be made therein without departing from the spirit and scope of inventive concepts. It therefore will be understood that example embodiments described above are just illustrative but not limitative in all aspects.

What is claimed is:

1. A semiconductor device comprising:
    a substrate including a peripheral region being a high power region and a logic cell region being a low power region;
    a first channel pattern including a first semiconductor pattern and a second semiconductor pattern, the first semiconductor pattern and the second semiconductor pattern stacked vertically on the peripheral region;
    a first gate electrode across the first channel pattern and extending in a first direction;
    a second channel pattern including a third semiconductor pattern and a fourth semiconductor pattern, the third semiconductor pattern and the fourth semiconductor pattern stacked vertically on the logic cell region;
    a second gate electrode across the second channel pattern and extending in the first direction, the second gate electrode having a second width in a second direction less than a first width in the second direction of the first gate electrode, the second direction perpendicular to the first direction;
    a first high-k dielectric layer contacting the first gate electrode, the first high-k dielectric layer including at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate; and
    a second high-k dielectric layer is a single layer contacting the second gate electrode, the second high-k dielectric layer including at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate,
    wherein the first gate electrode has a first gate electrode thickness between the first semiconductor pattern and the second semiconductor pattern,
    the second gate electrode has a second gate electrode thickness between the third semiconductor pattern and the fourth semiconductor pattern, the second gate electrode thickness being greater than the first gate electrode thickness,
    wherein a height of the first gate electrode between a top surface and a bottom surface of the first gate electrode vertically overlapping the second semiconductor pattern is less than the first width of the first gate electrode, and
    wherein a height of the second gate electrode between a top surface and a bottom surface of the second gate electrode vertically overlapping the fourth semiconductor pattern is greater than the second width of the second gate electrode.

2. The semiconductor device of claim 1, further comprising:
    a first interface dielectric layer between the first channel pattern and the first high-k dielectric layer; and
    a second interface dielectric layer between the second channel pattern and the second high-k dielectric layer,
    wherein the first high-k dielectric layer has a first high-k thickness greater than a second high-k thickness of the second high-k dielectric layer.

3. The semiconductor device of claim 1, wherein
    the first semiconductor pattern and the third semiconductor pattern are at a same first vertical level, and
    the second semiconductor pattern and the fourth semiconductor pattern are at a same second vertical level.

4. The semiconductor device of claim 1, wherein the first high-k dielectric layer includes a first material layer and a second material layer on the first material layer, the second material layer including a first element not included in the first material layer.

5. The semiconductor device of claim 1, further comprising:
    a first interface dielectric layer between the first channel pattern and the first high-k dielectric layer; and
    a second interface dielectric layer between the first channel pattern and the first interface dielectric layer.

6. The semiconductor device of claim 1, wherein a first distance between the first gate electrode and a top surface of the first semiconductor pattern is greater than a second distance between the second gate electrode and the third semiconductor pattern.

7. The semiconductor device of claim 1, further comprising:
    a first interface dielectric layer between the first channel pattern and the first high-k dielectric layer,
    wherein the first interface dielectric layer has a first interface dielectric layer thickness less than a first high-k dielectric layer thickness of the first high-k dielectric layer.

8. The semiconductor device of claim 1, further comprising:
    an interlayer dielectric layer on the first gate electrode and on the second gate electrode;
    a first gate contact penetrating the interlayer dielectric layer and connected to the first gate electrode; and
    a second gate contact penetrating the interlayer dielectric layer and connected to the second gate electrode,
    wherein a width of the first gate contact is greater than a width of the second gate contact.

9. The semiconductor device of claim 8, wherein the interlayer dielectric layer includes silicon oxide or silicon oxynitride.

10. The semiconductor device of claim 1, wherein a first interval between a top surface of the first semiconductor pattern and a bottom surface of the second semiconductor pattern is same as a second interval between a top surface of the third semiconductor pattern and a bottom surface of the fourth semiconductor pattern.

11. A semiconductor device, comprising:
    a substrate including a first region being a high power region and a second region being a low power region;
    a first channel pattern on the first region;

a first gate electrode across the first channel pattern and extending in a first direction;
a first high-k dielectric layer between the first gate electrode and the first channel pattern, the first high-k dielectric layer contacting the first gate electrode and including at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate;
a first interface dielectric layer between the first high-k dielectric layer and the first channel pattern;
a second channel pattern on the second region;
a second gate electrode across the second channel pattern and extending in the first direction, the second gate electrode having a second width in a second direction less than a first width in the second direction of the first gate electrode, the second direction being perpendicular to the first direction; and
a second high-k dielectric layer between the second gate electrode and the second channel pattern, the second high-k dielectric layer is a single layer contacting the second gate electrode and the second high-k dielectric layer including at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate, and
wherein the first high-k dielectric layer has a first thickness greater than a second thickness of the second high-k dielectric layer,
wherein a height of the first gate electrode between a top surface and a bottom surface of the first gate electrode vertically overlapping the first channel pattern is less than the first width of the first gate electrode, and
wherein a height of the second gate electrode between a top surface and a bottom surface of the second gate electrode vertically overlapping the second channel pattern is greater than the second width of the second gate electrode,
wherein the first channel pattern includes a first semiconductor pattern and a second semiconductor pattern,
wherein the second channel pattern includes a third semiconductor pattern and a fourth semiconductor pattern, and
wherein a first interval between a top surface of the first semiconductor pattern and a bottom surface of the second semiconductor pattern is the same as a second interval between a top surface of the third semiconductor pattern and a bottom surface of the fourth semiconductor pattern.

12. The semiconductor device of claim 11, wherein a first distance between the first gate electrode and the first channel pattern is greater than a second distance between the second gate electrode and the second channel pattern.

13. The semiconductor device of claim 11, wherein the first high-k dielectric layer includes a first material layer and a second material layer on the first material layer, the second material layer including an element not included in the first material layer.

14. The semiconductor device of claim 11, further comprising:

an interlayer dielectric layer on the first gate electrode and on the second gate electrode;
a first gate contact penetrating the interlayer dielectric layer and connected to the first gate electrode; and
a second gate contact penetrating the interlayer dielectric layer and connected to the second gate electrode,
wherein a width of the first gate contact is greater than a width of the second gate contact.

15. A semiconductor device, comprising:
a substrate including a logic cell region being a low power region and a peripheral region being a high power region;
a device isolation layer on the substrate, the device isolation layer defining a first active pattern and a second active pattern, the first active pattern on the peripheral region and the second active pattern on the logic cell region;
a pair of first source/drain patterns on the first active pattern, the pair of first source/drain patterns including a first one of the pair of first source/drain patterns and a second one of the pair of first source/drain patterns;
a first channel pattern connecting the first one of the pair of first source/drain patterns to the second one of the pair of first source/drain patterns, the first channel pattern including a first semiconductor pattern and a second semiconductor pattern on the first semiconductor pattern;
a first gate electrode across the first channel pattern, the first gate electrode being between the first semiconductor pattern and the second semiconductor pattern and on a top surface of the second semiconductor pattern;
a first interface dielectric layer between the first channel pattern and the first gate electrode;
a first high-k dielectric layer between the first interface dielectric layer and the first gate electrode, the first high-k dielectric layer contacting the first gate electrode and including at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate;
a pair of second source/drain patterns on the second active pattern, the pair of second source/drain patterns including a first one of the pair of second source/drain patterns and a second one of the pair of second source/drain patterns;
a second channel pattern between the first one of the pair of second source/drain patterns and the second one of the pair of second source/drain patterns, the second channel pattern including a third semiconductor pattern and a fourth semiconductor pattern on the third semiconductor pattern;
a second gate electrode across the second channel pattern, the second gate electrode being between the third semiconductor pattern and the fourth semiconductor pattern and on a top surface of the fourth semiconductor pattern;
a second interface dielectric layer between the second channel pattern and the second gate electrode; and
a second high-k dielectric layer between the second interface dielectric layer and the second gate electrode, the second high-k dielectric layer is a single layer contacting the second gate electrode and the second high-k dielectric layer including at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate, and wherein the second gate electrode has a second thickness greater than a first thickness of the first gate electrode, wherein a height of the first gate electrode between a top surface and a bottom surface of the first gate electrode vertically overlapping the second semiconductor pattern is less than a first width of the first gate electrode in a first horizontal direction, and wherein a height of the second gate electrode between a top surface and a bottom surface of the second gate electrode vertically overlapping the fourth semiconductor pattern is greater than a second width of the second gate electrode in the first horizontal direction.

16. The semiconductor device of claim 15, wherein the first high-k dielectric layer has a third thickness greater than a fourth thickness of the second high-k dielectric layer.

17. The semiconductor device of claim 15, wherein an interval between the first gate electrode and the first channel pattern is greater than an interval between the second gate electrode and the second channel pattern.

18. The semiconductor device of claim 15, further comprising:
an interlayer dielectric layer on the first gate electrode and on the second gate electrode;
a first gate contact penetrating the interlayer dielectric layer and connected to the first gate electrode; and
a second gate contact penetrating the interlayer dielectric layer and connected to the second gate electrode,
wherein a width of the first gate contact is greater than a width of the second gate contact.

19. The semiconductor device of claim 15,
wherein a first interval between a top surface of the first semiconductor pattern and a bottom surface of the second semiconductor pattern is same as a second interval between a top surface of the third semiconductor pattern and a bottom surface of the fourth semiconductor pattern.

* * * * *